US012563915B2

(12) United States Patent
Kim et al.

(10) Patent No.: US 12,563,915 B2
(45) Date of Patent: Feb. 24, 2026

(54) DISPLAY DEVICE

(71) Applicant: SAMSUNG DISPLAY CO., LTD.,
Yongin-Si (KR)

(72) Inventors: Sun Ho Kim, Yongin-Si (KR); **Ju
Chan Park, Yongin-Si (KR); Sun Hee
Lee, Yongin-Si (KR); Hee Rim Song**,
Yongin-Si (KR); Seung Hwan Cho,
Yongin-Si (KR); Jong Hyun Choi,
Yongin-Si (KR)

(73) Assignee: Samsung Display Co., Ltd., Yongin-si
(KR)

( * ) Notice: Subject to any disclaimer, the term of this
patent is extended or adjusted under 35
U.S.C. 154(b) by 1072 days.

(21) Appl. No.: 17/422,731

(22) PCT Filed: Jul. 15, 2019

(86) PCT No.: PCT/KR2019/008705
§ 371 (c)(1),
(2) Date: Jul. 13, 2021

(87) PCT Pub. No.: WO2020/149473
PCT Pub. Date: Jul. 23, 2020

(65) Prior Publication Data
US 2022/0123093 A1 Apr. 21, 2022

(30) Foreign Application Priority Data
Jan. 15, 2019 (KR) ......................... 10-2019-0005443

(51) Int. Cl.
*G09G 3/32* (2016.01)
*H10K 59/121* (2023.01)
(Continued)

(52) U.S. Cl.
CPC ......... *H10K 59/131* (2023.02); *H10K 59/121*
(2023.02); *H10K 59/124* (2023.02)

(58) Field of Classification Search
CPC .. H10K 59/131; H10K 59/121; H10K 59/124;
H10K 2102/311; H10K 50/80;
(Continued)

(56) References Cited

U.S. PATENT DOCUMENTS

| | | | |
|---|---|---|---|
| 7,242,398 B2 * | 7/2007 | Nathan | .................. H10K 50/80 |
| | | | 345/206 |
| 9,287,342 B2 | 3/2016 | Kwon et al. | |

(Continued)

FOREIGN PATENT DOCUMENTS

| | | |
|---|---|---|
| CN | 109360830 A | 2/2019 |
| JP | 2017-187580 A | 10/2017 |

(Continued)

OTHER PUBLICATIONS

Notice of Allowance issued in KR Patent Application No. 10-2019-
0005443 on Jan. 15, 2025.

(Continued)

*Primary Examiner* — Lunyi Lao
*Assistant Examiner* — Jarurat Suteerawongsa
(74) *Attorney, Agent, or Firm* — Womble Bond Dickinson
(US) LLP

(57) ABSTRACT

A display device includes a substrate including a display
region and a non-display region; a plurality of pixels dis-
posed in the display region of the substrate, and each
including at least one transistor and a light emitting element
connected to the transistor; first to fourth insulating layers
successively disposed on the substrate; a scan line disposed
on each of the pixels to apply a scan signal to a correspond-
ing pixel, and disposed on the first insulating layer; a first
conductive layer extending in a direction parallel to an
extending direction of the scan line on the third insulating
layer, and disposed in common on the pixels; an opening
configured to expose a part of the substrate by removing a
(Continued)

part of the first to third insulating layers between one pixel of the pixels and a pixel adjacent thereto; and an insulating pattern disposed in the opening.

29 Claims, 22 Drawing Sheets

(51) Int. Cl.
H10K 59/124 (2023.01)
H10K 59/131 (2023.01)

(58) Field of Classification Search
CPC .. H10K 59/12; H01L 27/1248; G09G 3/3208;
G09G 3/32
See application file for complete search history.

(56) References Cited

U.S. PATENT DOCUMENTS

| | | | |
|---|---|---|---|
| 10,396,141 B2 | 8/2019 | Kawata | |
| 10,475,874 B2 | 11/2019 | Rhe et al. | |
| 10,692,953 B2 | 6/2020 | Yoon et al. | |
| 10,868,096 B2 | 12/2020 | Park et al. | |
| 2016/0099300 A1* | 4/2016 | Lee | H10D 86/481 |
| | | | 257/40 |
| 2016/0118451 A1* | 4/2016 | Youn | H10K 59/124 |
| | | | 257/66 |
| 2016/0210896 A1* | 7/2016 | Gil | H10K 59/1216 |
| 2018/0076273 A1 | 3/2018 | Kim et al. | |
| 2019/0041915 A1* | 2/2019 | Park | H10K 59/131 |
| 2019/0148476 A1 | 5/2019 | Park et al. | |
| 2019/0156708 A1* | 5/2019 | Li | G09F 9/33 |

FOREIGN PATENT DOCUMENTS

| | | | |
|---|---|---|---|
| KR | 10-2012-0067728 A | 6/2012 | |
| KR | 10-2015-0074808 A | 7/2015 | |
| KR | 10-2018-0018966 A | 2/2018 | |
| KR | 10-2018-0030363 A | 3/2018 | |
| KR | 10-2018-0059633 A | 6/2018 | |
| KR | 10-2019-0055868 A | 5/2019 | |
| KR | 10-2019-0104091 A | 9/2019 | |

OTHER PUBLICATIONS

International Search Report for corresponding Application No. PCT/KR2019/008705 dated Oct. 24, 2019, 4pp.

* cited by examiner

DISPLAY DEVICE

CROSS-REFERENCE TO RELATED APPLICATIONS

This application is a U.S. National Phase Patent Application of International Patent Application No. PCT/KR2019/008705, filed on Jul. 15, 2019, which claims priority to Korean Patent Application No. 10-2019-0005443, filed on Jan. 15, 2019, the entire content of all of which is incorporated herein by reference.

BACKGROUND

1. Field

Various embodiments of the present disclosure relate to a display device.

2. Description of Related Art

With an increase in interest in an information display and an increase in demand to use portable information media, demand for display devices has markedly increased, and commercialization thereof is in progress.

In particular, recently, demand for a display device capable of folding, bending, and rolling using a flexible substrate is increasing.

SUMMARY

Various embodiments of the present disclosure are directed toward a display device capable of minimizing a signal delay due to line resistance while improving flexible characteristics.

According to an aspect of the present disclosure, a display device may include a substrate including a display region and a non-display region; a plurality of pixels disposed in the display region of the substrate, and each including at least one transistor and a light emitting element connected to the transistor; first to fourth insulating layers successively disposed on the substrate; a scan line disposed on each of the pixels to apply a scan signal to a corresponding pixel, and disposed on the first insulating layer; a first conductive layer extending in a direction parallel to an extending direction of the scan line on the third insulating layer, and disposed in common on the pixels; an opening configured to expose a part of the substrate by removing a part of the first to third insulating layers between one pixel of the pixels and a pixel adjacent thereto; and an insulating pattern disposed in the opening. The first conductive layer may be disposed on the substrate including the insulating pattern, and connect a scan line of the one pixel and a scan line of the adjacent pixel adjacent thereto.

The first conductive layer may be electrically connected to the scan line of each of the pixels through a first contact hole passing through the second and third insulating layers.

The first conductive layer may overlap the scan line of each of the pixels in a plan view.

Each of the first to third insulating layers may be an inorganic insulating layer including inorganic material, and the insulating pattern may be an organic insulating layer including organic material.

The insulating pattern may be disposed in the shape of filling the opening.

The display device may further include a data line disposed on the fourth insulating layer, and configured to apply a data signal to each of the pixels.

The fourth insulating layer may include a first interlayer insulating layer and a second interlayer insulating layer which are successively stacked from a surface of the first conductive layer.

The first interlayer insulating layer and the second interlayer insulating layer may include different materials. The first interlayer insulating layer may be an inorganic insulating layer including inorganic material, and the second interlayer insulating layer may be an organic insulating layer including organic material.

The display device may further include at least two or more conductive patterns disposed on the third insulating layer; and at least one contact electrode disposed on the second interlayer insulating layer, and a bridge electrode spaced apart from the contact electrode. Each of the contact electrode and the bridge electrode may overlap one of the conductive patterns with the first and second interlayer insulating layers being interposed therebetween.

The contact electrode and the conductive pattern overlapping the contact electrode may be electrically connected through a second contact hole passing through the first and second interlayer insulating layers.

The bridge electrode and the conductive pattern overlapping the bridge electrode may be electrically connected through a third contact hole passing through the first and second interlayer insulating layers.

The conductive patterns may be disposed on the same layer as the first conductive layer to be spaced apart from the first conductive layer.

The transistor may include an active pattern disposed on the substrate; a gate electrode disposed on the active pattern with the first insulating layer interposed therebetween; and a source electrode and a drain electrode connected, respectively, to both sides of a middle region overlapping the gate electrode in the active pattern. Either the source electrode or the drain electrode may be electrically connected to a corresponding conductive pattern among the conductive patterns through a fourth contact hole passing through the first to third insulating layers.

The display device may further include a passivation layer disposed on the data line, and including a fifth contact hole to expose at least a part of the bridge electrode; and the light emitting element disposed on the passivation layer. The light emitting element may include a first electrode disposed on the passivation layer, and connected to the bridge electrode through the fifth contact hole; a light-emitting layer disposed on the first electrode, and emitting light; and a second electrode disposed on the light-emitting layer.

The display device may further include an emission control line disposed on the first insulating layer, and applying an emission control signal to each of the pixels; and a second conductive layer extending in a direction parallel to an extending direction of the emission control line on the third insulating layer, and disposed in common on the pixels.

The second conductive layer may be electrically connected to the emission control line of each of the pixels through a sixth contact hole passing through the second and third insulating layers. The second conductive layer may be disposed on the same layer as the first conductive layer to be spaced apart from the first conductive layer.

The display device may further include a lower electrode disposed on the first insulating layer of each of the pixels; and an upper electrode disposed on the second insulating layer of each of the pixels, and overlapping the lower electrode to form a storage capacitor.

The display device may further include a connection pattern configured to electrically connect an upper electrode of the one pixel and an upper electrode of the pixel adjacent thereto on the third insulating layer. The connection pattern may be disposed on the same layer as the first conductive layer to be spaced apart from the first conductive layer.

The display device may further include an initialization power electrode disposed on each of the pixels, and applying initialization power to a corresponding pixel; and a third conductive layer disposed on the initialization power electrode, and electrically connecting the initialization power electrode of the one pixel and the initialization power electrode of the pixel adjacent thereto.

The third conductive layer may be electrically connected to the initialization power electrode of each of the pixels through a seventh contact hole passing through the third insulating layer.

The third conductive layer may be disposed on the same layer as the first conductive layer to be spaced apart from the first conductive layer.

The initialization power electrode may be disposed on the same layer as the upper electrode to be spaced apart from the upper electrode.

According to an aspect of the present disclosure, a display device may include a substrate including a display region and a non-display region; a plurality of pixels disposed in the display region of the substrate, and each including at least one transistor and a light emitting element connected to the transistor; first to fourth insulating layers successively disposed on the substrate; a scan line disposed on each of the pixels to apply a scan signal to a corresponding pixel, and disposed on the first insulating layer; an emission control line disposed on each of the pixels to apply an emission control signal to a corresponding pixel, and disposed on the first insulating layer; an initialization power electrode disposed on each of the pixels to apply initialization power to a corresponding pixel, and disposed on the second insulating layer; first to third conductive layers extending in a first direction on the third insulating layer, and disposed in common on the pixels; a data line extending in a second direction intersecting or crossing with the first direction on the fourth insulating layer, and applying a data signal to each of the pixels; an opening configured to expose a part of the substrate by removing a part of the first to third insulating layers between one pixel of the pixels and a pixel adjacent thereto; and an insulating pattern disposed in the opening. The first to third conductive layers may be disposed on the third insulating layer including the insulating pattern to be spaced apart from each other, and connect the one pixel and the pixel adjacent thereto.

The first conductive layer may electrically connect a scan line of the one pixel and a scan line of the pixel adjacent thereto, the second conductive layer may electrically connect an emission control line of the one pixel and an emission control line of the pixel adjacent thereto, and the third conductive layer may electrically connect an initialization power electrode of the one pixel and an initialization power electrode of the pixel adjacent thereto.

The data line may include a first sub data line disposed on a first side of each of the pixels, and a second sub data line disposed on a second side of each of the pixels. The first sub data line and the second sub data line may be disposed on different layers.

The display device may further include a power supply line which extends in the second direction and supplies driving power to each of the pixels. The power supply line may be provided between the first sub data line and the second sub data line.

According to an embodiment of the present disclosure, a display device having improved flexible characteristics can be provided by removing an inorganic insulating layer between adjacent pixels and thereby placing an organic insulating pattern in a formed opening.

Furthermore, according to an embodiment of the present disclosure, a display device capable of minimizing a signal delay can be provided by connecting electrically separated adjacent pixels with a conductive layer including a ductile material and thereby reducing line resistance while improving flexible characteristics.

The effects of the present disclosure are not limited by the foregoing, and other various effects are anticipated herein.

BRIEF DESCRIPTION OF THE DRAWINGS

FIG. 2 is a block diagram illustrating an embodiment of pixels and a driver in the display device of FIG. 1.

FIG. 18 is an equivalent circuit diagram illustrating two adjacent pixels among the pixels shown in FIG. 1 in accordance with another embodiment.

DETAILED DESCRIPTION

Figure 1:
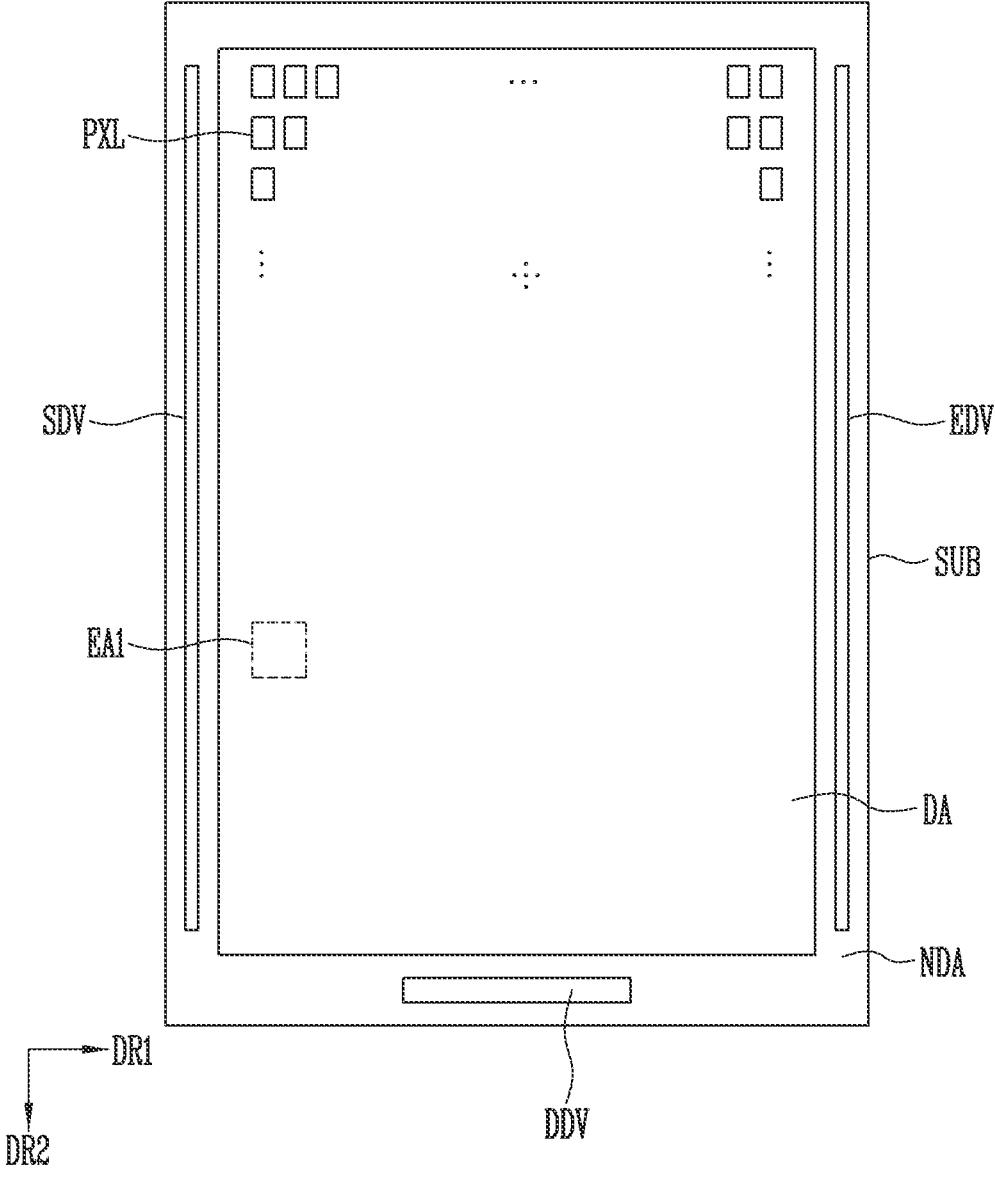
FIG. 1 is a plan view illustrating a display device in accordance with an embodiment of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, an area, or a plate is disposed on a second part, the first part may not only be directly on the second part but a third intervening part may be between them. In addition, when it is expressed that a first part such as a layer, a film, an area, or a plate is formed on a second part, the surface of the second part on which the first part is formed on is not limited to an upper surface of the second part but may include other surfaces such as a side surface or a lower surface of the second part. When a first part such as a layer, a film, an area, or a plate is under a second part, the first part may not only be directly under the second part but also a third intervening part may be between them.

Hereinafter, preferred embodiments of the present disclosure will be described in detail with reference to the accompanying drawings.

FIG. 1 is a plan view illustrating a display device in accordance with an embodiment of the present disclosure.

Referring to FIG. 1, the display device in accordance with the embodiment of the present disclosure may include a substrate SUB, pixels PXL which are provided on the substrate SUB, a driver which is provided on the substrate SUB and configured to drive the pixels PXL, and a line component (not shown) which connects the pixels PXL with the driver.

The substrate SUB may include a display region DA and a non-display region NDA. The display region DA may be a region in which the pixels PXL for displaying an image are provided. Each pixel PXL will be described later herein. The non-display region NDA may be a region in which the driver for driving the pixels PXL and some of lines (not shown) for connecting the pixels PXL to the driver are provided.

The non-display region NDA may be provided on at least one side of the display region DA. In an embodiment of the present disclosure, the non-display region NDA may enclose (i.e., surround) the perimeter of the display region DA.

The pixels PXL may be provided in the display region DA on the substrate SUB, and be connected to the lines. Each pixel PXL refers to a minimum unit for displaying an image, and a plurality of pixels PXL may be provided.

The pixels PXL may include a light emitting element (not shown) that emits white light and/or color light, and a pixel circuit (not shown) that drives the light emitting element. The pixel circuit may include at least one transistor connected to the light emitting element.

Each pixel PXL may emit light having any one color among red, green, and blue, and it is not limited thereto. For example, each of the pixels PXL may emit light having any one color among cyan, magenta, yellow, and white.

The plurality of pixels PXL may be arranged with each other along rows extending in a first direction DR1 and columns extending in a second direction DR2 intersecting or crossing with the first direction DR1. In an embodiment of the present disclosure, the arrangement of the pixels PXL is not limited to a particular arrangement. In other words, the pixels PXL may be arranged with each other in various forms.

The driver may provide a signal to each pixel PXL through the line component and thus control the operation of each pixel PXL. In FIG. 1, the line component is omitted (not shown) for the sake of explanation. The line component will be described later herein.

The drivers may include a scan driver SDV configured to apply scan signals to the pixels PXL through scan lines, an emission driver EDV configured to apply emission control signals to the pixels PXL through emission control lines, a data driver DDV configured to provide data signals to the pixels PXL through data lines, and a timing controller (not illustrated). The timing controller may control the scan driver SDV, the emission driver EDV, and the data driver DDV.

In an embodiment of the present disclosure, the scan driver SDV, the emission driver EDV, and the data driver DDV may be disposed in the non-display region NDA of the substrate SUB. The location of the scan driver SDV, the emission driver EDV, and/or the data driver DDV may be changed as necessary.

Figure 2:
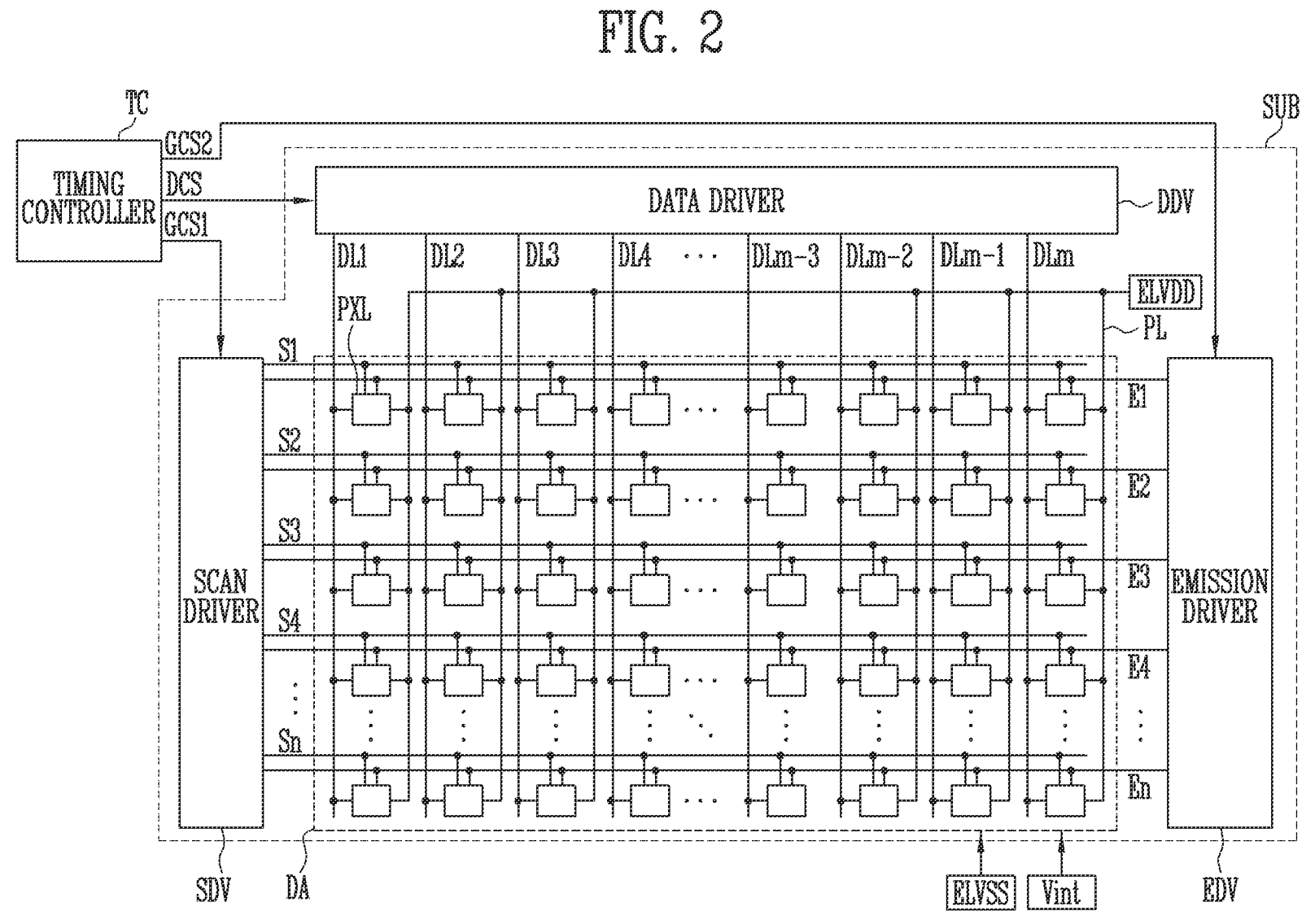

FIG. 2 is a block diagram illustrating an embodiment of the pixels and the driver in the display device of FIG. 1.

Referring to FIGS. 1 and 2, the display device in accordance with an embodiment of the present disclosure may include the pixels PXL, the driver, and the line component.

The driver may include the scan driver SDV, the emission driver EDV, the data driver DDV, and the timing controller TC.

The locations of the scan driver SDV, the emission driver EDV, the data driver DDV, and the timing controller TC shown in FIG. 2 are only for illustrative purposes, and they may be disposed at other locations in an actual display device.

The line component may include a scan line, a data line, an emission control line, a power supply line PL, and an initialization power electrode (not shown), which are disposed in the display region DA to provide a signal to each pixel PXL from the driver.

The pixels PXL may include a light emitting element (not shown) that emits light, and a pixel circuit (not shown) that drives the light emitting element. The pixel circuit may include at least one transistor to drive the light emitting element.

The pixels PXL may be provided in the display region DA. Each pixel PXL may receive a data signal from a corresponding data line when a scan signal is supplied from a corresponding scan line. Each pixel PXL supplied with the data signal may control current flowing from a first driving power ELVDD applied through the power supply line PL to a second driving power ELVSS via a light emitting element (not shown).

The scan driver SDV may apply scan signals to scan lines S1 to Sn in response to a first gate control signal GCS1 from the timing controller TC. For instance, when the scan driver SDV successively supplies the scan signals to the scan lines S1 to Sn, the pixels PXL may be successively selected on the basis of a horizontal line.

The emission driver EDV may apply emission control signals to the emission control lines E1 to En in response to a second gate control signal GCS2 from the timing controller TC. For example, the emission driver EDV may successively supply the emission control signals to the emission control lines E1 to En.

The emission control signal may be set to have a width greater than that of the scan signal. For instance, the emission control signal may be supplied to an i-th (i is a natural number) emission control line Ei such that the section of the emission control signal at least partially overlaps that of the scan signal supplied to an i–1-th scan line Si–1 and the scan signal supplied to an i-th scan line Si.

In addition, the emission control signal may be set to an off voltage (e.g., a high voltage) so that the transistors included in the pixels PXL may be turned off. The scan signal may be set to a gate-on voltage (e.g., a low voltage) so that the transistors included in the pixels PXL may be turned on.

The data driver DDV may supply data signals to data lines DL1 to DLm in response to a data control signal DCS. The data signals supplied to the data lines DL1 to DLm may be supplied to pixels PXL that are selected by a scan signal.

The timing controller TC may supply the first and second gate control signals GCS1 and GCS2 generated based on the timing signals supplied from an external device to the scan driver SDV and the emission driver EDV, respectively, and the timing controller TC may supply the data control signal DCS to the data driver DDV.

Each of the first and second gate control signals GCS1 and GCS2 may include a start pulse and clock signals. The start pulse controls the timing of a first scan signal or a first emission control signal. The clock signals are used to shift the start pulse.

The data control signal DCS includes a source start pulse and clock signals. The source start pulse controls a sampling start time of data, and the clock signals are used to control a sampling operation.

Figure 3:
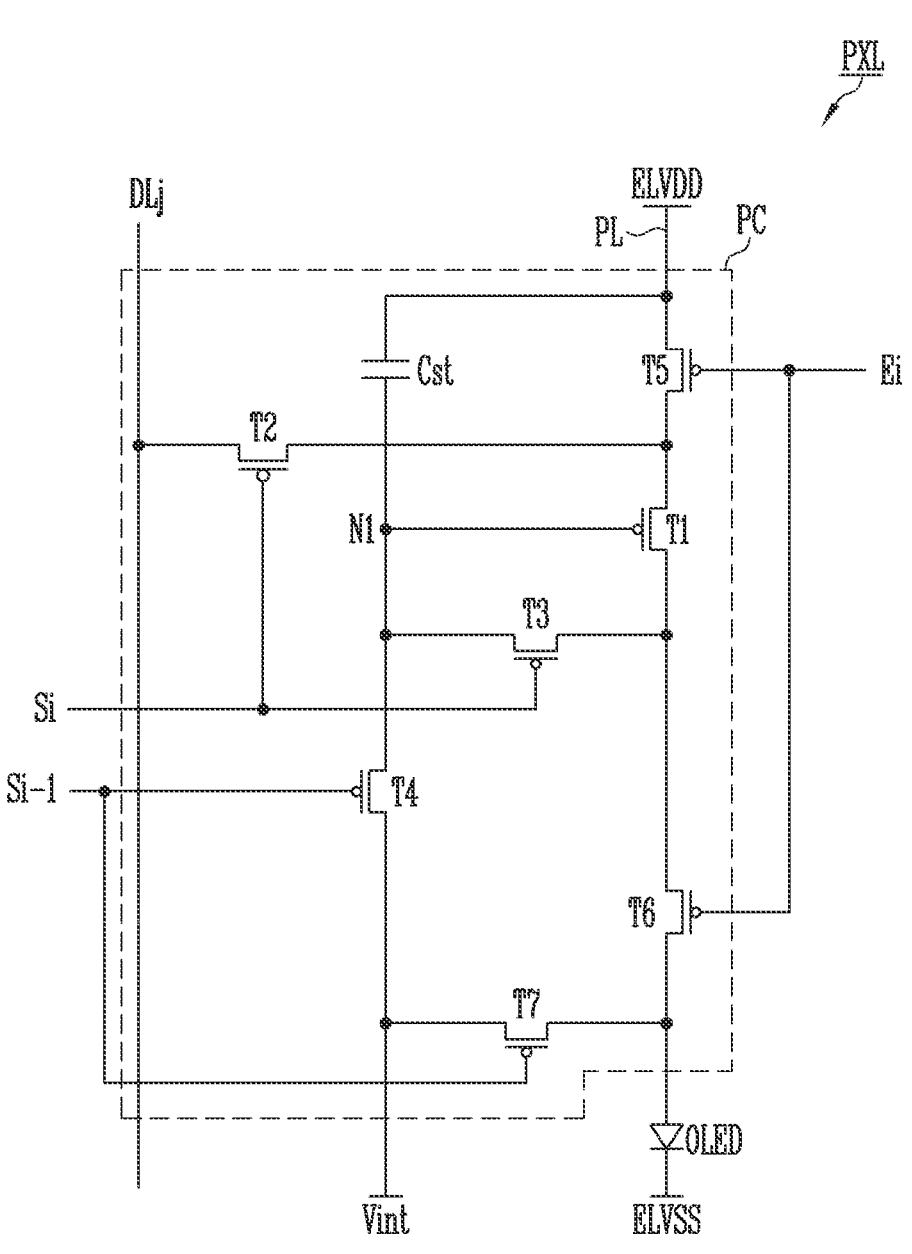
FIG. 3 is an equivalent circuit diagram illustrating one of pixels shown in FIG. 1.

FIG. 3 is an equivalent circuit diagram illustrating one of pixels shown in FIG. 1.

For the convenience of explanation, there is illustrated in FIG. 3 one pixel that is connected to a j-th data line DLj, an i–1-th scan line Si–1, and an i-th scan line Si.

Referring to FIGS. 1 to 3, the pixel PXL in accordance with an embodiment of the present disclosure may include a light emitting element OLED, and a pixel circuit PC connected to the light emitting element OLED to drive the light emitting element OLED. Here, the pixel circuit PC may include first to seventh transistors T1 to T7, and a storage capacitor Cst.

An anode electrode of the light emitting element OLED may be connected to the first transistor T1 via the sixth transistor T6. A cathode electrode of the light emitting element OLED may be connected to the second driving power ELVSS. The light emitting element OLED may emit light having a predetermined luminance corresponding to current supplied from the first transistor T1. The voltage of the first driving power ELVDD to be applied to the power supply line PL may be set to be higher than that of the second driving power ELVSS to allow current to flow to the light emitting element OLED. A difference in potential between the first and second driving power ELVDD and ELVSS may be set to a value equal to or greater than a threshold voltage of the light emitting element OLED during a light emission period of the pixel PXL.

An electrode of the first transistor (T1; driving transistor), e.g. a source electrode, may be connected to the power supply line PL to which the first driving power ELVDD is applied via the fifth transistor T5, and another electrode thereof, e.g. a drain electrode thereof, may be connected to the anode electrode of the light emitting element OLED via the sixth transistor T6. A gate electrode of the first transistor T1 may be connected to a first node N1. The first transistor T1 may control, in response to the voltage of the first node N1, current flowing from the first driving power ELVDD to the second driving power ELVSS via the light emitting element OLED.

The second transistor (T2; switching transistor) is connected between the j-th data line DLj connected to the pixel PXL and the source electrode of the first transistor T1. Furthermore, a gate electrode of the second transistor T2 is connected to the i-th scan line Si connected to the pixel PXL. When a scan signal having a gate-on voltage (e.g., a low-level voltage) is supplied from the i-th scan line Si, the second transistor T2 is turned on to electrically connect the j-th data line DLj to the source electrode of the first transistor T1. Hence, if the second transistor T2 is turned on, a data signal supplied from the j-th data line DLj is transmitted to the first transistor T1.

The third transistor T3 is connected between the drain electrode of the first transistor T1 and the first node N1. A gate electrode of the third transistor T3 is connected to the i-th scan line Si. When a scan signal having a gate-on voltage is supplied to the i-th scan line Si, the third transistor T3 is turned on to electrically connect the drain electrode of the first transistor T1 to the first node N1. Therefore, when the third transistor T3 is turned on, the first transistor T1 is connected in the form of a diode.

The fourth transistor T4 is connected between the first node N1 and the line to which the initialization power Vint is applied. A gate electrode of the fourth transistor T4 is connected to a preceding scan line, e.g., an i–1-th scan line Si–1. When a scan signal of a gate-on voltage is supplied to the i–1-th scan line Si–1, the fourth transistor T4 is turned on so that the initialization power Vint is transmitted to the first node N1. Here, the initialization power Vint may have a voltage equal to or less than a minimum voltage of the data signal.

The fifth transistor T5 is connected between the first driving power ELVDD and the first transistor T1. A gate electrode of the fifth transistor T5 is connected to a corresponding emission control line, e.g., an i-th emission control line Ei. The fifth transistor T5 is turned off when an emission control signal having a gate-off voltage is supplied to the i-th emission control line Ei, and is turned on in other cases (i.e., when the gate-off voltage is not supplied to the i-th emission control line Ei).

The sixth transistor T6 is connected between the first transistor T1 and an anode electrode of the light emitting element OLED. A gate electrode of the sixth transistor T6 is connected to the i-th emission control line Ei. The sixth transistor T6 is turned off when an emission control signal having a gate-off voltage is supplied to the i-th emission control line Ei, and is turned on in other cases.

The seventh transistor T7 is connected between the anode electrode of the light emitting element OLED and the line to which the initialization power Vint is applied. A gate electrode of the seventh transistor T7 is connected to any one of scan lines of a preceding stage, e.g., to the i–1-th scan line Si–1. When a scan signal of a gate-on voltage is supplied to the i–1-th scan line Si–1, the seventh transistor T7 is turned on so that the initialization power Vint is supplied to the anode electrode of the light emitting element OLED.

The storage capacitor Cst is connected between the first driving power ELVDD and the first node N1. The storage capacitor Cst stores the data signal supplied to the first node N1 during each frame period and a voltage corresponding to the threshold voltage of the first transistor T1.

Figure 4:
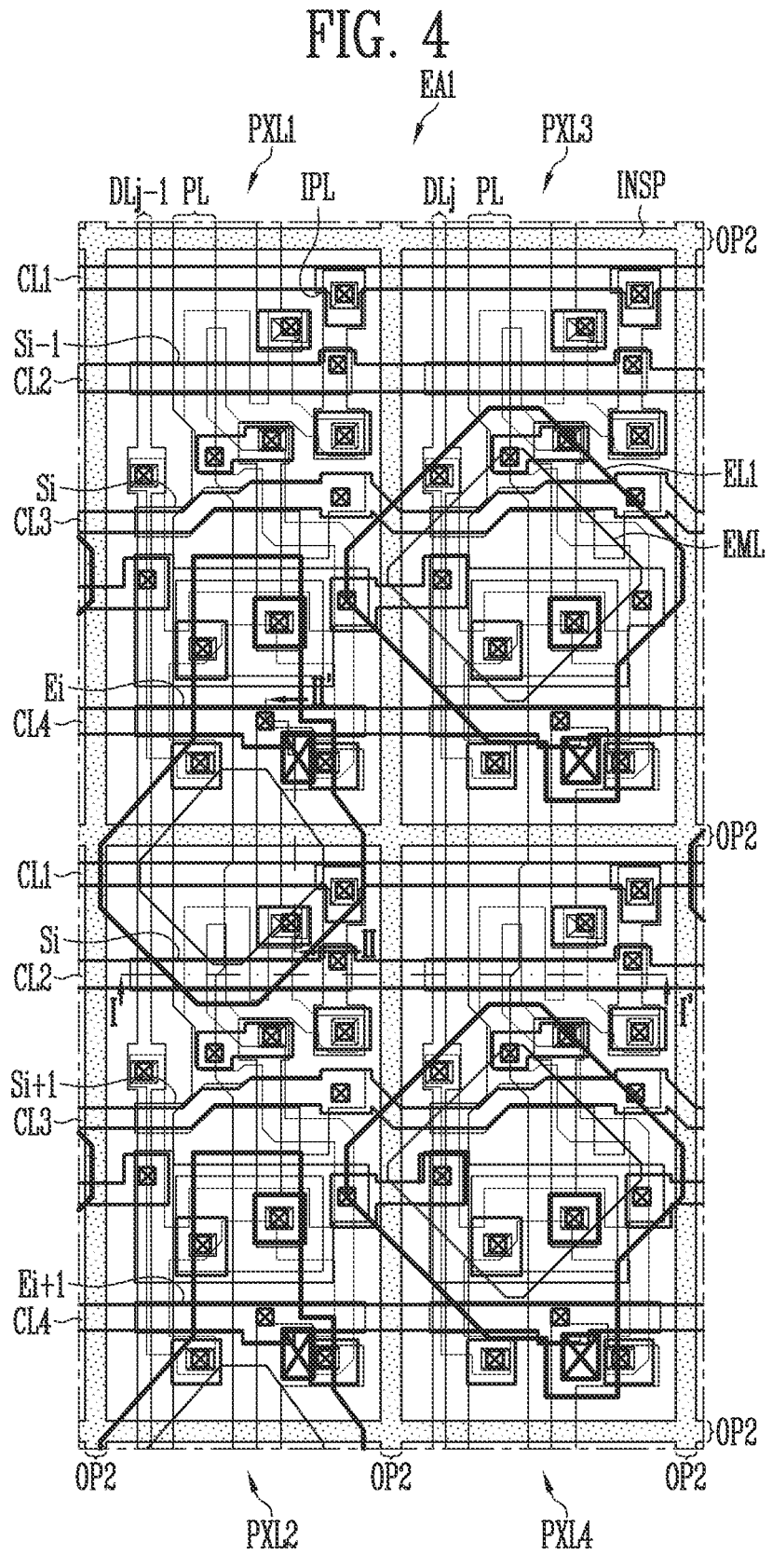
FIG. 4 is an enlarged plan view of region EA1 of FIG. 1.
Figure 5:
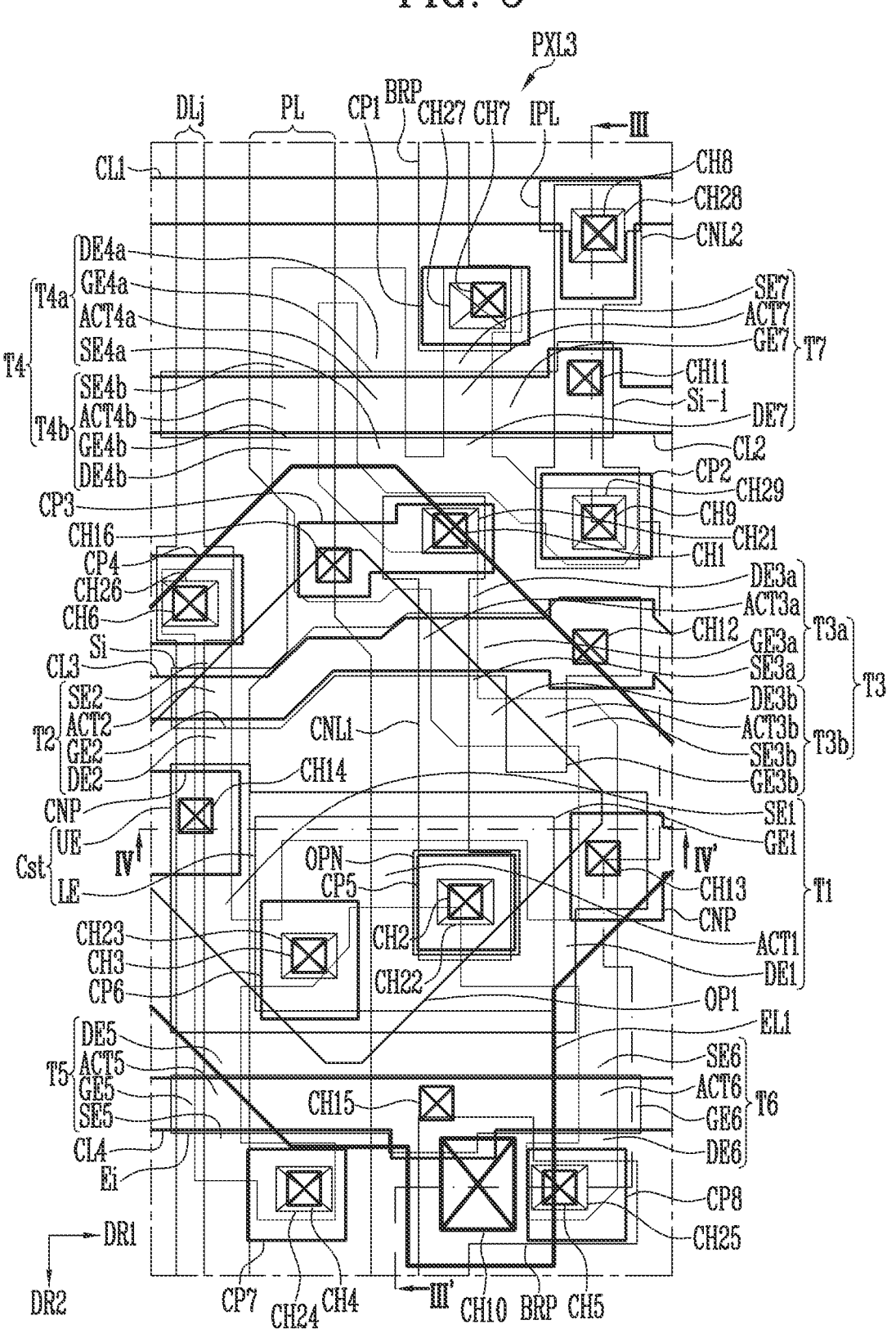
FIG. 5 is a plan view illustrating in detail a third pixel of FIG. 4.
Figure 6A:
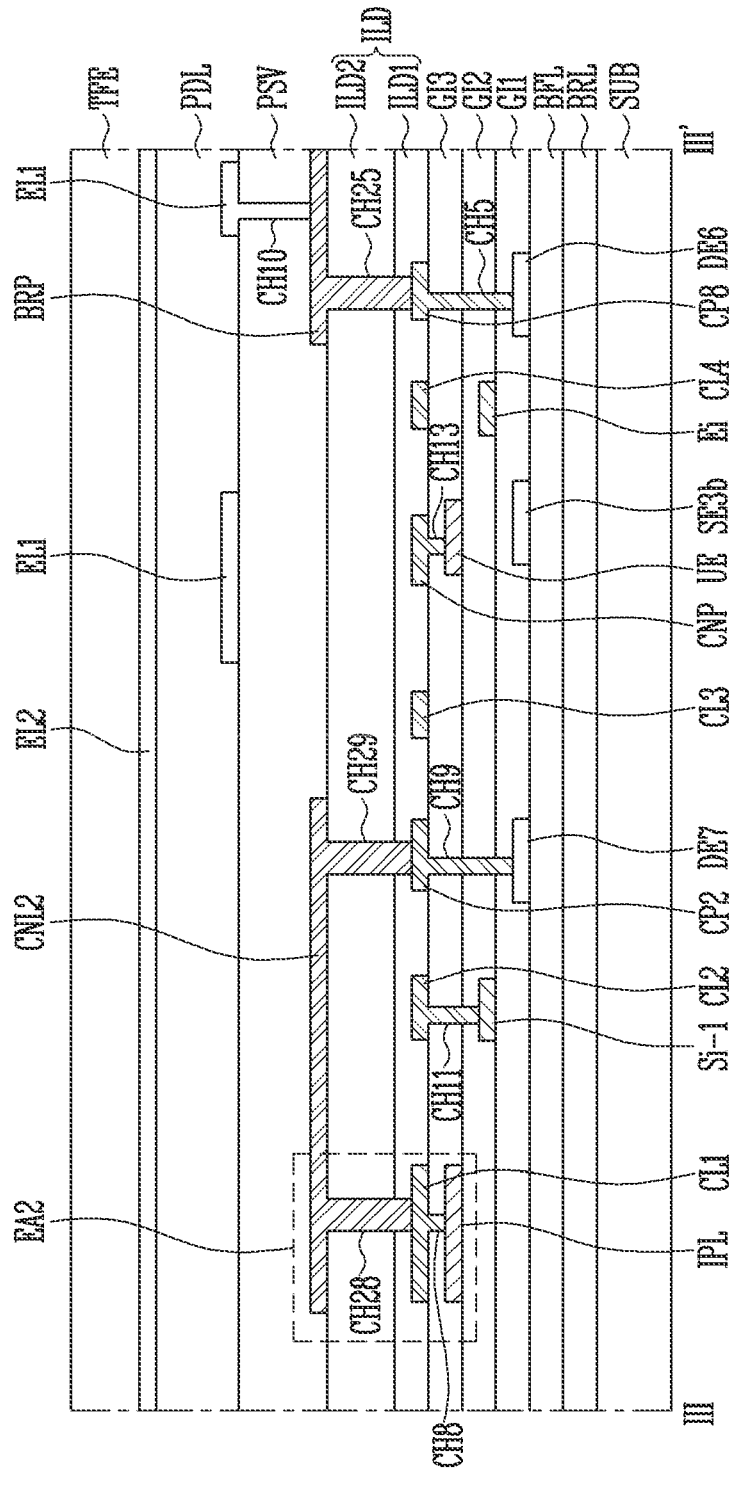
FIG. 6A is a sectional view taken along line III-III' of FIG. 5.
Figure 6B:
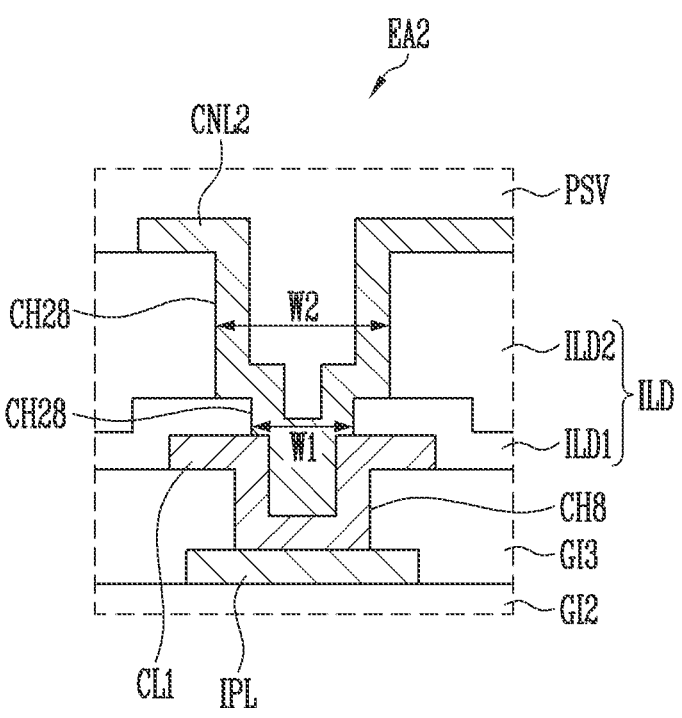
FIG. 6B is an enlarged sectional view of region EA2 of FIG. 6A.
Figure 7:
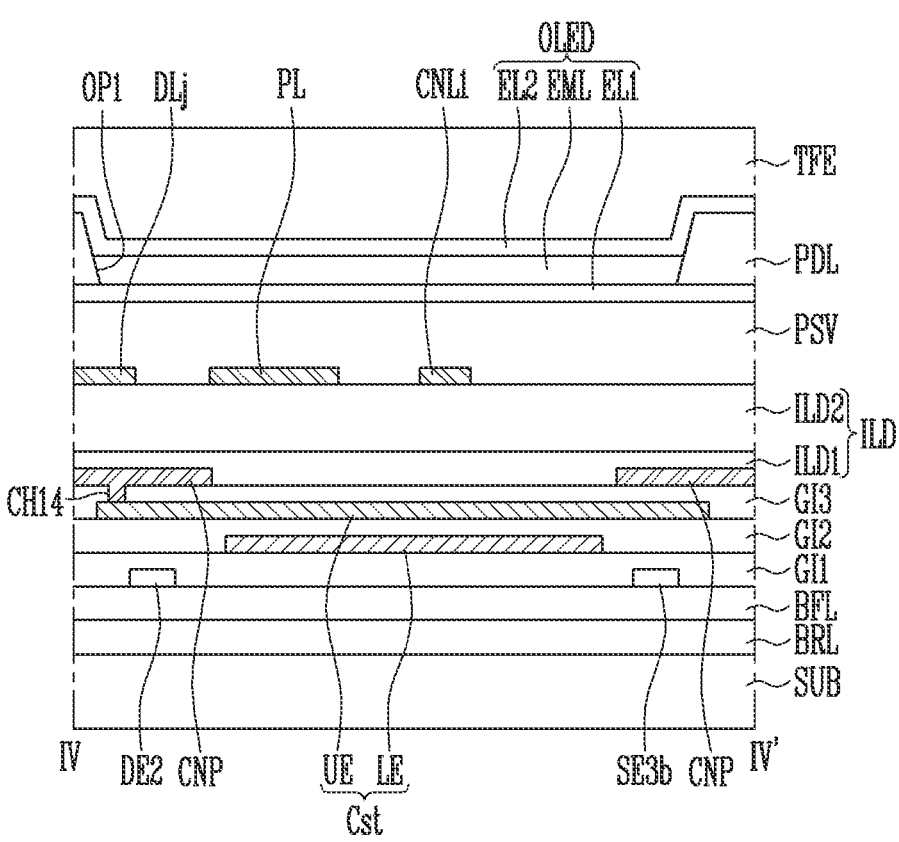
FIG. 7 is a sectional view taken along line IV-IV' of FIG. 5.
Figure 8:
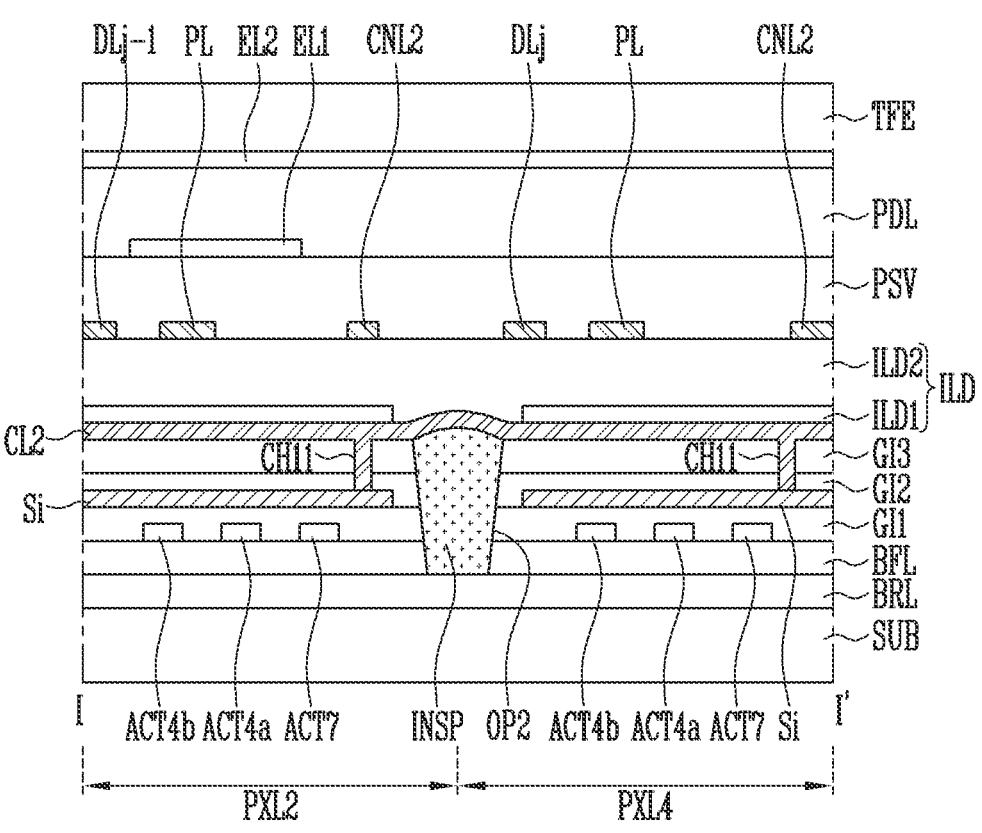
FIG. 8 is a sectional view taken along line I-I' of FIG. 4.
Figure 9:
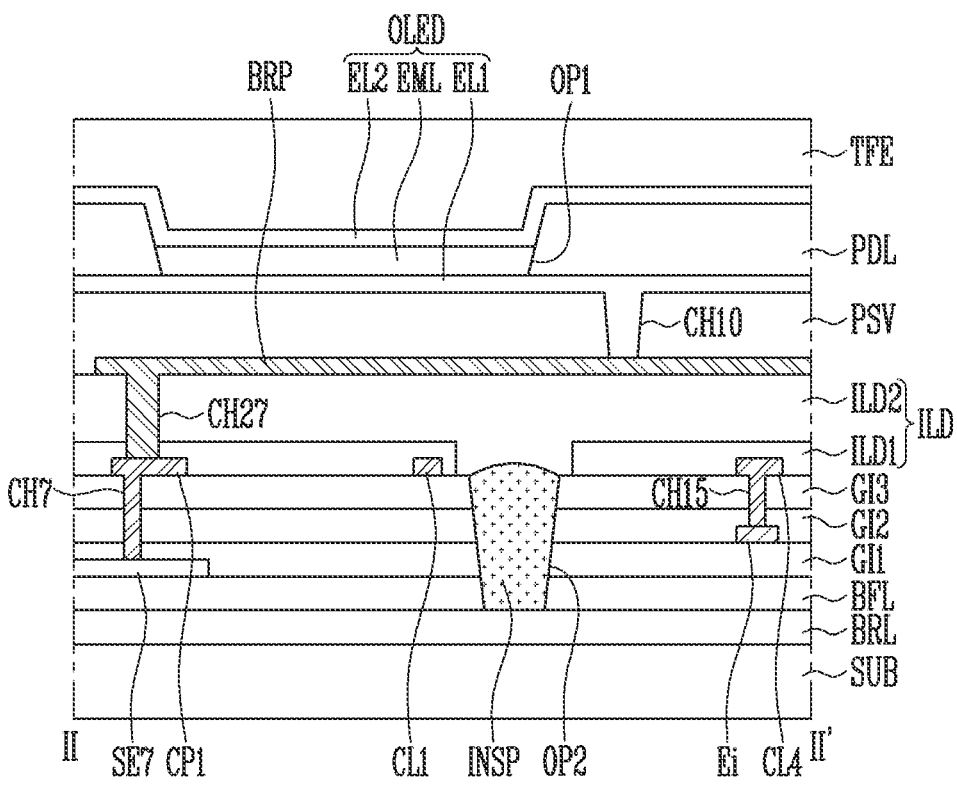
FIG. 9 is a sectional view taken along line II-II' of FIG. 4.
Figure 10:
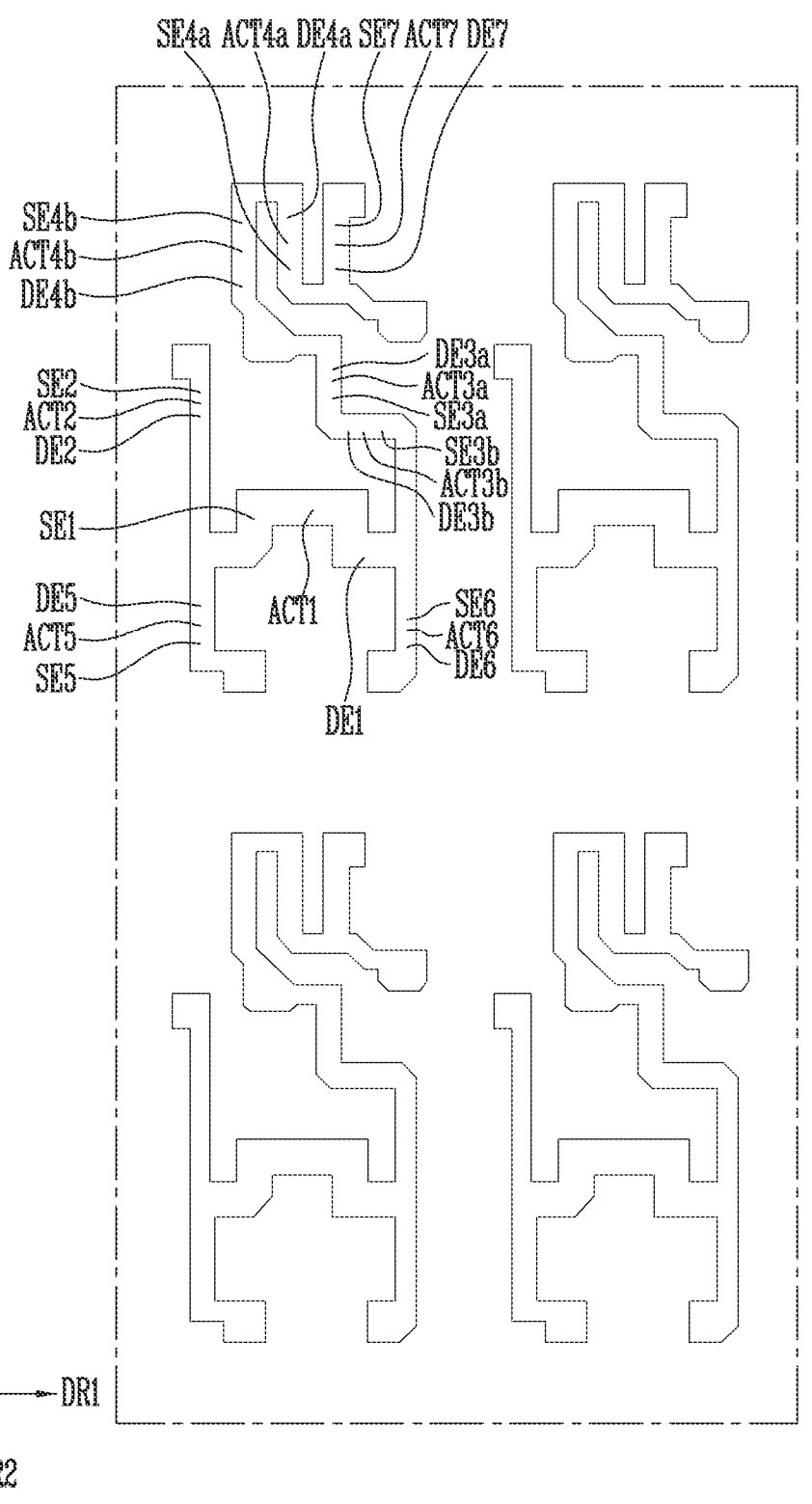
FIGS. 10 to 17 are plan views schematically illustrating elements of first to fourth pixels shown in FIG. 4 for each layer.
Figure 11:
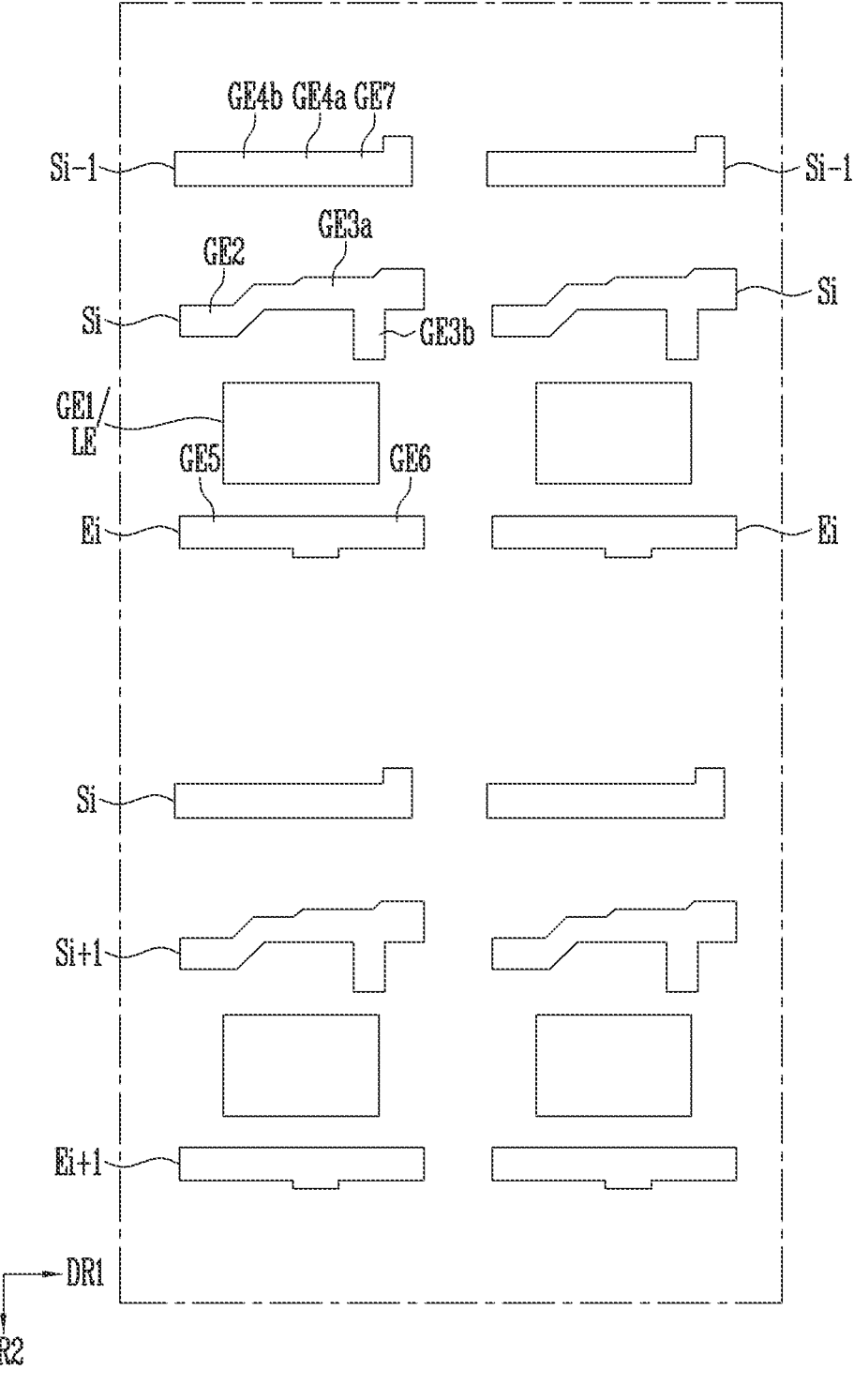
Figure 12:
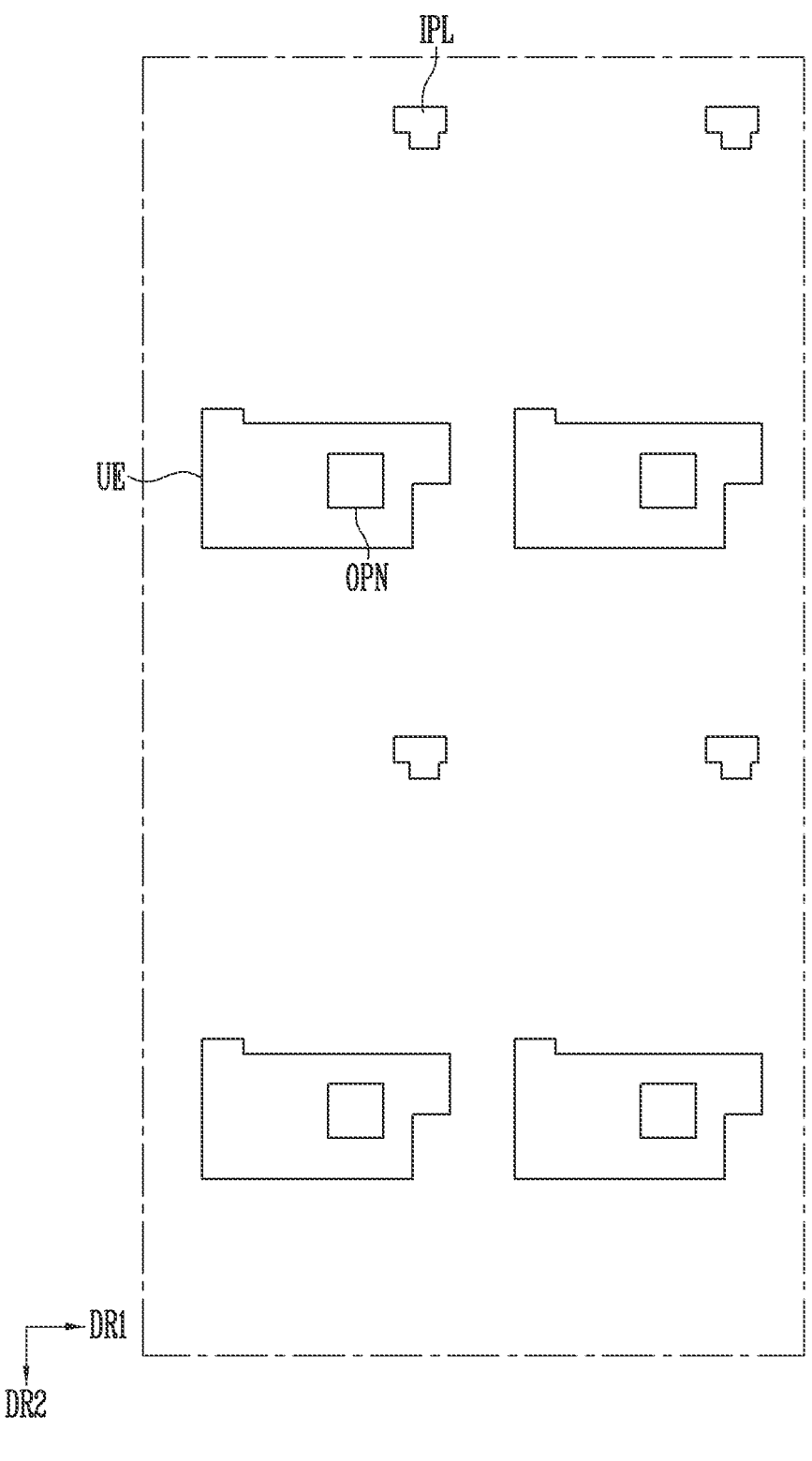
Figure 13:
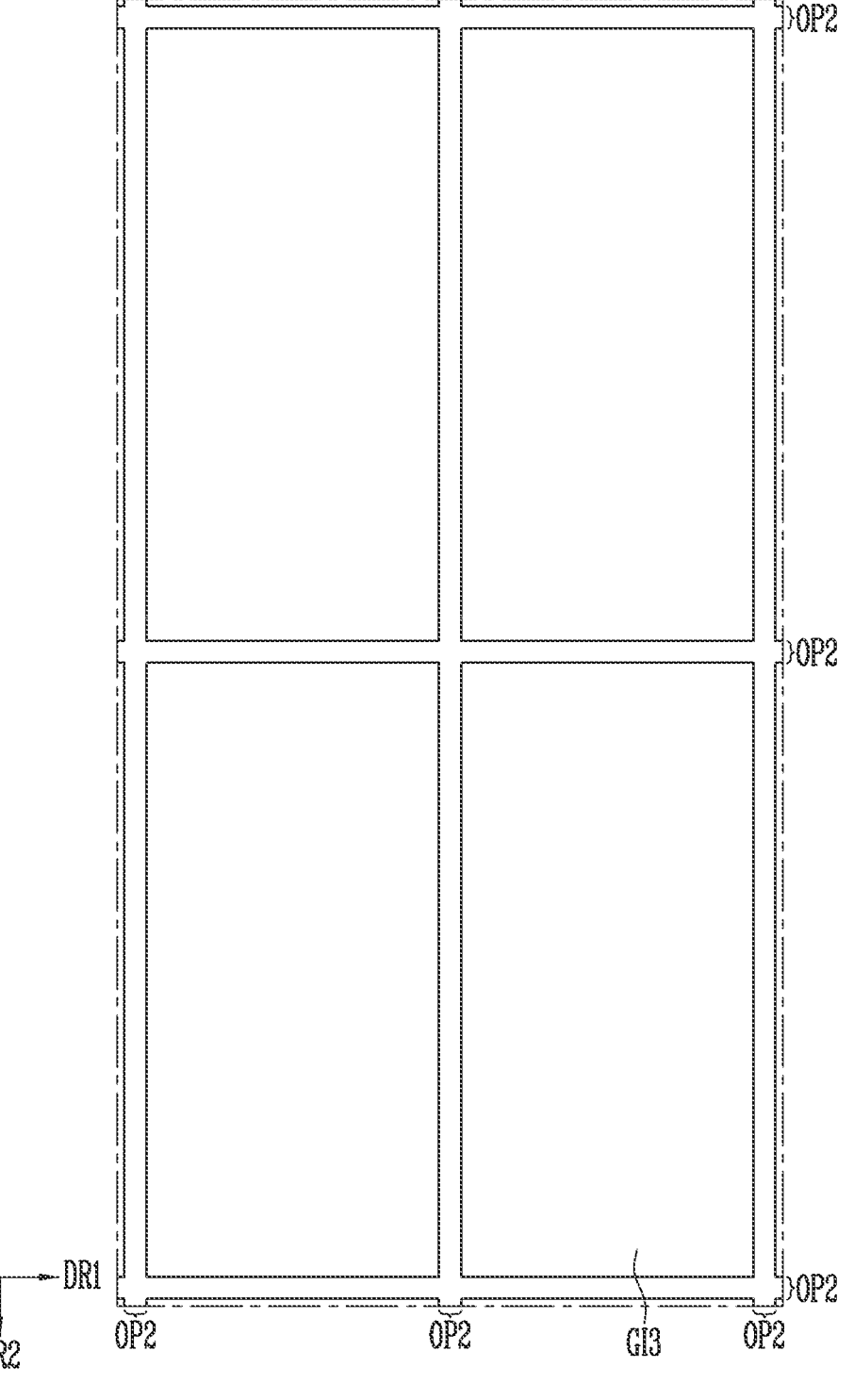
Figure 14:
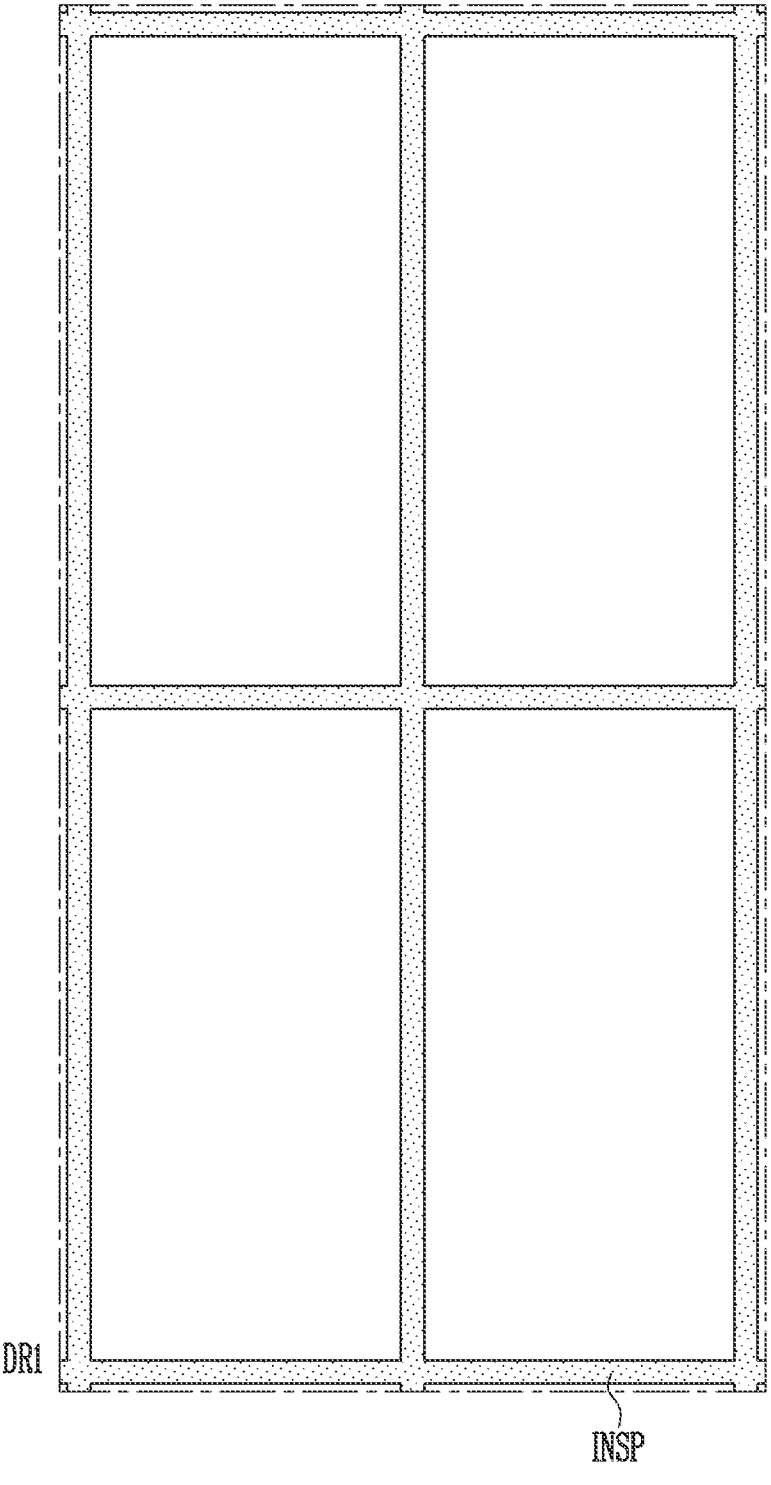
Figure 15:
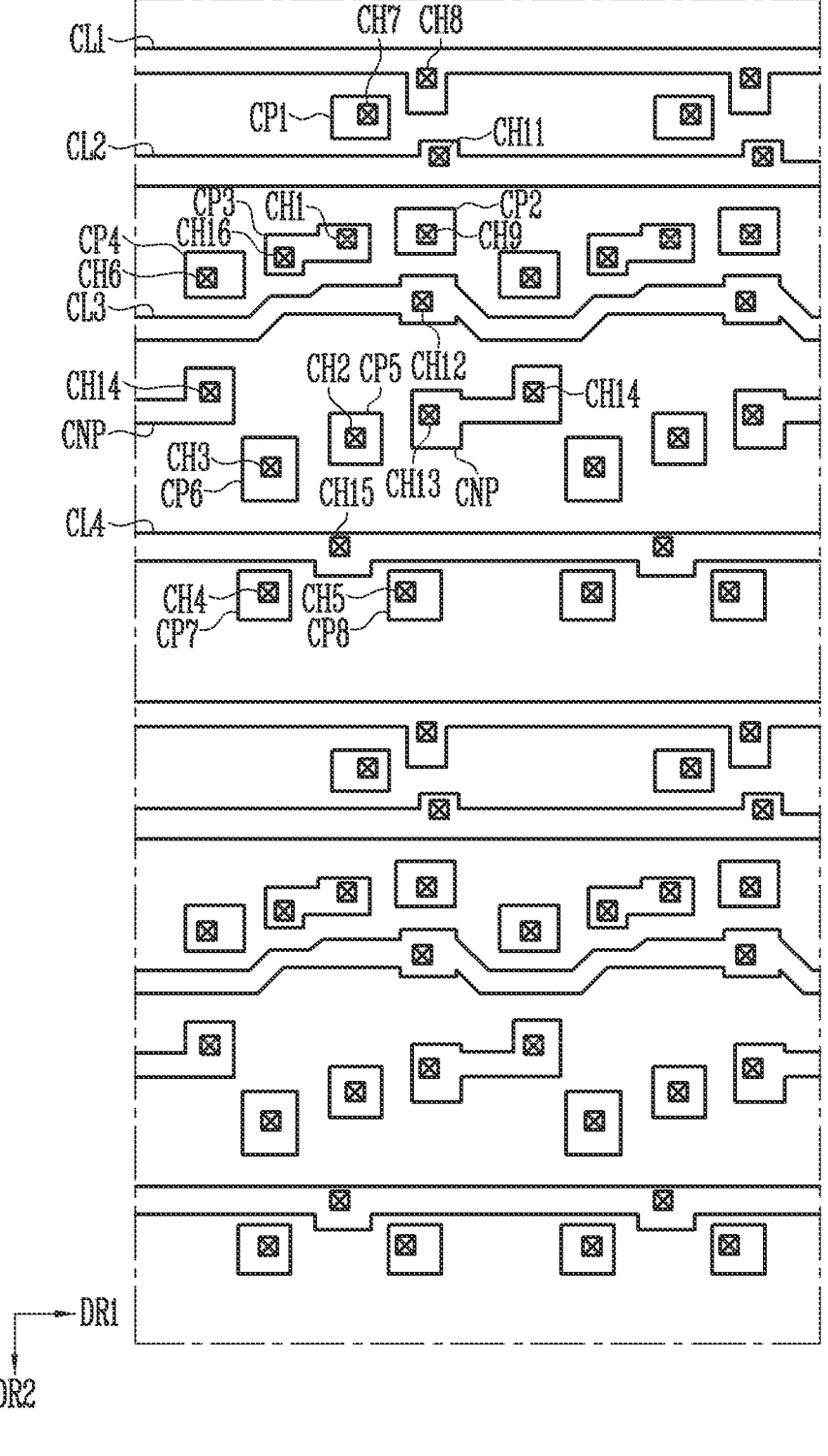
Figure 16:
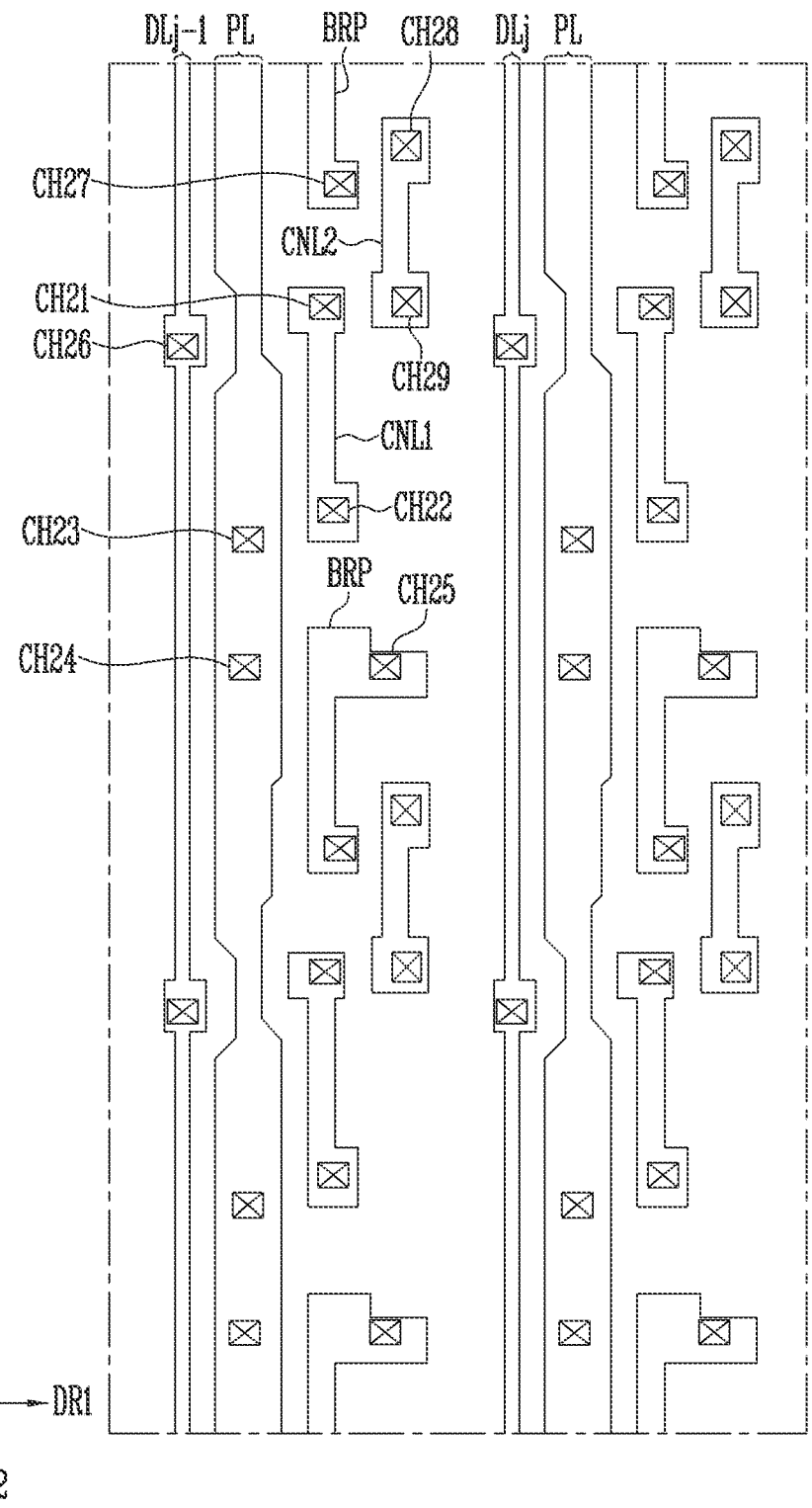
Figure 17:
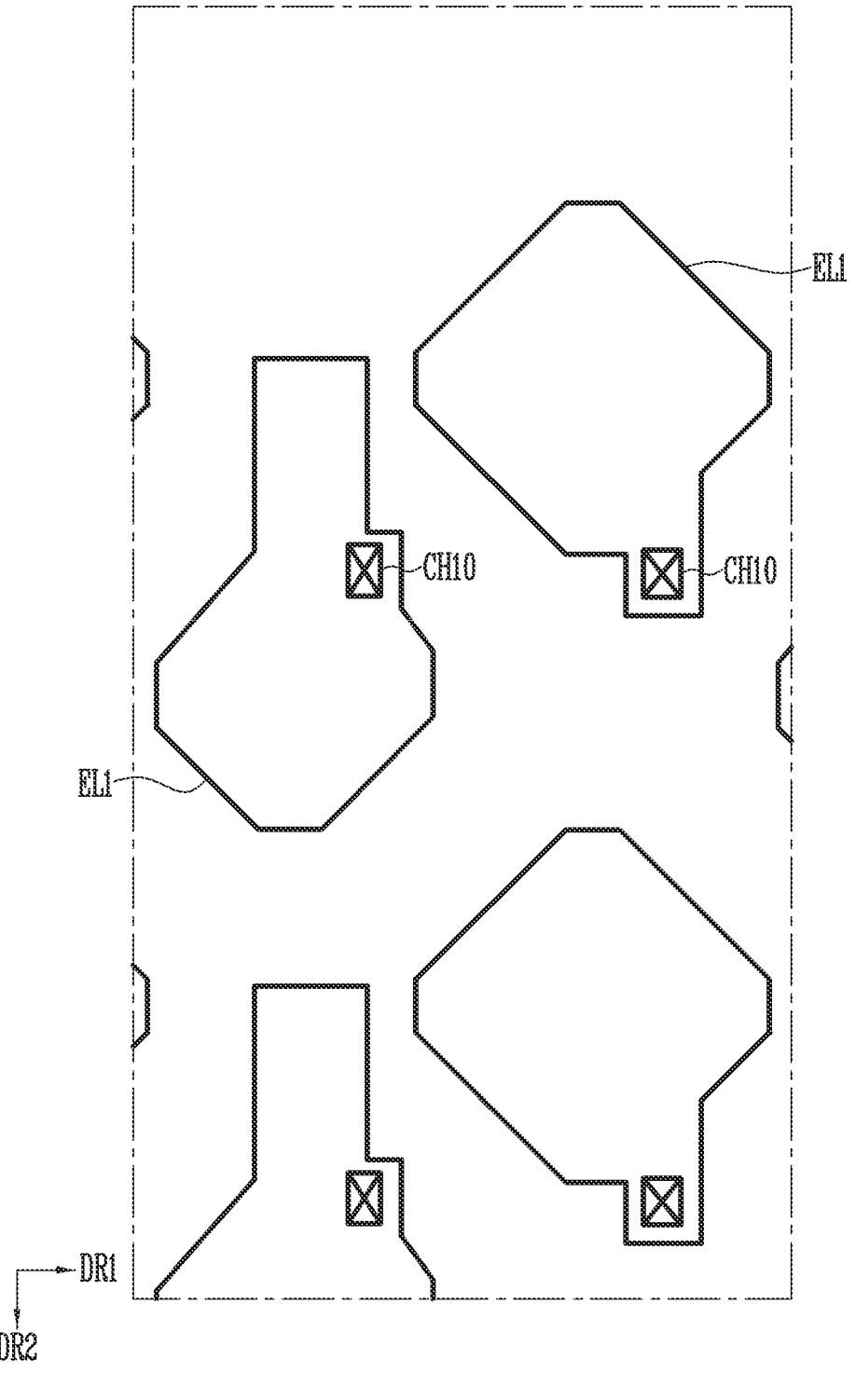

FIG. 4 is an enlarged plan view of region EA1 of FIG. 1, FIG. 5 is a plan view illustrating in detail a third pixel of FIG. 4, FIG. 6A is a sectional view taken along line III-III' of FIG. 5, FIG. 6B is an enlarged sectional view of region EA2 of FIG. 6A, FIG. 7 is a sectional view taken along line IV-IV' of FIG. 5, FIG. 8 is a sectional view taken along line I-I' of FIG. 4, and FIG. 9 is a sectional view taken along line II-II' of FIG. 4.

For the sake of explanation, based on the four pixels PXL1, PXL2, PXL3, and PXL4 disposed on intersections of a j−1-th pixel column, a j-th pixel column, an i-th pixel row, and an i+1-th pixel row in region EA1, FIG. 4 illustrates scan lines Si−1, Si, and Si+1, emission control lines Ei and Ei+1, data lines DLj−1 and DLj, and a power supply line PL that are connected to the four pixels PXL1, PXL2, PXL3, and PXL4.

With regard to lines provided for the four pixels PXL1, PXL2, PXL3, and PXL4 of FIG. 4, for the sake of explanation, a scan line provided on an i−1-th row among the scan lines Si−1, Si, and Si+1 to which scan signals are to be applied will be referred to as an "i−1-th scan line Si−1", a scan line provided on an i-th row will be referred to as an "i-th scan line Si", and a scan line provided on an i+1-th row will be referred to as an "i+1-th scan line Si+1". Furthermore, an emission control line provided on the i-th row among the emission control lines Ei and Ei+1 to which emission control signals are to be applied will be referred to as an "i-th emission control line Ei", and an emission control line provided on the i+1-th row will be referred to as an "i+1-th emission control line Ei+1". A data line provided on a j−1-th column among the data lines DLj−1 and DLj to which data signals are to be applied will be referred to as a "j−1-th data line DLj−1", and a data line provided on a j-th column will be referred to as a "j-th data line DLj".

Although FIGS. 4 to 9 simply illustrate the structure of four pixels PXL1, PXL2, PXL3, and PXL4, e.g., illustrating that each electrode is formed of a single electrode layer and each insulating layer is formed of a single insulating layer, the present disclosure is not limited thereto.

Referring to FIGS. 1 to 9, the display device may include the substrate SUB, the line component, and the pixels PXL.

The substrate SUB may include transparent insulating material to allow light transmission. The substrate SUB may be a rigid substrate. For example, the rigid substrate SUB may be one of selected from a glass substrate, a quartz substrate, a glass ceramic substrate, and a crystalline glass substrate.

The substrate SUB may be a flexible substrate. Here, the flexible substrate SUB may be either a film substrate or a plastic substrate which includes polymer organic material. For example, the substrate SUB may include at least one selected from the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials forming the substrate SUB may be changed. For example, the materials of the substrate SUB may include fiber reinforced plastic (FRP).

The pixels PXL may be arranged with each other in the display region DA on the substrate SUB in a matrix shape and/or a stripe shape along a plurality of pixel rows extending in a first direction DR1 and a plurality of pixel columns extending in a second direction DR2 intersecting with the pixel rows, but the present disclosure is not limited thereto. In an embodiment, the pixels PXL may be provided in the display region DA on the substrate SUB in various arrangement manners which are known to those skilled in the art.

The pixels PXL may include a first pixel PXL1, a second pixel PXL2, a third pixel PXL3, and a fourth pixel PXL4. Hereinafter, the term "pixel PXL" or "pixels PXL" will be used to collectively designate any one pixel or two or more pixels among the first pixel PXL1, the second pixel PXL2, the third pixel PXL3, and the fourth pixel PXL4.

The first pixel PXL1 may be a pixel PXL disposed on an intersection of the i-th pixel row and the j−1-th pixel column. The second pixel PXL2 may be a pixel PXL disposed on an intersection of the i+1-th pixel row and the j−1-th pixel column. The third pixel PXL3 may be a pixel PXL disposed on an intersection of the i-th pixel row and the j-th pixel column. The fourth pixel PXL4 may be a pixel PXL disposed on an intersection of the i+1-th pixel row and the j-th pixel column.

Each of the first to fourth pixels PXL1 to PXL4 may be connected to a corresponding scan line Si−1, Si, or Si+1, a corresponding data line Dj−1 or Dj, a corresponding emission control line Ei or Ei+1, the power supply line PL, and the initialization power electrode IPL.

The scan lines Si−1, Si, and Si+1 may extend on the substrate SUB in the first direction DR1 and be provided for the corresponding pixels PXL. The scan lines Si−1, Si, and Si+1 may include the i−1-th scan line Si−1, the i-th scan line Si, and the i+1-th scan line Si+1 which are successively arranged with each other in the second direction DR2. Each of the scan lines Si−1, Si, and Si+1 may receive a scan signal. For instance, the i−1-th scan line Si−1 may receive an i−1-th scan signal. The i−1-th scan signal may initialize the pixels PXL of the i-th pixel row, for instance, the first and third pixels PXL1 and PXL3. The i-th scan line Si may receive an i-th scan signal. The i-th scan signal may initialize the pixels PXL of the i+1-th pixel row, for instance, the second and fourth pixels PXL2 and PXL4. The i+1-th scan line Si+1 may receive an i+1-th scan signal. Although FIGS. 4 and 5 illustrate that two scan lines are connected to each of the first to fourth pixels PXL1, PXL2, PXL3, and PXL4, the present disclosure is not limited thereto. In an embodiment, three scan lines may be connected to each of the first to fourth pixels PXL1 to PXL4.

In an embodiment of the present disclosure, the scan lines Si−1, Si, and Si+1 provided and/or formed on each of the first to fourth pixels PXL1 to PXL4 may be spaced apart from the scan lines Si−1, Si, and Si+1 provided and/or formed on an adjacent pixel PXL in the first direction DR1 by a predetermined distance. For instance, the scan lines Si−1 and Si of the first pixel PXL1 may be spaced apart from the scan lines Si−1 and Si of the third pixel PXL3 adjacent thereto in the first direction DR1 by a predetermined distance. Furthermore, the scan lines Si and Si+1 of the second pixel PXL2 may be spaced apart from the scan lines Si and Si+1 of the fourth pixel PXL4 adjacent thereto in the first direction DR1 by a predetermined distance.

The scan lines Si−1 and Si of each of the pixels PXL adjacent to each other in the first direction DR1, for instance, the first pixel PXL1 and the third pixel PXL3 may be electrically connected to each other through a conductive layer provided and/or formed on a layer different from that which the scan lines Si−1 and Si are on. To be more specific, the i−1-th scan line Si−1 of the first pixel PXL1 and the i−1-th scan line Si−1 of the third pixel PXL3 may be electrically connected to each other through a second conductive layer CL2. Furthermore, the i-th scan line Si of the first pixel PXL1 and the i-th scan line Si of the third pixel PXL3 may be electrically connected to each other through a third conductive layer CL3.

Furthermore, the scan lines Si and Si+1 of each of the pixels PXL adjacent to each other in the first direction DR1, for instance, the second pixel PXL2 and the fourth pixel PXL4 may be electrically connected to each other through a conductive layer provided and/or formed on a layer different from that which the scan lines Si and Si+1 are on. To be more specific, the i-th scan line Si of the second pixel PXL2 and the i-th scan line Si of the fourth pixel PXL4 may be electrically connected to each other through the second conductive layer CL2. Furthermore, the i+1-th scan line Si+1 of the second pixel PXL2 and the i+1-th scan line Si+1 of the fourth pixel PXL4 may be electrically connected to each other through the third conductive layer CL3.

The emission control lines Ei and Ei+1 may extend on the substrate SUB in the first direction DR1 and be provided for the corresponding pixels PXL. The emission control lines Ei and Ei+1 may include the i-th emission control line Ei and the i+1-th emission control line Ei+1 that are successively arranged with each other in the second direction DR2. The i-th emission control line Ei may be provided for each of the pixels PXL of the i-th pixel row, for instance, the first and third pixels PXL1 and PXL3. The i+1-th emission control line Ei+1 may be provided for each of the pixels PXL of the i+1-th pixel row, for instance, the second and fourth pixels PXL2 and PXL4. The emission control signal may be applied to each of the emission control lines Ei and Ei+1. For example, an i-th emission control signal may be applied to the i-th emission control line Ei, and an i+1-th emission control signal may be applied to the i+1-th emission control line Ei+1.

In an embodiment of the present disclosure, the emission control lines Ei and Ei+1 provided and/or formed on each of the first to fourth pixels PXL1 to PXL4 may be spaced apart from the emission control lines Ei and Ei+1 provided and/or formed on each of adjacent pixels PXL in the first direction DR1 by a predetermined distance. For instance, the i-th emission control line Ei of the first pixel PXL1 may be spaced apart from the i-th emission control line Ei of the third pixel PXL3 by a predetermined distance. Furthermore, the i+1-th emission control line Ei+1 of the second pixel PXL2 may be spaced apart from the i+1-th emission control line Ei+1 of the fourth pixel PXL4 by a predetermined distance.

The i-th emission control line Ei of each of the pixels PXL adjacent to each other in the first direction DR1, for instance, the first pixel PXL1 and the third pixel PXL3 may be electrically connected to each other through a fourth conductive layer CL4 provided and/or formed on a layer different from that which the i-th emission control line Ei is on. Furthermore, the i+1-th emission control line Ei+1 of each of the second pixel PXL2 and the fourth pixel PXL4 may be electrically connected to each other through the fourth conductive layer CL4 provided and/or formed on a layer different from that which the i+1-th emission control line Ei+1 is on.

The data lines DLj−1 and DLj may extend in the second direction DR2. The data lines DLj−1 and DLj may include the j−1-th data line DLj−1 and the j-th data line DLj that are successively arranged with each other in the first direction DR1. In an embodiment of the present disclosure, the j−1-th data line DLj−1 may be connected to each of the pixels PXL, e.g., the first and second pixels PXL1 and PXL2, disposed on the j−1-th pixel column. The j-th data line DLj may be connected to each of the pixels PXL, e.g., the third and fourth pixels PXL3 and PXL4, disposed on the j-th pixel column.

The power supply line PL may extend in the second direction DR2. Either the first driving power ELVDD or the second driving power ELVSS, e.g., the first driving power ELVDD may be supplied to the power supply line PL. The power supply line PL may be disposed to be spaced apart from the data line in each pixel PXL. For instance, in each of the first and second pixels PXL1 and PXL2, the power supply line PL may be spaced apart from the j−1-th data line DLj−1. Furthermore, in each of the third and fourth pixels PXL3 and PXL4, the power supply line PL may be spaced apart from the j-th data line DLj.

The initialization power electrode IPL may be disposed on each of the first to fourth pixels PXL1 to PXL4. The initialization power Vint may be applied to the initialization power electrode IPL. The initialization power electrode IPL may be provided for each of the first to fourth pixels PXL1 to PXL4.

In an embodiment of the present disclosure, the initialization power electrode IPL provided and/or formed on each of the first to fourth pixels PXL1 to PXL4 may be spaced apart from the initialization power electrode IPL provided and/or formed on adjacent pixels PXL by a predetermined distance. For instance, the initialization power electrode IPL of the first pixel PXL1 may be spaced apart from the initialization power electrode IPL of the third pixel PXL3 adjacent thereto in the first direction DR1 by a predetermined distance. Furthermore, the initialization power electrode IPL of the second pixel PXL2 may be spaced apart from the initialization power electrode IPL of the fourth pixel PXL4 adjacent thereto in the first direction DR1 by a predetermined distance. The initialization power electrode IPL of each pixel PXL may be spaced apart from the initialization power electrode IPL of each of the pixels PXL adjacent thereto in the first direction DR1 as well as the initialization power electrode IPL of each of the pixels PXL adjacent thereto in the second direction DR2 by a predetermined distance.

In an embodiment of the present disclosure, the initialization power electrode IPL of each of pixels PXL adjacent to each other in the first direction DR1, for example, the first pixel PXL1 and the third pixel PXL3 may be electrically connected to each other through the first conductive layer CL1 provided and/or formed on a layer different from that which the initialization power electrode IPL is on. Furthermore, the initialization power electrodes IPL of the second pixel PXL2 and the fourth pixel PXL4 which are adjacent to each other in the first direction DR1 may be electrically connected to each other through the first conductive layer CL1.

Meanwhile, a second opening OP2 formed by removing a portion of at least one insulating layer disposed on the substrate SUB may be provided between the adjacent pixels PXL. An insulating pattern INSP may be provided in the second opening OP2.

The second opening OP2 may be formed by removing some of the insulating layers provided on a boundary region (or non-emission region) between two pixels PXL adjacent to each other in the first direction DR1, e.g., the first pixel PXL1 and the third pixel PXL3. Furthermore, the second opening OP2 may be formed by removing some of the insulating layers provided on a boundary region (or non-emission region) between two pixels PXL adjacent to each other in the second direction DR2, e.g., the first pixel PXL1 and the second pixel PXL2. Here, the insulating layers may include a buffer layer BFL and first to third gate insulating layers GI1 to GI3 which are successively formed and/or provided on the substrate SUB. In other words, the second opening OP2 may be formed in each of the buffer layer BFL and the first to third gate insulating layers GI1 to GI3 by removing a portion corresponding to the boundary region (or non-emission region) of two adjacent pixels PXL.

The second opening OP2 may correspond to the boundary region (or non-emission region) of the two adjacent pixels PXL. In an embodiment of the present disclosure, it can be understood that the expression, "the second opening OP2 corresponds to the boundary region (or non-emission region, hereinafter referred to as the 'boundary region') of the two adjacent pixels PXL" means that the second opening OP2 overlaps the boundary region. The second opening OP2 may have the same area as the boundary region or have an area smaller than that of the boundary region. Furthermore, in an embodiment, the second opening OP2 may have an area (or width) greater than the area (or width) of the boundary region within a range where the emission region (e.g. a region where light is emitted from the light emitting element OLED) of each of the pixels PXL is not reduced.

FIGS. 8 and 9 illustrate that all the inner surfaces of the buffer layer BFL and the first to third gate insulating layers GI1 to GI3 coincide with each other and thereby the second opening OP2 of the buffer layer BFL and the second opening OP2 of each of the first to third gate insulating layers GI1 to GI3 are arranged with each other in a straight line, but the present disclosure is not limited thereto. For example, the second opening OP2 of the first gate insulating layer GI1 may have an area (or width) greater than that of the second opening OP2 of the buffer layer BFL. In an embodiment of the present disclosure, the second opening OP2 of the buffer layer BFL may be defined as having a smallest area (or width) among the second opening of the OP2 of the butter layer BFL, the second opening OP2 of the first gate insulating layer GI1, the second opening OP2 of the second gate insulating layer GI2, and the second opening OP2 of the third gate insulating layer GI3.

An insulating pattern INSP may be provided in the second opening OP2. The insulating pattern INSP may fill the second opening OP2. The insulating pattern INSP may be an organic insulating layer including organic material. Examples of the organic material may include a polyacrylic compound, a polyimide compound, a fluorine-based carbon compound such as Teflon, a benzocyclobutene compound, etc.

The first to fourth pixels PXL1 to PXL4 may have a substantially identical or similar structure. Hereinafter, for convenience, the third pixel PXL3 disposed in the i-th pixel row and the j-th pixel column among the first to fourth pixels PXL1 to PXL4 will be representatively described.

The third pixel PXL3 may include a pixel circuit PC and a light emitting element OLED which is electrically connected to the pixel circuit PC. The pixel circuit PC may include first to seventh transistors T1 to T7, and a storage capacitor Cst.

The first transistor T1 may include a first gate electrode GE1, a first active pattern ACT1, a first source electrode SE1, a first drain electrode DE1, and a first contact electrode CNL1.

The first gate electrode GE1 may be connected with a 3a-th drain electrode DE3a of a 3a-th transistor T3a and a 4b-th drain electrode DE4b of a 4b-th transistor T4b.

A first end of the first contact electrode CNL1 may be connected to each of the 3a-th drain electrode DE3a and the 4b-th drain electrode DE4b through first and 21st contact holes CH1 and CH21, and a second end thereof may be connected to the first gate electrode GE1 through second and 22nd contact holes CH2 and CH22.

Each of the first active pattern ACT1, the first source electrode SE1, and the first drain electrode DE1 may be formed of an undoped semiconductor layer or a semiconductor layer doped with an impurity. For example, each of the first source electrode SE1 and the first drain electrode DE1 may be formed of a semiconductor layer doped with an impurity. The first active pattern ACT1 may be formed of an undoped semiconductor layer.

The first active pattern ACT1 may have a bar shape, extending in a predetermined direction, and be bent several times along the longitudinal direction. The first active pattern ACT1 may overlap with the first gate electrode GE1 in a plan view. Because the first active pattern ACT1 is formed long, a channel region of the first transistor T1 may be formed long. Thus, a driving range of a gate voltage to be applied to the first transistor T1 may be increased. Consequently, the gray scale of light emitted from the light emitting element OLED may be precisely controlled.

The first source electrode SE1 may be connected to a first end of the first active pattern ACT1. The first source electrode SE1 may be connected with a second drain electrode DE2 of the second transistor T2 and a fifth drain electrode DE5 of the fifth transistor T5. The first drain electrode DE1 may be connected to a second end of the first active pattern ACT1. The first drain electrode DE1 may be connected with a 3b-th source electrode SE3b of the 3b-th transistor T3b and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be connected to the i-th scan line Si. The second gate electrode GE2 may be provided as a part of the i-th scan line Si or formed to have a shape protruding from the i-th scan line Si.

Each of the second active pattern ACT2, the second source electrode SE2, and the second drain electrode DE2 may be formed of an undoped semiconductor layer or a semiconductor layer doped with an impurity. For example, each of the second source electrode SE2 and the second drain electrode DE2 may be formed of a semiconductor layer doped with an impurity. The second active pattern ACT2 may be formed of an undoped semiconductor layer.

The second active pattern ACT2 may correspond to a portion overlapping the second gate electrode GE2. A first end of the second source electrode SE2 may be connected to the second active pattern ACT2. A second end of the second source electrode SE2 may be connected to the j-th data line DLj through a sixth contact hole CH6 and a 26th contact hole CH26. A first end of the second drain electrode DE2 may be connected to the second active pattern ACT2. A second end of the second drain electrode DE2 may be connected to the first source electrode SE1 of the first transistor T1 and the fifth drain electrode DE5 of the fifth transistor T5.

The third transistor T3 may have a double gate structure to prevent current leakage. In other words, the third transistor T3 may include a 3a-th transistor T3a and a 3b-th transistor T3b.

The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3*b*, a 3b-th source electrode SE3*b*, and a 3b-th drain electrode DE3*b*.

Each of the 3a-th and 3b-th gate electrodes GE3*a* and GE3*b* may be connected to the i-th scan line Si and may be provided as a part of the i-th scan line Si or be formed to have a shape protruding from the i-th scan line Si.

Each of the 3a-th and 3b-th active patterns ACT3*a* and ACT3*b*, the 3a-th and 3b-th source electrodes SE3*a* and SE3*b*, and the 3a-th and 3b-th drain electrodes DE3*a* and DE3*b* may be formed of a semiconductor layer doped with an impurity or an undoped semiconductor layer. Each of the 3a-th and 3b-th source electrodes SE3*a* and SE3*b* and the 3a-th and 3b-th drain electrodes DE3*a* and DE3*b* may be formed of a semiconductor layer doped with an impurity. Each of the 3a-th and 3b-th active patterns ACT3*a* and ACT3*b* may be formed of an undoped semiconductor layer. The 3a-th active pattern ACT3*a* corresponds to a part overlapping the 3a-th gate electrode GE3*a*, and the 3b-th active pattern ACT3*b* corresponds to a part overlapping the 3b-th gate electrode GE3*b*.

A first end of the 3a-th source electrode SE3*a* may be connected to the 3a-th active pattern ACT3*a*, and a second end of the 3a-th source electrode SE3*a* may be connected to the 3b-th drain electrode DE3*b* of the 3b-th transistor T3*b*. A first end of the 3a-th drain electrode DE3*a* may be connected to the 3a-th active pattern ACT3*a*, and a second end of the 3a-th drain electrode DE3*a* may be connected to the first contact electrode CNL1 through the first and 21st contact holes CH1 and CH21.

A first end of the 3b-th source electrode SE3*b* is connected to the 3b-th active pattern ACT3*b*, and a second end of the 3b-th source electrode SE3*b* is connected to the first drain electrode DE1 of the first transistor T1. A first end of the 3b-th drain electrode DE3*b* is connected to the 3b-th active pattern ACT3*b*, and a second end of the 3b-th drain electrode DE3*b* is connected to the 3a-th source electrode SE3*a* of the 3a-th transistor T3*a*.

The fourth transistor T4 may have a double gate structure to prevent current leakage in the same manner as that of the third transistor T3. In other words, the fourth transistor T4 may include a 4a-th transistor T4*a* and a 4b-th transistor T4*b*.

The 4a-th transistor T4*a* may include a 4a-th gate electrode GE4*a*, a 4a-th active pattern ACT4*a*, a 4a-th source electrode SE4*a*, and a 4a-th drain electrode DE4*a*. The 4b-th transistor T4*b* may include a 4b-th gate electrode GE4*b*, a 4b-th active pattern ACT4*b*, a 4b-th source electrode SE4*b*, and a 4b-th drain electrode DE4*b*.

Each of the 4a-th and 4b-th gate electrodes GE4*a* and GE4*b* may be connected to the i−1-th scan line Si−1 and may be provided as a part of the i−1-th scan line Si−1 or be formed to have a shape protruding from the i−1-th scan line Si−1.

Each of the 4a-th and 4b-th active patterns ACT4*a* and ACT4*b*, the 4a-th and 4b-th source electrodes SE4*a* and SE4*b*, and the 4a-th and 4b-th drain electrodes DE4*a* and DE4*b* may be formed of a semiconductor layer doped with an impurity or an undoped semiconductor layer. Each of the 4a-th and 4b-th source electrodes SE4*a* and SE4*b* and the 4a-th and 4b-th drain electrodes DE4*a* and DE4*b* may be formed of a semiconductor layer doped with an impurity. Each of the 4a-th and 4b-th active patterns ACT4*a* and ACT4*b* may be formed of an undoped semiconductor layer. The 4a-th active pattern ACT4*a* corresponds to a part overlapping the 4a-th gate electrode GE4*a*, and the 4b-th active pattern ACT4*b* corresponds to a part overlapping the 4b-th gate electrode GE4*b*.

A first end of the 4a-th source electrode SE4*a* may be connected to the 4a-th active pattern ACT4*a*, and a second end of the 4a-th source electrode SE4*a* may be connected to the seventh drain electrode DE7 of the seventh transistor T7. A first end of the 4a-th drain electrode DE4*a* is connected to the 4a-th active pattern ACT4*a*, and a second end of the 4a-th drain electrode DE4*a* is connected to the 4b-th source electrode SE4*b* of the 4b-th transistor T4*b*.

A first end of the 4b-th source electrode SE4*b* may be connected to the 4b-th active pattern ACT4*b*, and a second end of the 4b-th source electrode SE4*b* may be connected to the 4a-th drain electrode DE4*a* of the 4a-th transistor T4*a*. A first end of the 4b-th drain electrode DE4*b* may be connected to the 4b-th active pattern ACT4*b*, and a second end of the 4b-th drain electrode DE4*b* may be electrically connected to the first contact electrode CNL1 through the first and 21st contact holes CH1 and CH21. Thus, the 4b-th drain electrode DE4*b* may be electrically connected to the 3a-th drain electrode DE3*a* through the first contact electrode CNL1.

The 4b-th drain electrode DE4*b* and the 3a-th drain electrode DE3*a* may be electrically connected to the first gate electrode GE1 of the first transistor T1 through the first contact electrode CNL1.

The fifth transistor T5 may include a fifth gate electrode GE5, a fifth active pattern ACT5, a fifth source electrode SE5, and a fifth drain electrode DE5.

The fifth gate electrode GE5 may be connected to the i-th emission control line Ei. The fifth gate electrode GE5 may be provided as a part of the i-th emission control line Ei, or formed to have a shape protruding from the i-th emission control line Ei.

Each of the fifth active pattern ACT5, the fifth source electrode SE5, and the fifth drain electrode DE5 is formed of an undoped semiconductor layer or a semiconductor layer doped with the impurity. For example, each of the fifth source electrode SE5 and the fifth drain electrode DE5 may be formed of a semiconductor layer doped with an impurity. The fifth active pattern ACT5 may be formed of an undoped semiconductor layer.

The fifth active pattern ACT5 may correspond to a portion overlapping the fifth gate electrode GE5.

A first end of the fifth source electrode SE5 may be connected to the fifth active pattern ACT5. A second end of the fifth source electrode SE5 may be connected to the power supply line PL through fourth and 24th contact holes CH4 and CH24. A first end of the fifth drain electrode DE5 may be connected to the fifth active pattern ACT5. A second end of the fifth drain electrode DE5 may be connected with the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the i-th emission control line Ei. The sixth gate electrode GE6 may be provided as a part of the i-th emission control line Ei, or formed to have a shape protruding from the i-th emission control line Ei.

Each of the sixth active pattern ACT6, the sixth source electrode SE6, and the sixth drain electrode DE6 may be formed of an undoped semiconductor layer or a semiconductor layer doped with an impurity. For example, each of the sixth source electrode SE6 and the sixth drain electrode DE6 may be formed of a semiconductor layer doped with an impurity. The sixth active pattern ACT6 may be formed of an undoped semiconductor layer.

The sixth active pattern ACT6 may correspond to a portion overlapping the sixth gate electrode GE6.

A first end of the sixth source electrode SE6 may be connected to the sixth active pattern ACT6. A second end of the sixth source electrode SE6 may be connected to the first drain electrode DE1 of the first transistor T1 and the 3b-th source electrode SE3b of the 3b-th transistor T3b. A first end of the sixth drain electrode DE6 may be connected to the sixth active pattern ACT6. A second end of the sixth drain electrode DE6 may be electrically connected to a bridge electrode BRP through fifth and 25th contact holes CH5 and CH25.

The seventh transistor T7 may include a seventh gate electrode GE7, a seventh active pattern ACT7, a seventh source electrode SE7, and a seventh drain electrode DE7.

The seventh gate electrode GE7 may be connected to the i−1-th scan line Si−1. The seventh gate electrode GE7 may be provided as a part of the i−1-th scan line Si−1 or formed to have a shape protruding from the i−1-th scan line Si−1.

Each of the seventh active pattern ACT7, the seventh source electrode SE7, and the seventh drain electrode DE7 may be formed of an undoped semiconductor layer or a semiconductor layer doped with an impurity. For example, each of the seventh source electrode SE7 and the seventh drain electrode DE7 may be formed of a semiconductor layer doped with an impurity. The seventh active pattern ACT7 may be formed of an undoped semiconductor layer.

The seventh active pattern ACT7 may correspond to a portion overlapping with the seventh gate electrode GE7.

A first end of the seventh source electrode SE7 may be connected to the seventh active pattern ACT7. A second end of the seventh source electrode SE7 may be connected to the bridge electrode BRP, extending from the pixel PXL disposed in the i−1-th pixel row to the third pixel PXL3, through seventh and 27th contact holes CH7 and CH27. As the seventh source electrode SE7 is electrically connected to the bridge electrode BRP, the seventh source electrode SE7 may be electrically connected to the sixth drain electrode DE6 of the sixth transistor T6 of the pixel PXL disposed in the i−1-th pixel row.

In an embodiment of the present disclosure, the bridge electrode BRP may be electrically connected to a first electrode EL1 of the light emitting element OLED through a tenth contact hole CH10. Thus, the first electrode EL1 of the light emitting element OLED may be electrically connected to each of the sixth drain electrode DE6 of the sixth transistor T6 and the seventh source electrode SE7 of the seventh transistor T7 through the bridge electrode BRP.

A first end of the seventh drain electrode DE7 may be connected to the seventh active pattern ACT7. A second end of the seventh drain electrode DE7 may be electrically connected to a second contact electrode CNL2 through ninth and 29th contact holes CH9 and CH29. Furthermore, the seventh drain electrode DE7 may be electrically connected to the 4a-th source electrode SE4a of the 4a-th transistor T4a.

A first end of the second contact electrode CNL2 may be electrically connected to the initialization power electrode IPL through eighth and 28th contact holes CH8 and CH28. A second end of the second contact electrode CNL2 may be electrically connected to the seventh drain electrode DE7 of the seventh transistor T7 and the 4a-th source electrode SE4a of the 4a-th transistor T4a through ninth and 29th contact holes CH9 and CH29.

The storage capacitor Cst may include a lower electrode LE and an upper electrode UE. The lower electrode LE may be integrally formed with the first gate electrode GE1 of the first transistor T1. When the lower electrode LE is integrally formed with the first gate electrode GE1, the lower electrode LE may be regarded as a part of the first gate electrode GE1.

The upper electrode UE may overlap the lower electrode LE, and cover the lower electrode LE in a plan view. The capacitance of the storage capacitor Cst may be increased by increasing an overlapping area between the upper electrode UE and the lower electrode LE. The upper electrode UE (of the third pixel PXL3) may be spaced apart from the upper electrode UE of the first pixel PXL1, for example, among the pixels PXL adjacent to the third pixel PXL3 in the first direction DR1 by a predetermined distance.

The upper electrode UE may be electrically connected to the power supply line PL through third and 23rd contact holes CH3 and CH23. Thus, the first driving power ELVDD applied to the power supply line PL may be transmitted to the upper electrode UE. The upper electrode UE may include a via hole OPN corresponding to a region in which the second and 22nd contact holes CH2 and CH22 for connecting the first gate electrode GE1 and the first contact electrode CNL1 are formed.

The light emitting element OLED may include a first electrode EL1, a second electrode EL2, and a light-emitting layer EML formed and/or provided between the first electrode EL1 and the second electrode EL2. The first electrode EL1 may be provided in an emission region corresponding to the third pixel PXL3. The first electrode EL1 may be connected to the seventh source electrode SE7 of the seventh transistor T7 and the sixth drain electrode DE6 of the sixth transistor T6 through the bridge electrode BRP.

With reference to FIGS. 4, 5, 6A, 6B, and 7, the third pixel PXL3 will be described below according to the stacking order.

A buffer layer BFL may be provided on the substrate SUB. The buffer layer BFL may be an inorganic insulating layer including inorganic material. The buffer layer BFL may prevent impurities from being diffused into each of the first to seventh transistors T1 to T7. The buffer layer BFL may be provided in a single layer structure or a multilayer structure having at least two or more layers. In the case where the buffer layer BFL has the multilayer structure, the respective layers may be formed of the same material or different materials. The buffer layer BFL may be omitted depending on the material of the substrate SUB or processing conditions.

In an embodiment, a barrier layer BRL may be provided between the substrate SUB and the buffer layer BFL. The barrier layer BRL may be a protective substrate that protects the buffer layer BFL.

The first and second active patterns ACT1 and ACT2, the 3a-th and 3b-th active patterns ACT3a and ACT3b, the 4a-th and 4b-th active patterns ACT4a and ACT4b, and the fifth to seventh active patterns ACT5 to ACT7 may be provided on the buffer layer BFL. The first to seventh active patterns ACT1 to ACT7 may be formed of semiconductor material.

The first gate insulating layer GI1 may be provided and/or formed on the first to seventh active patterns ACT1 to ACT7. The first gate insulating layer GI1 may be an inorganic insulating layer including inorganic material. For example, the first gate insulating layer GI1 may include at least one selected from polysiloxane, silicon nitride, silicon oxide, and silicon oxynitride.

The i−1-th and i-th scan lines Si−1 and Si, the i-th emission control line Ei, and the first to seventh gate electrodes GE1 to GE7 may be provided on the first gate insulating layer GI1. The first gate electrode GE1 may include a lower electrode LE of the storage capacitor Cst.

The second gate electrode GE2 and the 3a-th and 3b-th gate electrode GE3a and GE3b may be integrally formed with the i-th scan line Si. The 4a-th and 4b-th gate electrodes GE4a and GE4b and the seventh gate electrode GE7 may be integrally formed with the i–1-th scan line Si–1. The fifth gate electrode GE5 and the sixth gate electrode GE6 may be integrally formed with the i-th emission control line Ei.

The second gate insulating layer GI2 may be provided on the substrate SUB including on the i–1-th scan line Si–1, etc. The second gate insulating layer GI2 may be an inorganic insulating layer including inorganic material, similarly to the first gate insulating layer GI1.

The initialization power electrode IPL and the upper electrode UE may be formed and/or provided on the second gate insulating layer GI2.

The upper electrode UE may cover the lower electrode LE. The upper electrode UE may form the storage capacitor Cst along with the lower electrode LE, with the second gate insulating layer GI2 interposed between the upper and lower electrodes UE and LE.

A third gate insulating layer GI3 may be formed and/or provided on the substrate SUB including on the initialization power electrode IPL and the upper electrode UE. In an embodiment of the present disclosure, the third gate insulating layer GI3 may be an inorganic insulating layer including inorganic material, similarly to the first and second gate insulating layers GI1 and GI2.

First to fourth conductive layers CL1 to CL4, a connection pattern CNP, and first to eighth conductive patterns CP1 to CP8 may be formed and/or provided on the third gate insulating layer GI3. The first to fourth conductive layers CL1 to CL4, the connection pattern CNP, and the first to eighth conductive patterns CP1 to CP8 may be formed and/or provided on the same layer. In an embodiment of the present disclosure, the first to fourth conductive layers CL1 to CL4, the connection pattern CNP, and the first to eighth conductive patterns CP1 to CP8 may be made of the same conductive material, and in particular, may be made of conductive material such as molybdenum (Mo) having excellent ductility and low resistance characteristics.

In an embodiment of the present disclosure, the first to fourth conductive layers CL1 to CL4 may be provided in common on the pixels PXL adjacent to each other in the first direction DR1.

The first conductive layer CL1 may be electrically connected to the initialization power electrode IPL through the eighth contact hole CH8 passing through the third gate insulating layer GI3. In an embodiment of the present disclosure, the first conductive layer CL1 may be provided in common on the third pixel PXL3 as well as pixels PXL adjacent to the third pixel PXL3 in the first direction DR1, for example, the first pixel PXL1. In other words, each of the initialization power electrode IPL of the first pixel PXL1 and the initialization power electrode IPL of the third pixel PXL3 may be electrically connected to the first conductive layer CL1 through the eighth contact hole CH8 in a corresponding pixel PXL. Thus, the initialization power Vint applied to the first conductive layer CL1 may be transmitted to the initialization power electrode IPL of each of pixels PXL adjacent to each other in the first direction DR1, e.g., the first and third pixels PXL1 and PXL3. In a plan view, the first conductive layer CL1 may overlap the initialization power electrode IPL of each pixel PXL.

The second conductive layer CL2 may be electrically connected to the i–1-th scan line Si–1 through a 11th contact hole CH11 which successively passes through the second and third gate insulating layers GI2 and GI3. In an embodiment of the present disclosure, the second conductive layer CL2 may be provided in common on the third pixel PXL3 as well as pixels PXL adjacent to the third pixel PXL3 in the first direction DR1, for example, the first pixel PXL1. In other words, each of the i–1-th scan line Si–1 of the first pixel PXL1 and the i–1-th scan line Si–1 of the third pixel PXL3 may be electrically connected to the second conductive layer CL2 through the 11th contact hole CH11 in a corresponding pixel PXL. Thus, the i–1-th scan signal applied to the second conductive layer CL2 may be transmitted to the i–1-th scan line Si–1 of each of pixels PXL adjacent to each other in the first direction DR1, e.g., the first and third pixels PXL1 and PXL3. In a plan view, the second conductive layer CL2 may overlap the i–1-th scan line Si–1 of each pixel PXL.

In an embodiment of the present disclosure, the i–1-th scan line Si–1 of each of the first and third pixels PXL1 and PXL3 may be electrically connected to the second conductive layer CL2 to be implemented as a double layer structure. Therefore, the line resistance of the i–1-th scan line Si–1 of each of the first and third pixels PXL1 and PXL3 may be reduced, so that the delay of the scan signal applied to the i–1-th scan line Si–1 may be decreased.

The third conductive layer CL3 may be electrically connected to the i-th scan line Si through a 12th contact hole CH12 which successively passes through the second and third gate insulating layers GI2 and GI3. In an embodiment of the present disclosure, the third conductive layer CL3 may be provided in common on the third pixel PXL3 as well as pixels PXL adjacent to the third pixel PXL3 in the first direction DR1, for example, the first pixel PXL1. In other words, each of the i-th scan line Si of the first pixel PXL1 and the i-th scan line Si of the third pixel PXL3 may be electrically connected to the third conductive layer CL3 through the 12th contact hole CH12 in a corresponding pixel PXL. Thus, the i-th scan signal applied to the third conductive layer CL3 may be transmitted to the i-th scan line Si of each of pixels PXL adjacent to each other in the first direction DR1, e.g., the first and third pixels PXL1 and PXL3. In a plan view, the third conductive layer CL3 may overlap the i-th scan line Si of each pixel PXL.

In an embodiment of the present disclosure, the i-th scan line Si of each of the first and third pixels PXL1 and PXL3 may be electrically connected to the third conductive layer CL3 to be implemented as a double layer structure. Therefore, the line resistance of the i-th scan line Si of each of the first and third pixels PXL1 and PXL3 may be reduced, so that the delay of the scan signal applied to the i-th scan line Si may be decreased.

The fourth conductive layer CL4 may be electrically connected to the i-th emission control line Ei through a 15th contact hole CH15 which successively passes through the second and third gate insulating layers GI2 and GI3. In an embodiment of the present disclosure, the fourth conductive layer CL4 may be provided in common on the third pixel PXL3 as well as pixels PXL adjacent to the third pixel PXL3 in the first direction DR1, for example, the first pixel PXL1. In other words, each of the i-th emission control line Ei of the first pixel PXL1 and the i-th emission control line Ei of the third pixel PXL3 may be electrically connected to the fourth conductive layer CL4 through a 15th contact hole CH15 in a corresponding pixel PXL. Thus, the i-th emission control signal applied to the fourth conductive layer CL4 may be transmitted to the i-th emission control line Ei of each of pixels PXL adjacent to each other in the first direction DR1, e.g., the first and third pixels PXL1 and PXL3. In a plan view, the fourth conductive layer CL4 may overlap the i-th emission control line Ei of each pixel PXL.

In an embodiment of the present disclosure, the i-th emission control line Ei of each of the first and third pixels PXL1 and PXL3 may be electrically connected to the fourth conductive layer CL4 to be implemented as a double layer structure. Therefore, the line resistance of the i-th emission control line Ei of each of the first and third pixels PXL1 and PXL3 may be reduced, so that the delay of the emission control signal applied to the i-th emission control line Ei may be decreased.

In a plan view, the connection pattern CNP may be located between two pixels PXL which are adjacent in the first direction DR1. For example, the connection pattern CNP may be located between the first pixel PXL1 and the third pixel PXL3. Furthermore, in a plan view, the connection pattern CNP may be located between a pixel (not shown) of a j+1-th pixel column located on the right side of the third pixel PXL3 and the third pixel PXL3.

In an embodiment of the present disclosure, a first end of the connection pattern CNP located between the first pixel PXL1 and the third pixel PXL3 may be electrically connected to a first side of the upper electrode UE of the third pixel PXL3 through a 14th contact hole CH14 which passes through the third gate insulating layer GI3. Furthermore, a second end of the connection pattern CNP located between the first pixel PXL1 and the third pixel PXL3 may be electrically connected to a first side of the upper electrode UE of the first pixel PXL1 through a 13th contact hole CH13 (a 13th contact hole CH13 of the first pixel PXL1) which passes through the third gate insulating layer GI3. The upper electrode UE of the first pixel PXL1 and the upper electrode UE of the third pixel PXL3 may be electrically connected to each other through the above-described connection pattern CNP.

A first end of the connection pattern CNP located between the third pixel PXL3 and a pixel PXL (hereinafter, referred to as a 'j+1-th pixel PXL') which is adjacent to the third pixel PXL3 in the first direction DR1 and is disposed in a j+1-th pixel column may be electrically connected to the upper electrode UE of the third pixel PXL3 through the 13th contact hole CH13 (i.e., the 13th contact hole CH13 of the third pixel PXL3) passing through the third gate insulating layer GI3. Furthermore, a second end of the connection pattern CNP located between the third pixel PXL3 and the j+1-th pixel PXL may be electrically connected to the upper electrode UE of the j+1-th pixel PXL through a 14th contact hole CH14 (i.e., the 14th contact hole CH14 of the j+1-th pixel PXL) which passes through the third gate insulating layer GI3. The upper electrode UE of the j+1-th pixel PXL and the upper electrode UE of the third pixel PXL3 may be electrically connected to each other through the above-described connection pattern CNP.

As described above, the upper electrode UE of each pixel PXL and the upper electrode UE of each of the pixels PXL adjacent to the pixel PXL in the first direction DR1 may be electrically connected to each other through the connection pattern CNP.

The first conductive pattern CP1 may be electrically connected to the seventh source electrode SE7 of the seventh transistor T7 through the seventh contact hole CH7 which successively passes through the first to third gate insulating layers GI1 to GI3.

The second conductive pattern CP2 may be electrically connected to each of the seventh drain electrode DE7 of the seventh transistor T7 and the 4a-th source electrode SE4a of the 4a-th transistor T4a through the ninth contact hole CH9 which successively passes through the first to third gate insulating layers GI1 to GI3.

The third conductive pattern CP3 may be electrically connected to the 3a-th drain electrode DE3a of the 3a-th transistor T3a through the first contact hole CH1 which successively passes through the first to third gate insulating layers GI1 to GI3. Furthermore, the third conductive pattern CP3 may be electrically connected to the 4b-th drain electrode DE4b of the 4b-th transistor T4b through a 16th contact hole CH16 which successively passes through the first to third gate insulating layers GI1 to GI3. The 3a-th drain electrode DE3a of the 3a-th transistor T3a and the 4b-th drain electrode DE4b of the 4b-th transistor T4b may be electrically connected to each other through the third conductive pattern CP3.

The fourth conductive pattern CP4 may be electrically connected to the second source electrode SE2 of the second transistor T2 through the sixth contact hole CH6 which successively passes through the first to third gate insulating layers GI1 to GI3.

The fifth conductive pattern CP5 may be electrically connected to the first gate electrode GE1 of the first transistor T1 through the second contact hole CH2 which successively passes through the second and third gate insulating layers GI2 to GI3.

The sixth conductive pattern CP6 may be electrically connected to the upper electrode UE through the third contact hole CH3 passing through the third gate insulating layer GI3.

The seventh conductive pattern CP7 may be electrically connected to the fifth source electrode SE5 of the fifth transistor T5 through the fourth contact hole CH4 which successively passes through the first to third gate insulating layers GI1 to GI3.

The eighth conductive pattern CP8 may be electrically connected to the sixth drain electrode DE6 of the sixth transistor T6 through the fifth contact hole CH5 which successively passes through the first to third gate insulating layers GI1 to GI3.

An interlayer insulating layer ILD is formed on the substrate SUB on which the first to fourth conductive layers CL1 to CL4 are formed. In an embodiment of the present disclosure, the interlayer insulating layer ILD may include a first interlayer insulating layer ILD1 which covers the first to fourth conductive layers CL1 to CL4, the connection pattern CNP, and the first to eighth conductive patterns CP1 to CP8, and a second interlayer insulating layer ILD2 which is provided on the first interlayer insulating layer ILD1.

The first interlayer insulating layer ILD1 may include an inorganic insulating layer formed of inorganic material. The second interlayer insulating layer ILD2 may be formed of material different from that of the first interlayer insulating layer ILD1. For example, the second interlayer insulating layer ILD2 may be an organic insulating layer formed of organic material. Particularly, the second interlayer insulating layer ILD2 may be formed of an organic insulating layer which is advantageous to alleviate a step formed by structures located thereunder, e.g., the first to fourth conductive layers CL1 to CL4, thus causing the first and second contact electrodes CNL1 and CNL2, which are to be formed on the second interlayer insulating layer ILD2, to have a uniform surface.

The first and second contact electrodes CNL1 and CNL2, the bridge electrode BRP, the j-th data line DLj, and the power supply line PL may be formed and/or provided on the interlayer insulating layer ILD.

First, in a plan view, a first end of the first contact electrode CNL1 may overlap the third conductive pattern CP3, and a second end of the first contact electrode CNL1 may overlap the fifth conductive pattern CP5.

The first end of the first contact electrode CNL1 may be electrically connected to the third conductive pattern CP3 through the 21st contact hole CH21 that successively passes through the first and second interlayer insulating layers ILD1 and ILD2. In an embodiment of the present disclosure, the third conductive pattern CP3 may be provided as a medium which electrically connects the 4b-th drain electrode DE4b and the first end of the first contact electrode CNL1 between the first contact hole CH1 and the 21st contact hole CH21. Furthermore, the third conductive pattern CP3 may be provided as a medium which electrically connects the 3a-th drain electrode DE3a and the first end of the first contact electrode CNL1 between the first contact hole CH1 and the 21st contact hole CH21.

In a plan view, the 21st contact hole CH21 may overlap the first contact hole CH1 (or they may be located on the same line). The present disclosure is not limited thereto. In an embodiment, the 21st contact hole CH21 may be spaced apart from the first contact hole CH1 without overlapping the first contact hole CH1 (or without being located on the same line as the first contact hole CH1) with the third conductive pattern CP3 being interposed therebetween.

The second end of the first contact electrode CNL1 may be electrically connected to the fifth conductive pattern CP5 through the 22th contact hole CH22 that successively passes through the first and second interlayer insulating layers ILD1 and ILD2. In an embodiment of the present disclosure, the fifth conductive pattern CP5 may be provided as a medium which electrically connects the first gate electrode GE1 and the second end of the first contact electrode CNL1 between the second contact hole CH2 and the 22th contact hole CH22.

In a plan view, the 22th contact hole CH22 may overlap the second contact hole CH2, but the present disclosure is not limited thereto. In an embodiment, the 22th contact hole CH22 may be spaced apart from the second contact hole CH2 without overlapping the second contact hole CH2 with the fifth conductive pattern CP5 being interposed therebetween.

Consequently, the 4b-th drain electrode DE4b, the 3a-th drain electrode DE3a, and the first gate electrode GE1 may be electrically connected to each other through the first and 21th contact holes CH1 and CH21 and the first contact electrode CNL1.

In a plan view, the first end of the second contact electrode CNL2 may overlap a region of the first conductive layer CL1, and the second end of the second contact electrode CNL2 may overlap the second conductive pattern CP2. In an embodiment of the present disclosure, in a plan view, a region of the first conductive layer CL1 may mean a region protruding along the second direction DR2. Hereinafter, for convenience, a region of the first conductive layer CL1 overlapping the second contact electrode CNL2 will be referred to as a "protrusion CL1".

The first end of the second contact electrode CNL2 may be electrically connected to the protrusion CL1 through the 28th contact hole CH28 that successively passes through the first and second interlayer insulating layers ILD1 and ILD2. In an embodiment of the present disclosure, the protrusion CL1 may be provided as a medium which electrically connects the initialization power electrode IPL and the first end of the second contact electrode CNL2 between the eighth contact hole CH8 and the 28th contact hole CH28.

In a plan view, the 28th contact hole CH28 may overlap the eighth contact hole CH8 (or they may be located on the same line). The present disclosure is not limited thereto. In an embodiment, the 28th contact hole CH28 may be spaced apart from the eighth contact hole CH8 without overlapping the eighth contact hole CH8 (or without being located on the same line as the eighth contact hole CH8) with the protrusion CL1 being interposed therebetween.

For convenience, FIG. 6A illustrates that the inner surface of the first interlayer insulating layer ILD1 and the inner surface of the second interlayer insulating layer ILD2 each including the 28th contact hole CH28 are aligned with each other to be disposed on the same line. However, the present disclosure is not limited thereto. For example, as illustrated in FIG. 6B, the 28th contact hole CH28 of the second interlayer insulating layer ILD2 may have a width W2 which is wider (or greater) than a width W1 of the 28th contact hole CH28 of the first interlayer insulating layer ILD1.

In an embodiment of the present disclosure, a region of the protrusion CL1 connected to the initialization power electrode IPL through the eighth contact hole CH8 may be exposed to the outside by the 28th contact hole CH28 of the first interlayer insulating layer ILD1, and a remaining region except for the region of the protrusion CL1 may be directly covered by the first interlayer insulating layer ILD1 formed of the inorganic insulating layer. Because the remaining region except for the region of the protrusion CL1 is directly covered by the first interlayer insulating layer ILD1, the inner surface of the second interlayer insulating layer ILD2 including the 28th contact hole CH28 may be designed to be outside the inner surface of the first interlayer insulating layer ILD1 including the 28th contact hole CH28.

When the inner surface of the second interlayer insulating layer ILD2 including the 28th contact hole CH28 is outside the inner surface of the first interlayer insulating layer ILD1 including the 28th contact hole CH28, the width W2 of the 28th contact hole CH28 of the second interlayer insulating layer ILD2 may be greater than the width W1 of the 28th contact hole CH28 of the first interlayer insulating layer ILD1. When the width W2 of the 28th contact hole CH28 of the second interlayer insulating layer ILD2 is greater than the width W1 of the 28th contact hole CH28 of the first interlayer insulating layer ILD1, a contact area between the second contact electrode CNL2 and a region of the protrusion CL1 may be further secured. Securing the contact area between the second contact electrode CNL2 and the region of the protrusion CL1 may reduce contact resistance between the second contact electrode CNL2, the protrusion CL1, and the initialization power electrode IPL.

If only the second interlayer insulating layer ILD2 formed of organic material is formed and/or provided on the protrusion CL1, a step and misalignment between the second interlayer insulating layer ILD2 and the protrusion CL1 occurs due to the material characteristics of the second interlayer insulating layer ILD2, thus causing a skew error. In order to prevent the skew error, the area (or size) of the protrusion CL1 compared to the width of the 28th contact hole CH28 included in the second interlayer insulating layer ILD2 may be increased. When the area (or size) of the protrusion CL1 is increased, a space limitation occurs because the area (or size) of the protrusion CL is defined in the limited space of the third pixel PXL3, so that the structure of the pixel circuit PC included in the third pixel PXL3 may be further complicated.

Therefore, in an embodiment of the present disclosure, because the first interlayer insulating layer ILD1 formed of inorganic material is disposed under the second interlayer insulating layer ILD2 so that the first interlayer insulating layer ILD1 directly covers the protrusion CL1, the area (or size) of the protrusion CL1 may be kept constant.

In addition, according to an embodiment of the present disclosure, as the first interlayer insulating layer ILD1 and the second interlayer insulating layer ILD2 are continuously stacked on the protrusion CL1, a step caused by the thickness of the protrusion CL1 may be decreased by the second interlayer insulating layer ILD2 even if the protrusion CL1 has a thickness of a predetermined level or more. Thus, the second contact electrode CNL2 disposed on the protrusion CL1 may have a uniform surface with the first and second interlayer insulating layers ILD1 and ILD2 being interposed therebetween.

In the above-described embodiment, although it is illustrated that only the width W2 of the 28th contact hole CH28 of the second interlayer insulating layer ILD2 is greater (or wider) than the width W1 of the 28th contact hole CH28 of the first interlayer insulating layer ILD1, the present disclosure is not limited thereto. The width of each of the contact holes included in the second interlayer insulating layer ILD2, for instance, the 21st to 29th contact holes CH21 to CH29 may be greater (or wider) than the width of each of the 21st to 29th contact holes CH21 to CH29 of the corresponding first interlayer insulating layer ILD1.

To be more specific, the width of the 21st contact hole CH21 of the second interlayer insulating layer ILD2 may be larger (or wider) than the width of the 21st contact hole CH21 of the first interlayer insulating layer ILD1. The width of the 22nd contact hole CH22 of the second interlayer insulating layer ILD2 may be larger (or wider) than the width of the 22nd contact hole CH22 of the first interlayer insulating layer ILD1. The width of the 23rd contact hole CH23 of the second interlayer insulating layer ILD2 may be larger (or wider) than the width of the 23rd contact hole CH23 of the first interlayer insulating layer ILD1. The width of the 24th contact hole CH24 of the second interlayer insulating layer ILD2 may be larger (or wider) than the width of the 24th contact hole CH24 of the first interlayer insulating layer ILD1. The width of the 25th contact hole CH25 of the second interlayer insulating layer ILD2 may be larger (or wider) than the width of the 25th contact hole CH25 of the first interlayer insulating layer ILD1. The width of the 26th contact hole CH26 of the second interlayer insulating layer ILD2 may be larger (or wider) than the width of the 26th contact hole CH26 of the first interlayer insulating layer ILD1. The width of the 27th contact hole CH27 of the second interlayer insulating layer ILD2 may be larger (or wider) than the width of the 27th contact hole CH27 of the first interlayer insulating layer ILD1. The width of the 29th contact hole CH29 of the second interlayer insulating layer ILD2 may be larger (or wider) than the width of the 29th contact hole CH29 of the first interlayer insulating layer ILD1.

The second end of the second contact electrode CNL2 may be electrically connected to the second conductive pattern CP2 through the 29th contact hole CH29 that successively passes through the first and second interlayer insulating layers ILD1 and ILD2. In an embodiment of the present disclosure, the second conductive pattern CP2 may be provided as a medium which electrically connects the seventh drain electrode DE7 of the seventh transistor T7 and the second end of the second contact electrode CNL2 between the ninth contact hole CH9 and the 29th contact hole CH29. Furthermore, the second conductive pattern CP2 may be provided as a medium which electrically connects the 4a-th source electrode SE4a of the 4a-th transistor T4a and the second end of the second contact electrode CNL2 between the ninth contact hole CH9 and the 29th contact hole CH29.

As a result, the 4a-th source electrode SE4a, the seventh drain electrode DE7, and the initialization power electrode IPL may be electrically connected to each other through the ninth and 29th contact holes CH9 and CH29 and the second contact electrode CNL2.

In a plan view, the 29th contact hole CH29 may overlap the ninth contact hole CH9 (or they may be located on the same line). The present disclosure is not limited thereto. In an embodiment, the 29th contact hole CH29 may be spaced apart from the ninth contact hole CH9 without overlapping the ninth contact hole CH9 (or without being located on the same line as the ninth contact hole CH9) with the second conductive pattern CP2 being interposed therebetween.

In a plan view, the bridge electrode BRP may overlap the eighth conductive pattern CP8 of the third pixel PXL3, the first conductive pattern CP1 of the fourth pixel PXL4, and the first electrode EL1 of the light emitting element OLED of the third pixel PXL3. Hereinafter, for convenience, a part of the bridge electrode BRP overlapping the eighth conductive pattern CP8 of the third pixel PXL3 will be referred to as "a first part of the bridge electrode BRP", a part of the bridge electrode BRP overlapping the first conductive pattern CP1 of the fourth pixel PXL4 will be referred to as "a second part of the bridge electrode BRP", and a part of the bridge electrode BRP overlapping the first electrode EL1 of the light emitting element OLED of the third pixel PXL3 will be referred to as "a third part of the bridge electrode BRP".

A first part of the bridge electrode BRP may be electrically connected to the eighth conductive pattern CP8 through the 25th contact hole CH25 that successively passes through the first and second interlayer insulating layers ILD1 and ILD2. In an embodiment of the present disclosure, the eighth conductive pattern CP8 may be provided as a medium which electrically connects the sixth drain electrode DE6 of the sixth transistor T6 and the first part of the bridge electrode BRP between the fifth contact hole CH5 and the 25th contact hole CH25.

In a plan view, the 25th contact hole CH25 may overlap the fifth contact hole CH5 (or they may be located on the same line). The present disclosure is not limited thereto. In an embodiment, the 25th contact hole CH25 may be spaced apart from the fifth contact hole CH5 without overlapping the fifth contact hole CH5 (or without being located on the same line as the fifth contact hole CH5) with the eighth conductive pattern CP8 being interposed therebetween.

A second part of the bridge electrode BRP may be electrically connected to the first conductive pattern CP1 of the fourth pixel PXL4 through the 27th contact hole CH27 that successively passes through the first and second interlayer insulating layers ILD1 and ILD2. In an embodiment of the present disclosure, the first conductive pattern CP1 of the fourth pixel PXL4 may be provided as a medium which electrically connects the seventh source electrode SE7 of the seventh transistor T7 of the third pixel PXL3 and the second part of the bridge electrode BRP between the seventh contact hole CH7 and the 27th contact hole CH27.

In a plan view, the 27th contact hole CH27 may overlap the seventh contact hole CH7 (or they may be located on the same line). The present disclosure is not limited thereto. In an embodiment, the 27th contact hole CH27 may be spaced apart from the seventh contact hole CH7 without overlapping the seventh contact hole CH7 (or without being located on the same line as the seventh contact hole CH7) with the first conductive pattern CP1 of the fourth pixel PXL4 being interposed therebetween.

In a plan view, the j-th data line DLj may overlap the fourth conductive pattern CP4.

The j-th data line DLj may be electrically connected to the fourth conductive pattern CP4 through the 26th contact hole CH26 that successively passes through the first and second interlayer insulating layers ILD1 and ILD2. In an embodiment of the present disclosure, the fourth conductive pattern CP4 may be provided as a medium which electrically connects the second source electrode SE2 of the second transistor T2 and the j-th data line DLj between the sixth contact hole CH6 and the 26th contact hole CH26.

In a plan view, the 26th contact hole CH26 may overlap the sixth contact hole CH6 (or they may be located on the same line). The present disclosure is not limited thereto. In an embodiment, the 26th contact hole CH26 may be spaced apart from the sixth contact hole CH6 without overlapping the sixth contact hole CH6 (or without being located on the same line as the sixth contact hole CH6) with the fourth conductive pattern CP4 being interposed therebetween.

In a plan view, the power supply line PL may overlap the sixth conductive pattern CP6.

The power supply line PL may be electrically connected to the sixth conductive pattern CP6 through the 23rd contact hole CH23 that successively passes through the first and second interlayer insulating layers ILD1 and ILD2. In an embodiment of the present disclosure, the sixth conductive pattern CP6 may be provided as a medium which electrically connects the upper electrode UE and the power supply line PL between the third contact hole CH3 and the 23rd contact hole CH23.

In a plan view, the 23rd contact hole CH23 may overlap the third contact hole CH3 (or they may be located on the same line). The present disclosure is not limited thereto. In an embodiment, the 23rd contact hole CH23 may be spaced apart from the third contact hole CH3 without overlapping the third contact hole CH3 (or without being located on the same line as the third contact hole CH3) with the sixth conductive pattern CP6 being interposed therebetween.

A passivation layer PSV may be formed and/or provided on the substrate SUB including the first and second contact electrodes CNL1 and CNL2, the bridge electrode BRP, the j-th data line DLj, and the power supply line PL. The passivation layer PSV may be an organic insulating layer including organic material.

The first electrode EL1 may be formed and/or provided on the passivation layer PSV. The first electrode EL1 may be electrically connected to a third part of the bridge electrode BRP through the tenth contact hole CH10 passing through the passivation layer PSV. In an embodiment of the present disclosure, the third part of the bridge electrode BRP may be provided as a medium which electrically connects the sixth drain electrode DE6, the seventh source electrode SE7, and the first electrode EL1 between the 25th contact hole CH25 and the tenth contact hole CH10. In other words, the first electrode EL1 may be finally connected to the sixth drain electrode DE6 and the seventh source electrode SE7 through the bridge electrode BRP.

A pixel defining layer PDL for defining an emission area to correspond to the third pixel PXL3 may be provided on the substrate SUB including the first electrode EL1. The pixel defining layer PDL may include a first opening OP1 which exposes a part of an upper surface of the first electrode EL1, and protrudes from the substrate SUB along the periphery of the third pixel PXL3. The pixel defining layer PDL may be an organic insulating layer including organic material.

The light-emitting layer EML may be provided on the upper surface of the first electrode EL1 which is exposed by the first opening OP1 of the pixel defining layer PDL. The second electrode EL2 may be provided on the light-emitting layer EML.

The light-emitting layer EML may be disposed on the exposed surface of the first electrode EL1. The light-emitting layer EML may have a multilayer thin-film structure including at least a light generation layer. The light-emitting layer EML may include: a hole injection layer into which holes are injected; a hole transport layer which has excellent hole transportation performance and restrains movement of electrons that have not been connected with holes in the light generation layer and thus increases chances of recombination between holes and electrons; the light generation layer which emits light by recombination between injected electrons and holes; a hole blocking layer which restrains movement of holes that have not been connected with electrons in the light generation layer; an electron transport layer which is provided to smoothly transport electrons to the light generation layer; and an electron injection layer into which electrons are injected.

The color of light generated from the light generation layer may be one selected from red, green, blue and white, but in the present embodiment, it is not limited thereto. For example, the color of light generated from the light generation layer of the light-emitting layer EML may be one selected from magenta, cyan, and yellow. The hole injection layer, the hole transport layer, the hole blocking layer, the electron transport layer, and the electron injection layer may be common layers connected between adjacent emission areas.

A thin-film encapsulation layer TFE may be provided on the second electrode EL2 to cover the second electrode EL2.

The thin-film encapsulation layer TFE may have a single layer structure or a multi-layer structure. The thin-film encapsulation layer TFE may include a plurality of insulating layers configured to cover the light emitting element OLED. In detail, the thin-film encapsulation layer TFE may include at least one inorganic layer and at least one organic layer. For example, the thin-film encapsulation layer TFE may have a structure formed by alternately stacking the inorganic layers and the organic layers. In some embodiments, the thin-film encapsulation layer TFE may be an encapsulation substrate which is disposed on the light emitting element OLED and joined to the substrate SUB by a sealant.

Meanwhile, the display device in accordance with an embodiment of the present disclosure may further include a touch sensor (not shown) provided on the thin-film encapsulation layer TFE. The touch sensor may be disposed on a surface in a direction in which the image of the substrate SUB is displayed, and may receive a user's touch input. The touch sensor may recognize a touch event (i.e., incident on) to the display device through a user's hand or a separate input means.

As described above, each of the first to seventh transistors T1 to T7 in the third pixel PXL3 may be selectively connected to the first contact electrode CNL1, the second contact electrode CNL2, or the bridge electrode BRP through the corresponding conductive pattern disposed on the third gate insulating layer GI3. Thus, contact resistance between each of the first to seventh transistors T1 to T7 and the first contact electrode CNL1, the second contact electrode CNL2 or the bridge electrode BRP may be reduced.

Hereinafter, a connecting structure between two pixels PXL adjacent to each other in the first direction DR1, for instance, the second pixel PXL2 and the fourth pixel PXL4 will be described with reference to FIGS. 4, 8, and 9.

The second opening OP2 may be formed between the second pixel PXL2 and the fourth pixel PXL4 adjacent to each other in the first direction DR1 by removing a part of each of the buffer layer BFL and the first to third gate insulating layers GI1 to GI3. In an embodiment of the present disclosure, the second opening OP2 may cut the continuity of the buffer layer BFL including the inorganic material and the first to third gate insulating layers GI1 to GI3 for each pixel PXL. In other words, the second opening OP2 allows the buffer layer BFL of the second pixel PXL2 and the buffer layer BFL of the fourth pixel PXL4 to be spaced apart from each other by a predetermined distance, and allows the first gate insulating layer GI1 of the second pixel PXL2 and the first gate insulating layer GI1 of the fourth pixel PXL4 to be spaced apart from each other by a predetermined distance. Furthermore, the second opening OP2 allows the second gate insulating layer GI2 of the second pixel PXL2 and the second gate insulating layer GI2 of the fourth pixel PXL4 to be spaced apart from each other by a predetermined distance, and allows the third gate insulating layer GI3 of the second pixel PXL2 and the third gate insulating layer GI3 of the fourth pixel PXL4 to be spaced apart from each other by a predetermined distance.

The above-described second opening OP2 may serve as a crack blocking layer which prevents cracks due to stress generated when the display device is curved (or bent) from proceeding from the second pixel PXL2 to the fourth pixel PXL4 along the buffer layer BFL and the first to third gate insulating layers GI1 to GI3.

An insulating pattern INSP including organic material may be provided in the second opening OP2. The insulating pattern INSP may fill all the second opening OP2, but the present disclosure is not limited thereto. In an embodiment, the insulating pattern INSP may fill at least some of the second opening OP2. The insulating pattern INSP may be provided in the shape of filling the second opening OP2 between the second pixel PXL2 and the fourth pixel PXL4, and may provide flexibility between the second pixel PXL2 and the fourth pixel PXL4 when the display device is curved (or bent) due to material characteristics. Consequently, the impact resistance of the display device may be enhanced.

As described above, when the second opening OP2 and the insulating pattern INSP filling the second opening OP2 are provided between two adjacent pixels PXL, e.g., the second pixel PXL2 and the fourth pixel PXL4, stress generated when the display device is curved (or bent) may concentrate on the second opening OP2 and the insulating pattern INSP. Thus, because the stress generated when the display device is curved (or bent) does not concentrate on the second and fourth pixels PXL2 and PXL4, the impact resistance of the second and fourth pixels PXL2 and PXL4 may be enhanced.

The second conductive layer CL2 made of conductive material having excellent ductility and low resistance characteristics may be disposed on the insulating pattern INSP to electrically connect the i-th scan line Si of the second pixel PXL2 and the i-th scan line Si of the fourth pixel PXL4, thus reducing the line resistance of the i-th scan line Si of each of the second and fourth pixels PXL2 and PXL4. Thus, it is possible to prevent the delay of the i-th scan signal applied to the i-th scan line Si of each of the second and fourth pixels PXL2 and PXL4.

In the above-described embodiment, it is described that the second conductive layer CL2 is disposed on the insulating pattern INSP. However, all of the first conductive layer CL1, the third conductive layer CL3, and the fourth conductive layer CL4 are disposed on the insulating pattern INSP, so that the second pixel PXL2 and the fourth pixel PXL4 may be electrically connected to each other.

FIGS. 10 to 17 are plan views schematically illustrating elements of the first to fourth pixels shown in FIG. 4 for each layer. The following description will be focused on differences from the above-mentioned embodiments to avoid redundancy of explanation. Components which are not separately explained in the following description of the present embodiment comply with that of the preceding embodiments. The same reference numeral will be used to designate the same component, and a similar reference numeral will be used to designate a similar component.

First, referring to FIGS. 1 to 10, the first and second active patterns ACT1 and ACT2, the 3a-th and 3b-th active patterns ACT3a and ACT3b, the 4a-th and 4-th active patterns ACT4a and ACT4b, and the fifth to seventh active patterns ACT5 to ACT7 may be provided on the substrate SUB of each of the first to fourth pixels PXL1 to PXL4.

Furthermore, the first and second source electrodes SE1 and SE2, the 3a-th and 3b-th source electrodes SE3a and SE3b, the 4a-th and 4b-th source electrodes SE4a and SE4b, and the fifth to seventh source electrodes SE5 to SE7 may be provided on the substrate SUB of each of the first to fourth pixels PXL1 to PXL4. In addition, the first and second drain electrodes DE1 and DE2, the 3a-th and 3b-th drain electrodes DE3a and DE3b, the 4a-th and 4b-th drain electrodes DE4a and DE4b, and the fifth to seventh drain electrodes DE5 to DE7 may be provided on the substrate SUB of each of the first to fourth pixels PXL1 to PXL4.

A first end of the first active pattern ACT1 of each of the first to fourth pixels PXL1 to PXL4 may be connected to the first source electrode SE1 of the corresponding pixel PXL, and a second end of the first active pattern ACT1 may be connected to the first drain electrode DE1 of the corresponding pixel PXL.

A first end of the second active pattern ACT2 of each of the first to fourth pixels PXL1 to PXL4 may be connected to the second source electrode SE2 of the corresponding pixel PXL, and a second end of the second active pattern ACT2 may be connected to the second drain electrode DE2 of the corresponding pixel PXL.

A first end of the 3a-th active pattern ACT3a of each of the first to fourth pixels PXL1 to PXL4 may be connected to the 3a-th source electrode SE3a of the corresponding pixel PXL, and a second end of the 3a-th active pattern ACT3a may be connected to the 3a-th drain electrode DE3a of the corresponding pixel PXL.

A first end of the 3b-th active pattern ACT3b of each of the first to fourth pixels PXL1 to PXL4 may be connected to the 3b-th source electrode SE3b of the corresponding pixel PXL, and a second end of the 3b-th active pattern ACT3b may be connected to the 3b-th drain electrode DE3b of the corresponding pixel PXL.

A first end of the 4a-th active pattern ACT4a of each of the first to fourth pixels PXL1 to PXL4 may be connected to the 4a-th source electrode SE4a of the corresponding pixel PXL, and a second end of the 4a-th active pattern ACT4a may be connected to the 4a-th drain electrode DE4a of the corresponding pixel PXL.

A first end of the 4b-th active pattern ACT4b of each of the first to fourth pixels PXL1 to PXL4 may be connected to the 4b-th source electrode SE4b of the corresponding pixel PXL, and a second end of the 4b-th active pattern ACT4b may be connected to the 4b-th drain electrode DE4b of the corresponding pixel PXL.

A first end of the fifth active pattern ACT5 of each of the first to fourth pixels PXL1 to PXL4 may be connected to the fifth source electrode SE5 of the corresponding pixel PXL, and a second end of the fifth active pattern ACT5 may be connected to the fifth drain electrode DE5 of the corresponding pixel PXL.

A first end of the sixth active pattern ACT6 of each of the first to fourth pixels PXL1 to PXL4 may be connected to the sixth source electrode SE6 of the corresponding pixel PXL, and a second end of the sixth active pattern ACT6 may be connected to the sixth drain electrode DE6 of the corresponding pixel PXL.

A first end of the seventh active pattern ACT7 of each of the first to fourth pixels PXL1 to PXL4 may be connected to the seventh source electrode SE7 of the corresponding pixel PXL, and a second end of the seventh active pattern ACT7 may be connected to the seventh drain electrode DE7 of the corresponding pixel PXL.

Referring to FIGS. 1 to 11, the i−1-th scan line Si−1, the i-th scan line Si, the i+1-th scan line Si+1, the i-th emission control line Ei, and the i+1-th emission control line Ei+1 may be provided on the first gate insulating layer GI1 covering the first and second active patterns ACT1 and ACT2, the 3a-th and 3b-th active patterns ACT3a and ACT3b, the 4a-th and 4b-th active patterns ACT4a and ACT4b, and the fifth to seventh active patterns ACT5 to ACT7 of each of the first to fourth pixels PXL1 to PXL4.

The i−1-th scan line Si−1, the i-th scan line Si, the i+1-th scan line Si+1, the i-th emission control line Ei, and the i+1-th emission control line Ei+1 may include the same material, and may be formed through the same process.

Furthermore, the lower electrode LE, the first and second gate electrodes GE1 and GE2, the 3a-th and 3b-th gate electrodes GE3a and GE3b, the 4a-th and 4b-th gate electrodes GE4a and GE4b, and the fifth to seventh gate electrodes GE5 to GE7 may be provided on the first gate insulating layer GI1 of each of the first to fourth pixels PXL1 to PXL4.

In each of the first to fourth pixels PXL1 to PXL4, the first gate electrode GE1 and the lower electrode LE may be integrally provided.

In the first and third pixels PXL1 and PXL3 located in the i-th pixel row which is the same pixel row, the second gate electrode GE2 and the 3a-th and 3b-th gate electrodes GE3a and GE3b may be provided integrally with the i-th scan line Si. In the second and fourth pixels PXL2 and PXL4 located in the i+1-th pixel row which is the same pixel row, the second gate electrode GE2 and the 3a-th and 3b-th gate electrodes GE3a and GE3b may be provided integrally with the i+1-th scan line Si+1.

In the first and third pixels PXL1 and PXL3, the seventh gate electrode GE7 and the 4a-th and 4b-th gate electrodes GE4a and GE4b may be provided integrally with the i−1-th scan line Si−1. In the second and fourth pixels PXL2 and PXL4, the seventh gate electrode GE7 and the 4a-th and 4b-th gate electrodes GE4a and GE4b may be provided integrally with the i-th scan line Si.

In the first and third pixels PXL1 and PXL3, the fifth gate electrode GE5 and the sixth gate electrode GE6 may be provided integrally with the i-th emission control line Ei. In the second and fourth pixels PXL2 and PXL4, the fifth gate electrode GE5 and the sixth gate electrode GE6 may be provided integrally with the i+1-th emission control line Ei+1.

Referring to FIGS. 1 to 12, the upper electrode UE and the initialization power electrode IPL may be provided on the second gate insulating layer GI2 covering the i−1-th scan line Si−1, the i-th scan line Si, and the i+1-th scan line Si+1 of each of the first to fourth pixels PXL1 to PXL4. The upper electrode UE may include a via hole OPN.

Referring to FIGS. 1 to 13, the second opening OP2 is formed by removing a part of each of the first to third gate insulating layers GI1 to GI3 and the buffer layer BFL on the substrate SUB on which the initialization power electrode IPL and the upper electrode UE of each of the first to fourth pixels PXL1 to PXL4 are formed. The second opening OP2 may be located between adjacent pixels PXL, and be located in a non-emission region other than the emission region of each pixel PXL.

Referring to FIGS. 1 to 14, the insulating pattern INSP is formed in the second opening OP2. The insulating pattern INSP may be an organic insulating layer including organic material.

Referring to FIGS. 1 to 15, the first to fourth conductive layers CL1 to CL4, the first to eighth conductive patterns CP1 to CP8, and the connection pattern CNP are formed on the substrate SUB on which the insulating pattern INSP is formed.

The first to fourth conductive layers CL1 to CL4, the first to eighth conductive patterns CP1 to CP8, and the connection pattern CNP may include the same material, and be formed through the same process.

The first to fourth conductive layers CL1 to CL4 may extend in the first direction DR1, and be provided in common on the pixels PXL adjacent to each other in the first direction DR1.

The first conductive layer CL1 which is provided in common on the first and third pixels PXL1 and PXL3 may be electrically connected to the initialization power electrode IPL of the corresponding pixel PXL through the eighth contact hole CH8. Likewise, the first conductive layer CL1 which is provided in common on the second and fourth pixels PXL2 and PXL4 may be electrically connected to the initialization power electrode IPL of the corresponding pixel PXL through the eighth contact hole CH8.

The second conductive layer CL2 which is provided in common on the first and third pixels PXL1 and PXL3 may be electrically connected to the i−1-th scan line Si−1 of the corresponding pixel PXL through the 11th contact hole CH11. The second conductive layer CL2 which is provided in common on the second and fourth pixels PXL2 and PXL4 may be electrically connected to the i-th scan line Si of the corresponding pixel PXL through the 11th contact hole CH11.

The third conductive layer CL3 which is provided in common on the first and third pixels PXL1 and PXL3 may be electrically connected to the i-th scan line Si of the corresponding pixel PXL through the 12th contact hole CH12. The third conductive layer CL3 which is provided in common on the second and fourth pixels PXL2 and PXL4 may be electrically connected to the i+1-th scan line Si+1 of the corresponding pixel PXL through the 12th contact hole CH12.

The fourth conductive layer CL4 which is provided in common on the first and third pixels PXL1 and PXL3 may be electrically connected to the i-th emission control line Ei of the corresponding pixel PXL through the 15th contact hole CH15. The fourth conductive layer CL4 which is provided in common on the second and fourth pixels PXL2 and PXL4 may be electrically connected to the i+1-th emission control line Ei+1 of the corresponding pixel PXL through the 15th contact hole CH15.

The first to eighth conductive patterns CP1 to CP8 may be provided, respectively, on the first to fourth pixels PXL1 to PXL4, and be spaced apart from an adjacent conductive pattern by a predetermined distance to be electrically separated therefrom.

The first conductive pattern CP1 of each of the first to fourth pixels PXL1 to PXL4 may be electrically connected to the seventh source electrode SE7 of the corresponding pixel PXL through the seventh contact hole CH7. The second conductive pattern CP2 of each of the first to fourth pixels PXL1 to PXL4 may be electrically connected to each of the seventh drain electrode DE7 and the 4a-th source electrode SE4a of the corresponding pixel PXL through the ninth contact hole CH9.

A first end of the third conductive pattern CP3 of each of the first to fourth pixels PXL1 to PXL4 may be electrically connected to the 3a-th drain electrode DE3a of the corresponding pixel PXL through the first contact hole CH1. Furthermore, a second end of the third conductive pattern CP3 of each of the first to fourth pixels PXL1 to PXL4 may be electrically connected to the 4bth drain electrode DE4b of the corresponding pixel PXL through the 16th contact hole CH16.

The fourth conductive pattern CP4 of each of the first to fourth pixels PXL1 to PXL4 may be electrically connected to the second source electrode SE2 of the corresponding pixel PXL through the sixth contact hole CH6. The fifth conductive pattern CP5 of each of the first to fourth pixels PXL1 to PXL4 may be electrically connected to the first gate electrode GE1 of the corresponding pixel PXL through the second contact hole CH2.

The sixth conductive pattern CP6 of each of the first to fourth pixels PXL1 to PXL4 may be electrically connected to the upper electrode UE of the corresponding pixel PXL through the third contact hole CH3. The seventh conductive pattern CP7 of each of the first to fourth pixels PXL1 to PXL4 may be electrically connected to the fifth source electrode SE5 of the corresponding pixel PXL through the fourth contact hole CH4. The eighth conductive pattern CP8 of each of the first to fourth pixels PXL1 to PXL4 may be electrically connected to the sixth drain electrode DE6 of the corresponding pixel PXL through the fifth contact hole CH5.

In an embodiment of the present disclosure, the connection pattern CNP may be located between two pixels PXL disposed adjacent to each other in the first direction DR1. To be more specific, the connection pattern CNP may be located on the insulating pattern INSP between two pixels PXL adjacent to each other in the first direction DR1 to be provided in common on the two adjacent pixels PXL.

Furthermore, a first end of the connection pattern CNP located between the first pixel PXL1 and the third pixel PXL3 may be electrically connected to a first side of the upper electrode UE of the first pixel PXL1 through the 13rd contact hole CH13. Furthermore, a second end of the connection pattern CNP located between the first pixel PXL1 and the third pixel PXL3 may be electrically connected to a first side of the upper electrode UE of the third pixel PXL3 through the 14th contact hole CH14. Thus, the upper electrode UE of the first pixel PXL1 and the upper electrode UE of the third pixel PXL3 may be electrically connected to each other through the connection pattern CNP.

Likewise, a first end of the connection pattern CNP located between the second pixel PXL2 and the fourth pixel PXL4 may be electrically connected to a first side of the upper electrode UE of the second pixel PXL2 through the 13rd contact hole CH13. Furthermore, a second end of the connection pattern CNP located between the second pixel PXL2 and the fourth pixel PXL4 may be electrically connected to a first side of the upper electrode UE of the fourth pixel PXL4 through the 14th contact hole CH14. Thus, the upper electrode UE of the second pixel PXL2 and the upper electrode UE of the fourth pixel PXL4 may be electrically connected to each other through the connection pattern CNP.

Referring to FIGS. 1 to 16, the first and second contact electrodes CNL1 and CNL2, the j−1-th data line DLj−1, the j-th data line DLj, the power supply line PL, and the bridge electrode BRP may be formed on the interlayer insulating layer ILD covering the first to fourth conductive layers CL1 to CL4, the first to eighth conductive patterns CP1 to CP8, and the connection pattern CNP.

A first end of the first contact electrode CNL1 of each of the first to fourth pixels PXL1 to PXL4 may be electrically connected to a first end of the third conductive pattern CP3 of the corresponding pixel PXL through the 21st contact hole CH21. Furthermore, a second end of the first contact electrode CNL1 of each of the first to fourth pixels PXL1 to PXL4 may be electrically connected to the fifth conductive pattern CP5 of the corresponding pixel PXL through the 22nd contact hole CH22.

A first end of the second contact electrode CNL2 of each of the first to fourth pixels PXL1 to PXL4 may be electrically connected to a first region of the first conductive layer CL1 of the corresponding pixel PXL through the 28th contact hole CH28. Furthermore, a second end of the second contact electrode CNL2 of each of the first to fourth pixels PXL1 to PXL4 may be electrically connected to the second conductive pattern CP2 of the corresponding pixel PXL through the 29th contact hole CH29.

The j−1-th data line DLj−1 of each of the first and second pixels PXL1 and PXL2 located in the same pixel column may be electrically connected to the fourth conductive pattern CP4 of the corresponding pixel PXL through the 26th contact hole CH26. The j-th data line DLj of each of the third and fourth pixels PXL3 and PXL4 located in the same pixel column may be electrically connected to the fourth conductive pattern CP4 of the corresponding pixel PXL through the 26th contact hole CH26.

The power supply line PL of each of the first to fourth pixels PXL1 to PXL4 may be electrically connected to the sixth conductive pattern CP6 of the corresponding pixel PXL through the 23rd contact hole CH23. Furthermore, the power supply line PL of each of the first to fourth pixels PXL1 to PXL4 may be electrically connected to the seventh conductive pattern CP7 of the corresponding pixel PXL through the 24th contact hole CH24.

The bridge electrode BRP of each of the first to fourth pixels PXL1 to PXL4 may be electrically connected to the eighth conductive pattern CP8 of the corresponding pixel PXL through the 25th contact hole CH25. Furthermore, the bridge electrode BRP of each of the first to fourth pixels PXL1 to PXL4 may be electrically connected to the first conductive pattern CP1 of the pixel PXL adjacent to the corresponding pixel PXL in the second direction DR2 through the 27th contact hole CH27. For example, the bridge electrode BRP of the first pixel PXL1 may be electrically connected to the first conductive pattern CP1 of the second pixel PXL2 adjacent to the first pixel PXL1 in the second direction DR2 through the 27th contact hole CH27 (i.e., the 27th contact hole CH27 of the second pixel PXL2).

Referring to FIGS. 1 to 17, the first electrode EL1 may be formed on the passivation layer PSV covering the first and second contact electrodes CNL1 and CNL2, the bridge electrode BRP, the j−1-th data line DLj−1, the j-th data line DLj, and the power supply line PL of each of the first to fourth pixels PXL1 to PXL4.

The first electrode EL1 of each of the first to fourth pixels PXL1 to PXL4 may be electrically connected to the bridge electrode BRP of the corresponding pixel PXL through the 10th contact hole CH10.

Figure 18:
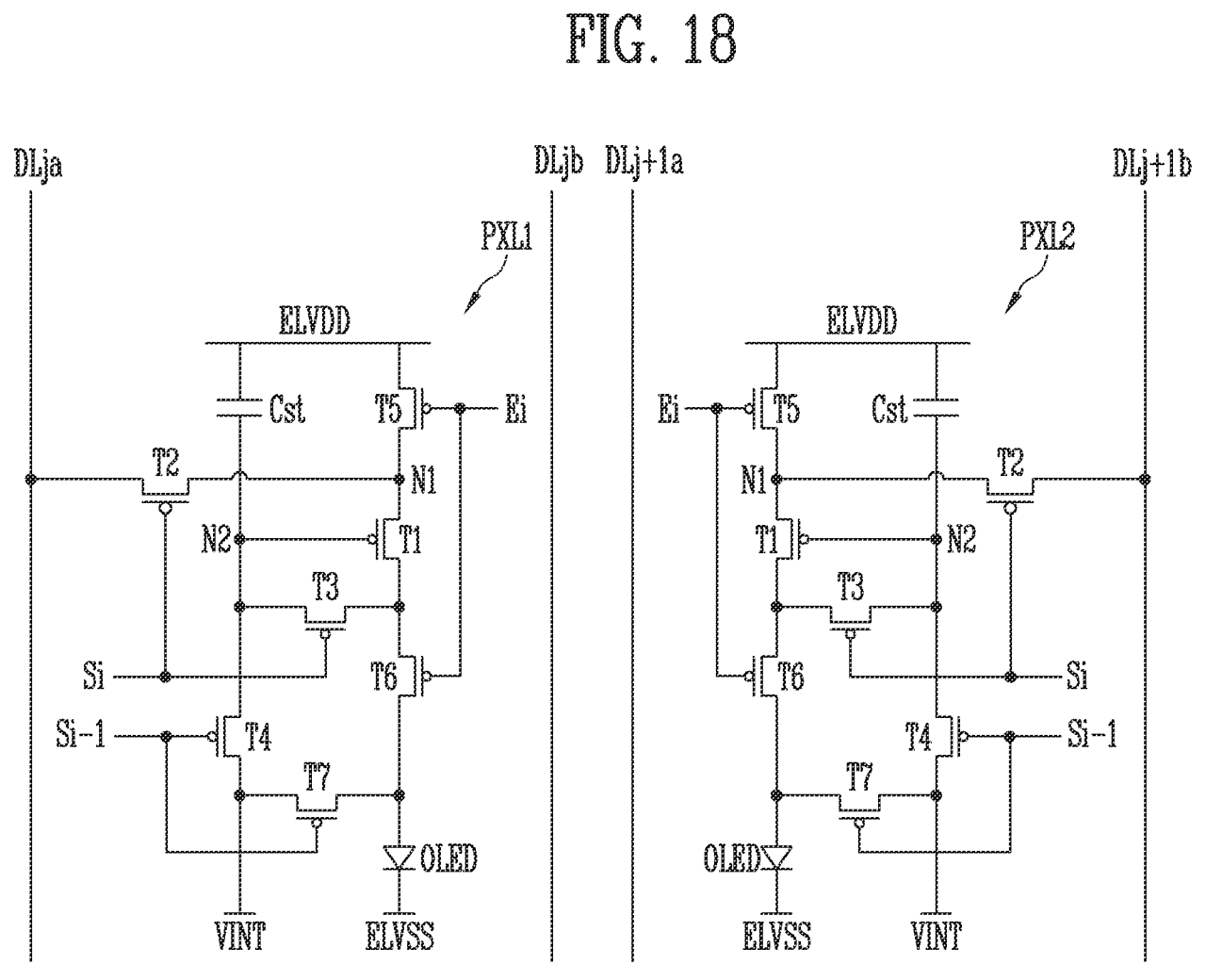
Figure 19:
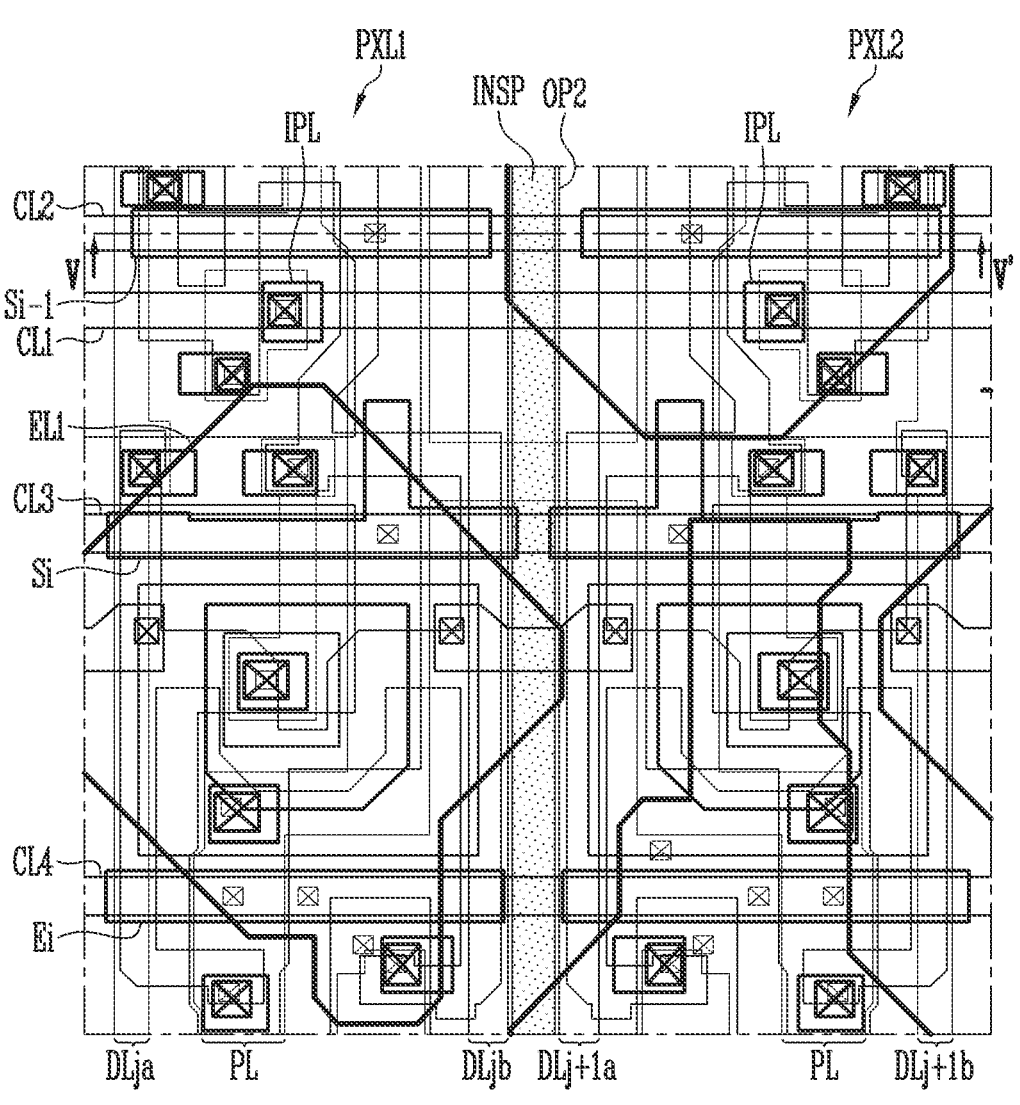
FIG. 19 is a plan view illustrating first and second pixels shown in FIG. 18.
Figure 20:
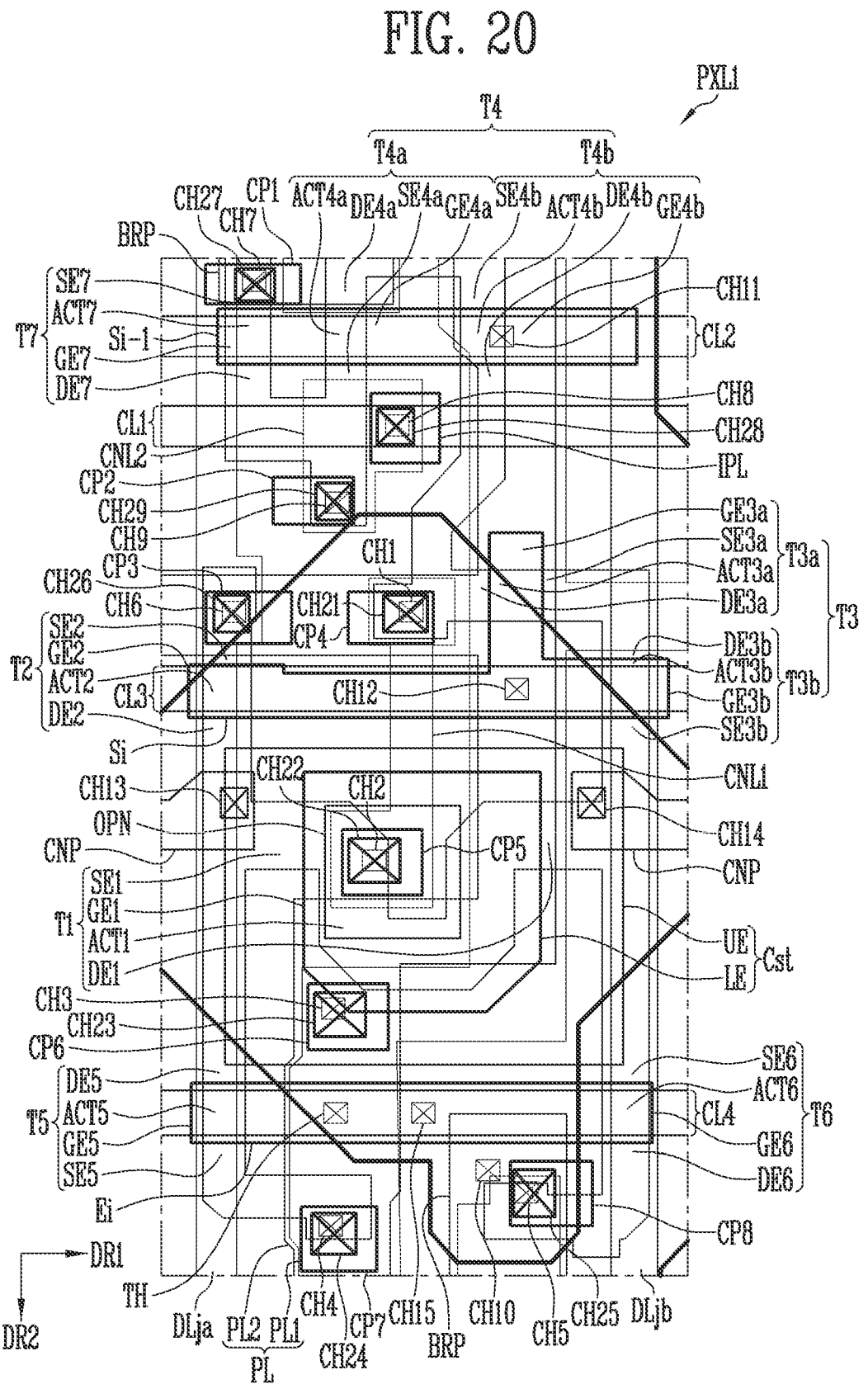
FIG. 20 is a plan view illustrating in detail the first pixel of FIG. 19.
Figure 21:
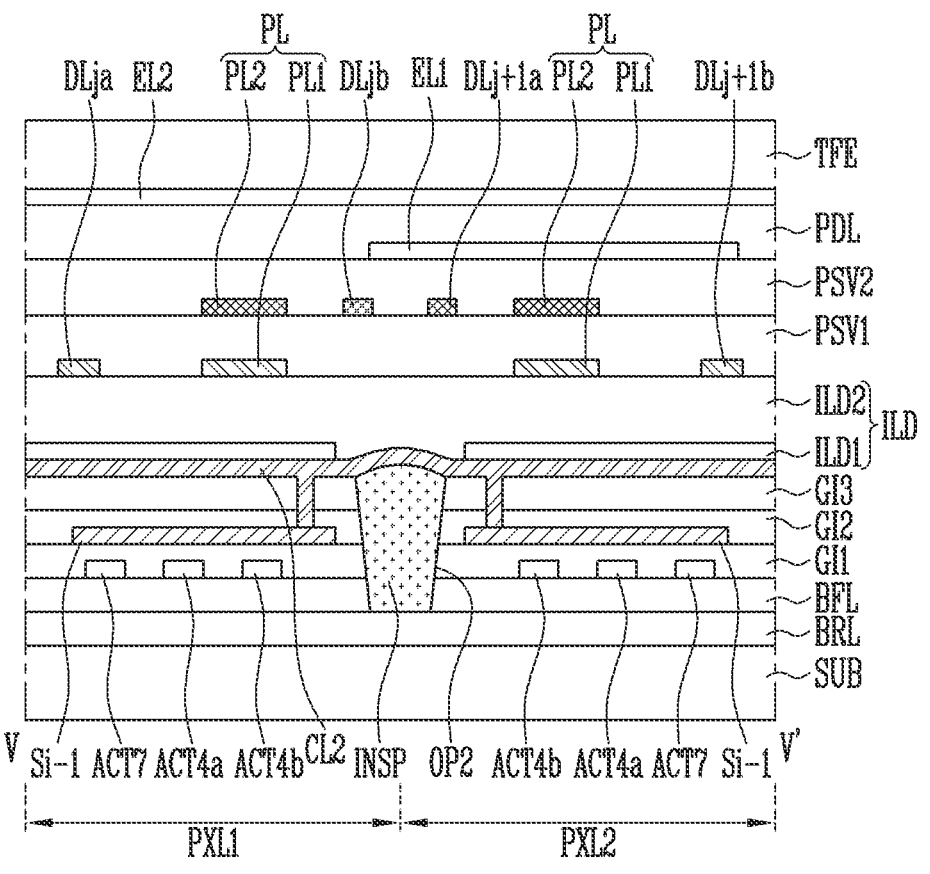
FIG. 21 is a sectional view taken along line V-V' of FIG. 19.

FIG. 18 is an equivalent circuit diagram illustrating two adjacent pixels among the pixels shown in FIG. 1 in accordance with another embodiment, FIG. 19 is a plan view illustrating first and second pixels shown in FIG. 18, FIG. 20 is a plan view illustrating in more detail the first pixel of FIG. 19, and FIG. 21 is a sectional view taken along line V-V' of FIG. 19.

Each of the first and second pixels shown in FIGS. 18 to 21 may be substantially equal or similar in configuration to each pixel of FIGS. 4 and 5, except that two sub data lines are disposed on both sides of the corresponding pixel and the power supply line is formed in a double-layer structure.

Therefore, to avoid redundant explanation, the description of each of the first and second pixels of FIGS. 18 to 21 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

For the convenience of description, FIGS. 18 to 21 illustrate the scan lines Si−1 and Si, the i-th emission control line Ei, the data lines DLja, DLjb, DLj+1a, and DLj+1b, and the power supply line PL, which are connected to the two pixels PXL1 and PXL2, on the basis of two adjacent pixels PXL1 and PXL2 disposed in the intersection region of the j-th pixel column, the j+1-th pixel column, and the i-th pixel row in the display region DA of the substrate SUB (see FIG. 1).

With regard to lines provided for two adjacent pixels PXL1 and PXL2 of FIG. 19, for the sake of explanation, a scan line provided on an i−1-th row among the scan lines Si−1 and Si to which scan signals are to be applied will be referred to as an "i−1-th scan line Si−1", and a scan line provided on an i-th row will be referred to as an "i-th scan line Si". Furthermore, the emission control line provided on the i-th row to which the emission control signal is applied will be referred to as an "i-th emission control line Ei". One of two data lines DLja and DLjb provided on the j-th column to which the data signal is applied will be referred to as a "j-th first sub data line DLja", and the other data line will be referred to as a "j-th second sub data line DLjb". In addition, one of two data lines DLj+1a and DLj+1b provided on the j+1-th column will be referred to as a "j+1-th first sub data line DLj+1a", and the other data line will be referred to as a "j+1-th second sub data line DLj+1b".

Referring to FIGS. 1, 18, and 21, each of the first pixel PXL1 and the second pixel PXL2 may include the substrate SUB, the pixel circuit provided on the substrate SUB, and the light emitting element OLED connected to the pixel circuit.

The first electrode EL1 of the light emitting element OLED of each of the first and second pixels PXL1 and PXL2 may be connected to the pixel circuit of the corresponding pixel PXL, while the second electrode EL2 may be connected to the second driving power ELVSS. The light emitting element OLED of each of the first and second pixels PXL1 and PXL2 may generate light of a predetermined luminance in response to current supplied from the pixel circuit of the corresponding pixel PXL.

The first pixel PXL1 may be a pixel PXL disposed in the intersection region between the i-th pixel row and the j-th pixel column, while the second pixel PXL2 may be a pixel PXL disposed in the intersection region between the i-th pixel row and the j+1-th pixel column.

Each of the first and second pixels PXL1 and PXL2 may be connected to the scan lines Si−1 and Si, the i-th emission control line Ei, the power supply line PL, and the initialization power electrode IPL. The first pixel PXL1 may be connected to the j-th first sub data line DLja, and the second pixel PXL2 may be connected to the j+1-th second sub data line DLj+1b.

The scan lines Si−1 and Si may extend in the first direction DR1 on the substrate SUB and be provided for each of the first and second pixels PXL1 and PXL2. The scan lines Si−1 and Si may include the i−1-th scan line Si−1 and the i-th scan line Si which are successively arranged with each other in the second direction DR2. The i-th scan line Si may be formed and/or provided on the first gate insulating layer GI1 on the substrate SUB.

In an embodiment of the present disclosure, the i−1-th scan line Si−1 of the first pixel PXL1 and the i−1-th scan line Si−1 of the second pixel PXL2 may be spaced apart from each other by a predetermined distance. Likewise, the i-th scan line Si of the first pixel PXL1 and the i-th scan line Si of the second pixel PXL2 may be spaced apart from each other by a predetermined distance.

The i−1-th scan line Si−1 of the first pixel PXL1 and the i−1-th scan line Si−1 of the second pixel PXL2 may be electrically connected to each other through the second conductive layer CL2. Furthermore, the i-th scan line Si of the first pixel PXL1 and the i-th scan line Si of the second pixel PXL2 may be electrically connected to each other through the third conductive layer CL3.

In an embodiment of the present disclosure, the i-th emission control line Ei of the first pixel PXL1 may be spaced apart from the i-th emission control line Ei of the second pixel PXL2 by a predetermined distance. The i-th emission control line Ei of the first pixel PXL1 and the i-th emission control line Ei of the second pixel PXL2 may be electrically connected to each other through the fourth conductive layer CL4. The i-th emission control line Ei of the first pixel PXL1 and the i-th emission control line Ei of the second pixel PXL2 may be formed and/or provided on the first gate insulating layer GI1 on the substrate SUB.

In an embodiment of the present disclosure, the initialization power electrode IPL of the first pixel PXL1 and the initialization power electrode IPL of the second pixel PXL2 may be provided on the second gate insulating layer GI2 on the substrate SUB to be spaced apart from each other by a predetermined distance. The initialization power electrode IPL of the first pixel PXL1 and the initialization power electrode IPL of the second pixel PXL2 may be electrically connected to each other through the first conductive layer CL1.

The data lines DLja, DLjb, DLj+1a, and DLj+1b may extend in the second direction DR2 of the substrate SUB. The data lines DLja, DLjb, DLj+1a, and DLj+1b may include a j-th first sub data line DLja, a j-th second sub data line DLjb, a j+1-th first sub data line DLj+1a, and a j+1-th second sub data line DLj+1b, which are successively arranged with each other in the first direction DR1. In an embodiment of the present disclosure, the j-th first sub data line DLja and the j-th second sub data line DLjb may be provided on both sides of the first pixel PXL1, while the j+1-th first sub data line DLj+1a and the j+1-th second sub data line DLj+1b may be provided on both sides of the second pixel PXL2.

Among the above-described data lines DLja, DLjb, DLj+1a, and DLj+1b, the j-th first sub data line DLja and the j+1-th second sub data line DLj+1b may be formed and/or provided on the second interlayer insulating layer ILD2 on the substrate SUB. Furthermore, among the data lines DLja, DLjb, DLj+1a, and DLj+1b, the j-th second sub data line DLjb and the j+1-th first sub data line DLj+1a may be formed and/or provided on the first passivation layer PSV1 on the substrate SUB and covered by the second passivation layer PSV2.

In an embodiment of the present disclosure, the first pixel PXL1 may be electrically connected to the j-th first sub data line DLja, while the second pixel PXL2 may be electrically connected to the j+1-th second sub data line DLj+1b. The j-th second sub data line DLjb may be electrically connected to the pixel PXL adjacent to the first pixel PXL1 in the second direction DR2. The j+1-th first sub data line DLj+1a may be electrically connected to the pixel PXL adjacent to the second pixel PXL2 in the second direction DR2.

The power supply line PL may extend in the second direction DR2. Either the first driving power ELVDD or the second driving power ELVSS, e.g., the first driving power ELVDD may be supplied to the power supply line PL. The power supply line PL may be disposed between data lines of the corresponding pixel PXL in each of the first and second pixels PXL1 and PXL2. In other words, in the first pixel PXL1, the power supply line PL may be located between the j-th first sub data line DLja and the j-th second sub data line DLjb, and be spaced apart from each of the j-th first and second sub data lines DLja and DLjb by a predetermined distance. In the second pixel PXL2, the power supply line PL may be located between the j+1-th first sub data line DLj+1a and the j+1-th second sub data line DLj+1b, and be spaced apart from each of the j+1-th first and second sub data lines DLj+1a and DLj+1b by a predetermined distance.

In an embodiment of the present disclosure, the power supply line PL of each of the first and second pixels PXL1 and PXL2 may be formed in a double layer structure including a first power supply line PL1 and a second power supply line PL2 provided on the first power supply line PL1. A first passivation layer PSV1 may be provided between the first power supply line PL1 and the second power supply line PL2, and the first power supply line PL1 and the second power supply line PL2 may be electrically connected to each other through a through hole TH that passes through the first passivation layer PSV1.

In an embodiment of the present disclosure, the first power supply line PL1 may be provided on the same layer as the j-th first sub data line DLja and the j+1-th second sub data line DLj+1b among the data lines DLja, DLjb, DLj+1a, and DLj+1b are on. The second power supply line PL2 may be provided on the same layer as the j-th second sub data line DLjb and the j+1-th first sub data line DLj+1a among the data lines DLja, DLjb, DLj+1a, and DLj+1b are on. In an embodiment of the present disclosure, the expression "components are provided on the same layer" may refer to how the components include the same material and are formed through the same process.

Meanwhile, the second opening OP2 formed by removing a portion of at least one insulating layer disposed on the substrate SUB may be provided between the first pixel PXL1 and the second pixel PXL2. An insulating pattern INSP may be provided in the second opening OP2. The insulating pattern INSP may be an organic insulating layer including organic material. Examples of the organic material may include a polyacrylic compound, a polyimide compound, a fluorine-based carbon compound such as Teflon, a benzocyclobutene compound, etc.

In an embodiment of the present disclosure, the second opening OP2 and the insulating pattern INSP provided in the shape of filling the second opening OP2 may provide flexibility between the first and second pixels PXL1 and PXL2 when the display device is curved (or bent), thus enhancing the impact resistance of the display device. Furthermore, when the second opening OP2 and the insulating pattern INSP are provided between the first and second pixels PXL1 and PXL2, stress generated when the display device is curved (bent) may concentrate on the second opening OP2 and the insulating pattern INSP. Thus, because the stress generated when the display device is curved (or bent) does not concentrate on the first and second pixels PXL1 and PXL2, the impact resistance of the first and second pixels PXL1 and PXL2 may be enhanced.

The first to fourth conductive layers CL1 to CL4 made of conductive material, such as molybdenum (Mo), having excellent ductility and low resistance characteristics may be disposed on the substrate SUB including the above-described insulating pattern INSP.

The first conductive layer CL1 may electrically connect the initialization power electrode IPL of the first pixel PXL1 and the initialization power electrode IPL of the second pixel PXL2, thus reducing the line resistance of the initialization power electrode IPL of each of the first and second pixels PXL1 and PXL2. Thus, the initialization power Vint of a uniform level may be applied to the initialization power electrode IPL of each of the first and second pixels PXL1 and PXL2.

The second conductive layer CL2 may electrically connect the i−1-th scan line Si−1 of the first pixel PXL1 and the i−1-th scan line Si−1 of the second pixel PXL2, thus reducing the line resistance of the i−1-th scan line Si−1 of each of the first and second pixels PXL1 and PXL2.

The third conductive layer CL3 may electrically connect the i-th scan line Si of the first pixel PXL1 and the i-th scan line Si of the second pixel PXL2, thus reducing the line resistance of the i-th scan line Si of each of the first and second pixels PXL1 and PXL2.

The fourth conductive layer CL4 may electrically connect the i-th emission control line Ei of the first pixel PXL1 and the i-th emission control line Ei of the second pixel PXL2, thus reducing the line resistance of the i-th emission control line Ei of each of the first and second pixels PXL1 and PXL2.

The pixel circuit of each of the first and second pixels PXL1 and PXL2 may control current which flows from the first driving power ELVDD through the light emitting element OLED of the corresponding pixel PXL to the second driving power ELVSS, in response to the data signal.

To this end, the pixel circuit of each of the first and second pixels PXL1 and PXL2 may include the first to seventh transistors T1 to T7 and the storage capacitor Cst.

Each of the first and second pixels PXL1 and PXL2 may have a substantially identical or similar structure. Hereinafter, for convenience, the first pixel PXL1 disposed in the i-th pixel row and the j-th pixel column among the first and second pixels PXL1 and PXL2 will be representatively described.

The first pixel PXL1 may include the pixel circuit including the first to seventh transistors T1 to T7 and the storage capacitor Cst, and the light emitting element OLED connected to the pixel circuit. In an embodiment of the present disclosure, the pixel circuit of the first pixel PXL1 may further include the first and second contact electrodes CNL1 and CNL2, the bridge electrode BRP, and the first to eighth conductive patterns CP1 to CP8.

The first transistor T1 may include a first gate electrode GE1, a first active pattern ACT1, a first source electrode SE1, a first drain electrode DE1, and a first contact electrode CNL1.

A first end of the first contact electrode CNL1 may be connected to each of the 3a-th drain electrode DE3a and the 4b-th drain electrode DE4b through first and 21st contact holes CH1 and CH21, and a second end of the first contact electrode CNL1 may be connected to the first gate electrode GE1 through second and 22nd contact holes CH2 and CH22.

The second transistor T2 may include a second gate electrode GE2, a second active pattern ACT2, a second source electrode SE2, and a second drain electrode DE2. The second source electrode SE2 is connected to the j-th first sub data line DLja through the sixth contact hole CH6 and the 26th contact hole CH26.

The third transistor T3 may have a double gate structure to prevent current leakage. In other words, the third transistor T3 may include a 3a-th transistor T3a and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b.

The fourth transistor T4 may have a double gate structure to prevent current leakage in the same manner as that of the third transistor T3. In other words, the fourth transistor T4 may include a 4a-th transistor T4a and a 4b-th transistor T4b. The 4a-th transistor T4a may include a 4a-th gate electrode GE4a, a 4a-th active pattern ACT4a, a 4a-th source electrode SE4a, and a 4a-th drain electrode DE4a. The 4b-th transistor T4b may include a 4b-th gate electrode GE4b, a 4b-th active pattern ACT4b, a 4b-th source electrode SE4b, and a 4b-th drain electrode DE4b.

The fifth transistor T5 may include a fifth gate electrode GE5, a fifth active pattern ACT5, a fifth source electrode SE5, and a fifth drain electrode DE5. The fifth source electrode SE5 may be connected to the first power supply line PL1 of the power supply line PL through fourth and 24th contact holes CH4 and CH24.

The sixth transistor T6 may include a sixth gate electrode GE6, a sixth active pattern ACT6, a sixth source electrode SE6, and a sixth drain electrode DE6. A second end of the sixth drain electrode DE6 may be electrically connected to the bridge electrode BRP through fifth and 25th contact holes CH5 and CH25.

The seventh transistor T7 may include a seventh gate electrode GE7, a seventh active pattern ACT7, a seventh source electrode SE7, and a seventh drain electrode DE7.

The seventh source electrode SE7 may be connected to the bridge electrode BRP, extending from the pixel (not shown) disposed in the i−1-th pixel row to the first pixel PXL1, through seventh and 27th contact holes CH7 and CH27. As the seventh source electrode SE7 is electrically connected to the bridge electrode BRP, the seventh source electrode SE7 may be electrically connected to the sixth drain electrode (not shown) of the sixth transistor (not shown) of the pixel PXL disposed in the i−1-th pixel row.

The seventh drain electrode DE7 may be electrically connected to a second contact electrode CNL2 through ninth and 29th contact holes CH9 and CH29. Furthermore, the seventh drain electrode DE7 may be electrically connected to the 4a-th source electrode SE4a of the 4a-th transistor T4a.

In an embodiment of the present disclosure, the bridge electrode BRP may be electrically connected to a first electrode EL1 of the light emitting element OLED through a tenth contact hole CH10. Thus, the first electrode EL1 of the light emitting element OLED may be electrically connected to each of the sixth drain electrode DE6 of the sixth transistor T6 and the seventh source electrode SE7 of the seventh transistor T7 through the bridge electrode BRP.

A first end of the second contact electrode CNL2 may be electrically connected to the initialization power electrode IPL through eighth and 28th contact holes CH8 and CH28. A second end of the second contact electrode CNL2 may be electrically connected to the seventh drain electrode DE7 of the seventh transistor T7 and the 4a-th source electrode SE4a of the 4a-th transistor T4a through ninth and 29th contact holes CH9 and CH29.

The storage capacitor Cst may include a lower electrode LE and an upper electrode UE.

The lower electrode LE may be integrally formed with the first gate electrode GE1 of the first transistor T1. The upper electrode UE may overlap the lower electrode LE, and cover the lower electrode LE in a plan view. The upper electrode UE may be electrically connected to the first power supply line PL1 of the power supply line PL through third and 23rd contact holes CH3 and CH23. Thus, the first driving power ELVDD applied to the first power supply line PL1 may be transmitted to the upper electrode UE.

The light emitting element OLED may include a first electrode EL1, a second electrode EL2, and a light-emitting layer (not shown) formed and/or provided between the first electrode EL1 and the second electrode EL2.

The first conductive pattern CP1 may be electrically connected to the seventh source electrode SE7 of the seventh transistor T7 through the seventh contact hole CH7. In an embodiment of the present disclosure, the first conductive pattern CP1 may be provided as a medium which electrically connects the seventh source electrode SE7 and the bridge electrode BRP between the seventh contact hole CH7 and the 27th contact hole CH27.

The second conductive pattern CP2 may be electrically connected to the seventh drain electrode DE7 of the seventh transistor T7 through the ninth contact hole CH9. In an embodiment of the present disclosure, the second conductive pattern CP2 may be provided as a medium which electrically connects the seventh drain electrode DE7 and the second contact electrode CNL2 between the ninth contact hole CH9 and the 29th contact hole CH29. Furthermore, the second conductive pattern CP2 may be provided as a medium which electrically connects the 4a-th source electrode SE4a of the 4a-th transistor T4a and the second contact electrode CNL2 between the ninth contact hole CH9 and the 29th contact hole CH29.

The third conductive pattern CP3 may be electrically connected to the second source electrode SE2 of the second transistor T2 through the sixth contact hole CH6. In an embodiment of the present disclosure, the third conductive pattern CP3 may be provided as a medium which electrically connects the second source electrode SE2 and the j-th first sub data line DLja between the sixth contact hole CH6 and the 26th contact hole CH26.

The fourth conductive pattern CP4 may be electrically connected to each of the 3a-th drain electrode DE3a of the 3a-th transistor T3a and the 4b-th drain electrode DE4b of the 4b-th transistor T4$b$ through the first contact hole CH1. In an embodiment of the present disclosure, the fourth conductive pattern CP4 may be provided as a medium which electrically connects the first contact electrode CNL1 and the 3a-th and 4b-th drain electrodes DE3$a$ and DE4$b$ between the first contact hole CH1 and the 21st contact hole CH21.

The fifth conductive pattern CP5 may be electrically connected to the first gate electrode GE1 of the first transistor T1 through the second contact hole CH2. In an embodiment of the present disclosure, the fifth conductive pattern CP5 may be provided as a medium which electrically connects the first gate electrode GE1 and the first contact electrode CNL1 between the second contact hole CH2 and the 22nd contact hole CH22.

The sixth conductive pattern CP6 may be electrically connected to the upper electrode UE through the third contact hole CH3. In an embodiment of the present disclosure, the sixth conductive pattern CP6 may be provided as a medium which electrically connects the upper electrode UE and the first power supply line PL1 between the third contact hole CH3 and the 23rd contact hole CH23.

The seventh conductive pattern CP7 may be electrically connected to the fifth source electrode SE5 of the fifth transistor T5 through the fourth contact hole CH4. In an embodiment of the present disclosure, the seventh conductive pattern CP7 may be provided as a medium which electrically connects the fifth source electrode SE5 and the first power supply line PL1 between the fourth contact hole CH4 and the 24th contact hole CH24.

The eighth conductive pattern CP8 may be electrically connected to the sixth drain electrode DE6 of the sixth transistor T6 through the fifth contact hole CH5. In an embodiment of the present disclosure, the eighth conductive pattern CP8 may be provided as a medium which electrically connects the sixth drain electrode DE6 and the bridge electrode BRP between the fifth contact hole CH5 and the 25th contact hole CH25.

In an embodiment of the present disclosure, a region of the first conductive layer CL1 may be electrically connected to the initialization power electrode IPL through the eighth contact hole CH8. A region of the first conductive layer CL1 may be provided as a medium which electrically connects the initialization power electrode IPL and the second contact electrode CNL2 between the eighth contact hole CH8 and the 28th contact hole CH28. As described above, because the second contact electrode CNL2 is electrically connected through the second conductive pattern CP2 to the seventh drain electrode DE7 and the 4a-th source electrode SE4$a$, the initialization power electrode IPL may be electrically connected to the seventh drain electrode DE7 and the 4a-th source electrode SE4$a$.

Meanwhile, the connection pattern CNP may be provided and/or formed between the first pixel PXL1 and the second pixel PXL2.

A first end of the connection pattern CNP located between the first pixel PXL1 and the second pixel PXL2 may be electrically connected to a first side of the upper electrode UE of the first pixel PXL1 through the 14th contact hole CH14 (i.e., the 14th contact hole CH14 of the first pixel PXL1). Furthermore, a second end of the connection pattern CNP located between the first pixel PXL1 and the second pixel PXL2 may be electrically connected to a first side of the upper electrode UE of the second pixel PXL2 through the 13th contact hole CH13 (i.e., the 13th contact hole CH13 of the second pixel PXL2). Thus, the upper electrode UE of the first pixel PXL1 and the upper electrode UE of the second pixel PXL2 may be electrically connected to each other through the connection pattern CNP.

As described above, the display device in accordance with an embodiment of the present disclosure may electrically connect the scan lines Si−1 and Si of the first pixel PXL1 and the scan lines Si−1 and Si of the second pixel PXL2 through the second and third conductive layers CL2 and CL3, respectively, thus implementing the scan lines Si−1 and Si of each of the first and second pixels PXL1 and PXL2 as a double layer structure. Thus, the line resistance of the scan lines Si−1 and Si of each of the first and second pixels PXL1 and PXL2 may be reduced. As a result, the delay of the scan signals applied to the scan lines Si−1 and Si may be minimized, thus allowing the display device to be driven at high speed.

Furthermore, the display device in accordance with an embodiment of the present disclosure may electrically connect the i-th emission control line Ei of the first pixel PXL1 and the i-th emission control line Ei of the second pixel PXL2 through the fourth conductive layer CL4, thus implementing the i-th emission control line Ei of each of the first and second pixels PXL1 and PXL2 as a double layer structure. Thus, the delay of the emission control signal applied to the i-th emission control line Ei of each of the first and second pixels PXL1 and PXL2 may be minimized.

In addition, the display device in accordance with an embodiment of the present disclosure may locate the j-th first sub data line DLja connected to the first pixel PXL1 and the j+1-th second sub data line DLj+1b connected to the second pixel PXL2 in the outermost position of the corresponding pixel PXL, thus providing a predetermined distance between the j-th first sub data line DLja and the j+1-th second sub data line DLj+1b. Thus, the interference of data signals applied to the j-th first sub data line DLja and the j+1-th second sub data line DLj+1b is minimized, so that it is possible to implement a display device capable of displaying a high-quality image.

Furthermore, the display device in accordance with an embodiment of the present disclosure has the buffer layer BFL, the second opening OP2 formed by removing some of the first to third gate insulating layers GI1 to GI3, and the insulating pattern INSP including organic material in the non-emission region between the first pixel PXL1 and the second pixel PXL2, thus further securing impact resistance.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims and equivalents thereof.

The invention claimed is:

1. A display device, comprising:
   a substrate comprising a display region and a non-display region;
   a plurality of pixels in the display region of the substrate, and each comprising at least one transistor and a light emitting element connected to the transistor;
   first to fourth insulating layers successively stacked on the substrate;
   a scan line on each of the pixels to apply a scan signal to a corresponding pixel, and being on the first insulating layer;

a first conductive layer on the third insulating layer and extending in a direction parallel to an extending direction of the scan line, and being in common on the pixels;

an opening exposing a part of the substrate, the opening being removed from a part of the first to third insulating layers between pixels adjacent to each other in a first direction parallel to the extending direction of the scan line and between pixels adjacent to each other in a second direction intersecting with the first direction; and an insulating pattern disposed in the opening and located between the substrate and the light emitting element, wherein the first conductive layer is on the substrate and on the insulating pattern, and connects the scan line of the one pixel and the scan line of the pixel adjacent thereto, wherein the scan line of the each of the pixels is surrounded by the opening in a plan view, and wherein the scan line of the each of the pixels does not overlap the opening in the plan view.

2. The display device according to claim 1, wherein the first conductive layer is electrically connected to the scan line of each of the pixels through a corresponding first contact hole passing through the second and third insulating layers.

3. The display device according to claim 2, wherein the first conductive layer overlaps the scan line of each of the pixels in the plan view.

4. The display device according to claim 3, wherein each of the first to third insulating layers is an inorganic insulating layer comprising inorganic material, and the insulating pattern is an organic insulating layer comprising organic material.

5. The display device according to claim 4, wherein the insulating pattern is in and has a shape filling the opening.

6. The display device according to claim 4, further comprising a data line on the fourth insulating layer, and configured to apply a data signal to each of the pixels, wherein the fourth insulating layer comprises a first interlayer insulating layer and a second interlayer insulating layer which are successively stacked from a surface of the first conductive layer.

7. The display device according to claim 6, wherein the first interlayer insulating layer is different than the second interlayer insulating layer in material.

8. The display device according to claim 7, wherein the first interlayer insulating layer is an inorganic insulating layer comprising inorganic material, and the second interlayer insulating layer is an organic insulating layer comprising organic material.

9. The display device according to claim 8, further comprising:

at least two or more conductive patterns on the third insulating layer; and at least one contact electrode on the second interlayer insulating layer, and a bridge electrode spaced apart from a contact electrode among the contact electrodes, wherein each of the contact electrode and the bridge electrode overlaps a corresponding one of the conductive patterns with the first and second interlayer insulating layers being interposed therebetween.

10. The display device according to claim 9, wherein the contact electrode and the corresponding conductive pattern overlapping the contact electrode are electrically connected through a second contact hole passing through the first and second interlayer insulating layers, and wherein the bridge electrode and the corresponding conductive pattern overlapping the bridge electrode are electrically connected through a third contact hole passing through the first and second interlayer insulating layers.

11. The display device according to claim 10, wherein the conductive patterns are on the same layer as the first conductive layer is on, and are spaced apart from the first conductive layer.

12. The display device according to claim 10, wherein a transistor among the transistors comprises:

an active pattern on the substrate;

a gate electrode on the active pattern with the first insulating layer therebetween; and a source electrode and a drain electrode connected, respectively, to both sides of a middle region of the active pattern overlapping the gate electrode, wherein either the source electrode or the drain electrode is electrically connected to a corresponding conductive pattern among the conductive patterns through a fourth contact hole passing through the first to third insulating layers.

13. The display device according to claim 12, further comprising:

a passivation layer on the data line, and having a fifth contact hole to expose at least a part of the bridge electrode; and the light emitting element on the passivation layer.

14. The display device according to claim 13, wherein the light emitting element comprises:

a first electrode on the passivation layer, and connected to the bridge electrode through the fifth contact hole;

a light-emitting layer on the first electrode, and to emit light; and a second electrode on the light-emitting layer.

15. The display device according to claim 1, further comprising:

an emission control line on the first insulating layer, and to apply an emission control signal to each of the pixels; and a second conductive layer on the third insulating layer and extending in a direction parallel to an extending direction of the emission control line, and being in common on the pixels.

16. The display device according to claim 15, wherein the second conductive layer is electrically connected to the emission control line of each of the pixels through a corresponding sixth contact hole passing through the second and third insulating layers.

17. The display device according to claim 16, wherein the second conductive layer is on the same layer as the first conductive layer is on, and is spaced apart from the first conductive layer.

18. The display device according to claim 1, further comprising:

a lower electrode on the first insulating layer of each of the pixels; and an upper electrode on the second insulating layer of each of the pixels, and overlapping the lower electrode to form a storage capacitor.

19. The display device according to claim 18, further comprising a connection pattern on the third insulating layer and to electrically connect the upper electrode of the one pixel and the upper electrode of the pixel adjacent thereto.

20. The display device according to claim 19, wherein the connection pattern is on the same layer as the first conductive layer is on, and is spaced apart from the first conductive layer.

21. The display device according to claim 20, further comprising:

an initialization power electrode on each of the pixels, and to apply initialization power to a corresponding pixel; and a third conductive layer on the initialization power electrode, and to electrically connect the initialization power electrode of the one pixel and the initialization power electrode of the pixel adjacent thereto.

22. The display device according to claim 21, wherein the third conductive layer is electrically connected to the initialization power electrode of each of the pixels through a corresponding seventh contact hole passing through the third insulating layer.

23. The display device according to claim 21, wherein the third conductive layer is on the same layer as the first conductive layer is on, and is spaced apart from the first conductive layer.

24. The display device according to claim 23, wherein the initialization power electrode is on the same layer as the upper electrode is on, and is spaced apart from the upper electrode.

25. A display device, comprising:

a substrate comprising a display region and a non-display region;

a plurality of pixels in the display region of the substrate, and each comprising at least one transistor and a light emitting element connected to the transistor;

first to fourth insulating layers successively stacked on the substrate;

a scan line on each of the pixels to apply a scan signal to a corresponding pixel, the scan line being on the first insulating layer;

an emission control line on each of the pixels to apply an emission control signal to a corresponding pixel, and on the first insulating layer;

an initialization power electrode on each of the pixels to apply initialization power to a corresponding pixel, and on the second insulating layer;

first to third conductive layers on the third insulating layer and extending in a first direction, and being in common on the pixels;

a data line on the fourth insulating layer and extending in a second direction crossing the first direction, and to apply a data signal to each of the pixels;

an opening exposing a part of the substrate by removing a part of the first to third insulating layers between pixels adjacent to each other in the first direction and between pixels adjacent to each other in the second direction; and an insulating pattern disposed in the opening and located between the substrate and the light emitting element, wherein the first to third conductive layers are on the third insulating layer and on the insulating pattern to be spaced apart from each other, and connect the one pixel and the pixel adjacent thereto, wherein the scan line of the each of the pixels is surrounded by the opening and does not overlap the opening in a plan view, wherein the emission control line of the each of the pixels is surrounded by the opening and does not overlap the opening in the plan view, and wherein the initialization power electrode of the each of the pixels is surrounded by the opening and does not overlap the opening in the plan view.

26. The display device according to claim 25, wherein the first conductive layer electrically connects the scan line of the one pixel and the scan line of the pixel adjacent thereto, wherein the second conductive layer electrically connects the emission control line of the one pixel and the emission control line of the pixel adjacent thereto, and wherein the third conductive layer electrically connects the initialization power electrode of the one pixel and the initialization power electrode of the pixel adjacent thereto.

27. The display device according to claim 26, wherein the data line comprises a first sub data line on a first side of each of the pixels, and a second sub data line on a second side of each of the pixels.

28. The display device according to claim 27, wherein the first sub data line is on a different layer than the second sub data line is on.

29. The display device according to claim 28, further comprising a power supply line which extends in the second direction and is to supply driving power to each of the pixels, wherein the power supply line is provided between the first sub data line and the second sub data line.

\* \* \* \* \*